(12) United States Patent
Hastings

(10) Patent No.: US 9,985,572 B2
(45) Date of Patent: May 29, 2018

(54) SOLAR ROADWAY SYSTEM AND METHOD

(71) Applicant: Glenn Arthur Hastings, Carrollton, TX (US)

(72) Inventor: Glenn Arthur Hastings, Carrollton, TX (US)

( * ) Notice: Subject to any disclaimer, the term of this patent is extended or adjusted under 35 U.S.C. 154(b) by 140 days.

(21) Appl. No.: 15/140,228

(22) Filed: Apr. 27, 2016

(65) Prior Publication Data

US 2016/0322928 A1 Nov. 3, 2016

Related U.S. Application Data

(60) Provisional application No. 62/155,394, filed on Apr. 30, 2015.

(51) Int. Cl.
| | |
|---|---|
| *H02S 20/21* | (2014.01) |
| *H02S 40/32* | (2014.01) |
| *E01C 9/00* | (2006.01) |
| *H01L 31/0352* | (2006.01) |
| *H01L 31/0236* | (2006.01) |

(Continued)

(52) U.S. Cl.
CPC ............... *H02S 20/21* (2014.12); *E01C 9/00* (2013.01); *H01L 31/02021* (2013.01); *H01L 31/048* (2013.01); *H01L 31/0504* (2013.01); *H02S 40/22* (2014.12); *H02S 40/30* (2014.12); *H02S 40/32* (2014.12); *H02S 40/34* (2014.12); *H02S 40/36* (2014.12); *Y02E 10/52* (2013.01)

(58) Field of Classification Search
CPC .......... H02S 20/21; H02S 40/20; H02S 40/33; H02S 40/34; H02S 40/36; E01C 9/00; E01C 9/04; E01C 9/06; E01C 11/00; E01C 13/00; H01L 31/02; H01L 31/02019; H01L 31/02021; H01L 31/048; H01L 31/05; H01L 31/0504; H01L 35/00; H01L 35/02

See application file for complete search history.

(56) References Cited

U.S. PATENT DOCUMENTS

| 8,428,417 B1 | 4/2013 | Hastings et al. | |
|---|---|---|---|
| 2007/0211782 A1* | 9/2007 | Thompson | G01K 1/024 374/120 |

(Continued)

FOREIGN PATENT DOCUMENTS

| EP | 1401026 A1 * | 3/2004 | ............ H02S 20/26 |

*Primary Examiner* — Susan D Leong
(74) *Attorney, Agent, or Firm* — David W. Carstens; Carstens & Cahoon, LLP

(57) ABSTRACT

A modular solar roadway/railway system (MSRS) and method (MSRM) utilizing interlocked solar/optical collection panels (SCP) having stacked solar collection strips (SCS) is disclosed. The SCS are configured with an optical input surface (OIS) configured to collect solar energy and a road support surface (RSS) configured to support automobile traffic. The SCS are stacked in an anti-symmetrical alignment pattern that allows solar energy to be efficiently collected while simultaneously supporting automobiles and other vehicles. The SCS as formed within the SCP are configured with a matrix of bottom photovoltaic cell cavities (PCC) that permit the SCP to be mated to a road/railway surface while simultaneously integrated with solar cells in the PCC for the generation of electricity. The MSRS may be configured in a flexible SCP array in rolled sheet form (RSF) suitable for installation via the use of a vehicle equipped with axial support for the RSF.

18 Claims, 64 Drawing Sheets

(51) Int. Cl.
*H02S 40/22* (2014.01)
*H02S 40/34* (2014.01)
*H02S 40/30* (2014.01)
*H01L 31/02* (2006.01)
*H01L 31/048* (2014.01)
*H01L 31/05* (2014.01)
*H02S 40/36* (2014.01)

(56) References Cited

U.S. PATENT DOCUMENTS

2016/0006250 A1\* 1/2016 Ramond ........... H01L 31/02021
 307/82
2016/0301355 A1\* 10/2016 Small ................ H02S 20/21

\* cited by examiner

SOLAR ROADWAY SYSTEM AND METHOD

CROSS REFERENCE TO RELATED APPLICATIONS

U.S. Provisional Patent Applications

Applicant claims benefit of and priority pursuant to 35 U.S.C. § 119 and hereby incorporates by reference U.S. Provisional Patent Application for "SOLAR ROADWAY SYSTEM AND METHOD", Ser. No. 62/155,394, filed electronically with the USPTO on Apr. 30, 2015 with EFS ID 22225492, confirmation number 5698.

U.S. Provisional/Utility Patent Applications and Patents

Applicant hereby incorporates by reference Provisional Patent Application for "MODULAR SOLAR COLLECTOR SYSTEM AND METHOD", Ser. No. 61/455,180, filed Oct. 15, 2010, and submitted to the USPTO with Express Mail on Oct. 15, 2010 with tracking number EH474064931US.

Applicant hereby incorporates by reference U.S. Pat. No. 8,428,417 issued on Apr. 23, 2013 for "MODULAR SOLAR COLLECTOR SYSTEM AND METHOD", Ser. No. 13/317,309, filed Oct. 15, 2011.

PARTIAL WAIVER OF COPYRIGHT

All of the material in this patent application is subject to copyright protection under the copyright laws of the United States and of other countries. As of the first effective filing date of the present application, this material is protected as unpublished material.

However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO A MICROFICHE APPENDIX

Not Applicable

FIELD OF THE INVENTION

The present invention generally relates to solar energy collection systems and related methods, generally including but not limited to United States Patent Classes 126/425, 126/438, 126/440, 250/491.1, 136/246, 350/289, 353/3. The disclosed invention is typically utilized in conjunction with a heat transfer and/or solar energy electrical generation system. Without limiting the invention scope, the present invention may have application in solar energy collection on roadway/railway surfaces or surfaces on which automobiles/trains may operate or are parked.

PRIOR ART AND BACKGROUND OF THE INVENTION

The use of solar energy generation has typically been confined to fixed structural collection systems such as that installed on rooftops of dwellings and other structures as well as "solar farms" that comprise acres of solar collection panels placed on large areas of land. The use of solar panels within other structures such as roadways/railways has typically been limited due to the problems in optimally gathering solar energy from the panels, providing a ruggedized form factor for the solar panels, providing a reliable mechanism for interconnecting the panels, and high labor costs associated with installing the panels on a roadway/railway or other transportation surface.

U.S. Pat. No. 8,428,417 issued on Apr. 23, 2013 for "MODULAR SOLAR COLLECTOR SYSTEM AND METHOD" details a modular solar collection element as detailed in FIG. 1 (0100)-FIG. 3 (0300). This solar collection element is specifically designed to be individually combined to direct solar radiation for collection by a heat collector or solar collector. As depicted in FIG. 4 (0400), these collected individual elements may be used to form solar collector arrays on flat surfaces or on roadway surfaces. However, this formation is not suitable for planar solar arrays as the solar energy in this configuration must traverse laterally along the solar collector. Furthermore, since the solar collectors must be individually combined to form the solar panel, the use of this system in large roadways and other large flat surfaces is quite expensive due to the amount of manual labor required for installation.

OBJECTIVES OF THE INVENTION

Accordingly, the objectives of the present invention are (among others) to circumvent the deficiencies in the prior art and affect the following objectives:

(1) Provide for a solar roadway system and method that optimally gathers solar energy from solar panels.
(2) Provide for a solar roadway system and method that provides a ruggedized form factor for the solar panels.
(3) Provide for a solar roadway system and method that provides a reliable mechanism for interconnecting the solar panels.
(4) Provide for a solar roadway system and method that reduces the labor costs associated with installing the solar panels on a roadway/railway or other transportation surface.

While these objectives should not be understood to limit the teachings of the present invention, in general these objectives are achieved in part or in whole by the disclosed invention that is discussed in the following sections. One skilled in the art will no doubt be able to select aspects of the present invention as disclosed to affect any combination of the objectives described above.

BRIEF SUMMARY OF THE INVENTION

System Overview

A modular solar roadway/railway system (MSRS) and method (MSRM) utilizing interlocked solar/optical collection panels (SCP) having stacked solar collection strips (SCS) is disclosed. The SCS are configured with an optical input surface (OIS) configured to collect solar energy and a road support surface (RSS) configured to support automobile traffic. The SCS are stacked in an anti-symmetrical alignment pattern that allows solar energy to be efficiently collected while simultaneously supporting automobiles and other vehicles. The SCS as formed within the SCP are configured with a matrix of bottom photovoltaic cell cavities (PCC) that permit the SCP to be mated to a road/railway surface while simultaneously integrated with solar cells in the PCC for the generation of electricity. The MSRS may be configured in a flexible SCP array in rolled sheet form (RSF) suitable for installation via the use of a vehicle equipped with axial support for the RSF.

Method Overview

The above system is associated with a method of installation in which the solar panels are installed using an automated mechanism that deploys the solar panels in a semi-continuous form from a prefabricated roll.

BRIEF DESCRIPTION OF THE DRAWINGS

For a fuller understanding of the advantages provided by the invention, reference should be made to the following detailed description together with the accompanying drawings wherein.

DESCRIPTION OF THE PRESENTLY PREFERRED EXEMPLARY EMBODIMENTS

Figure 1:
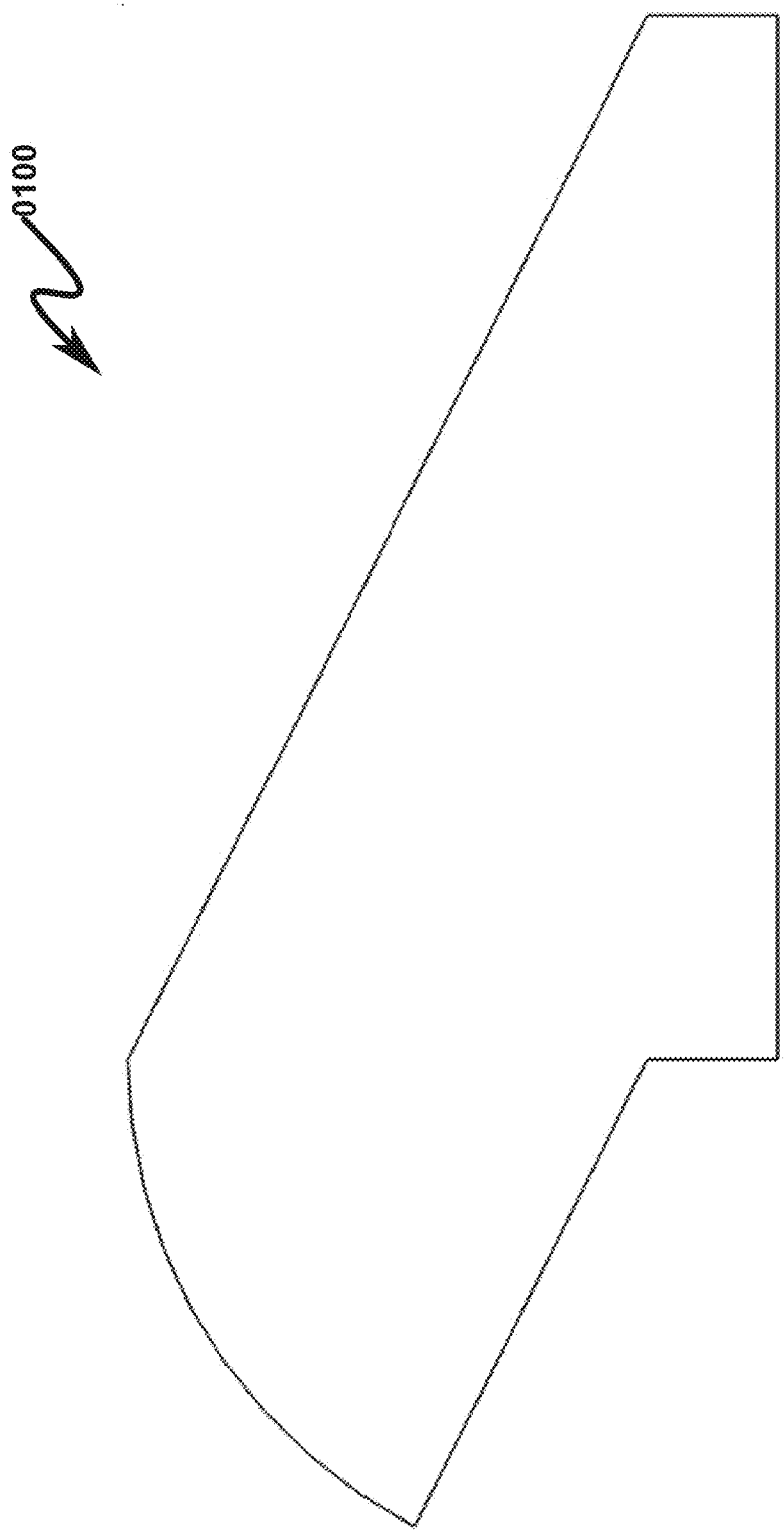
FIG. 1 illustrates a side view of a prior art solar collector element from U.S. Pat. No. 8,428,417.
Figure 2:
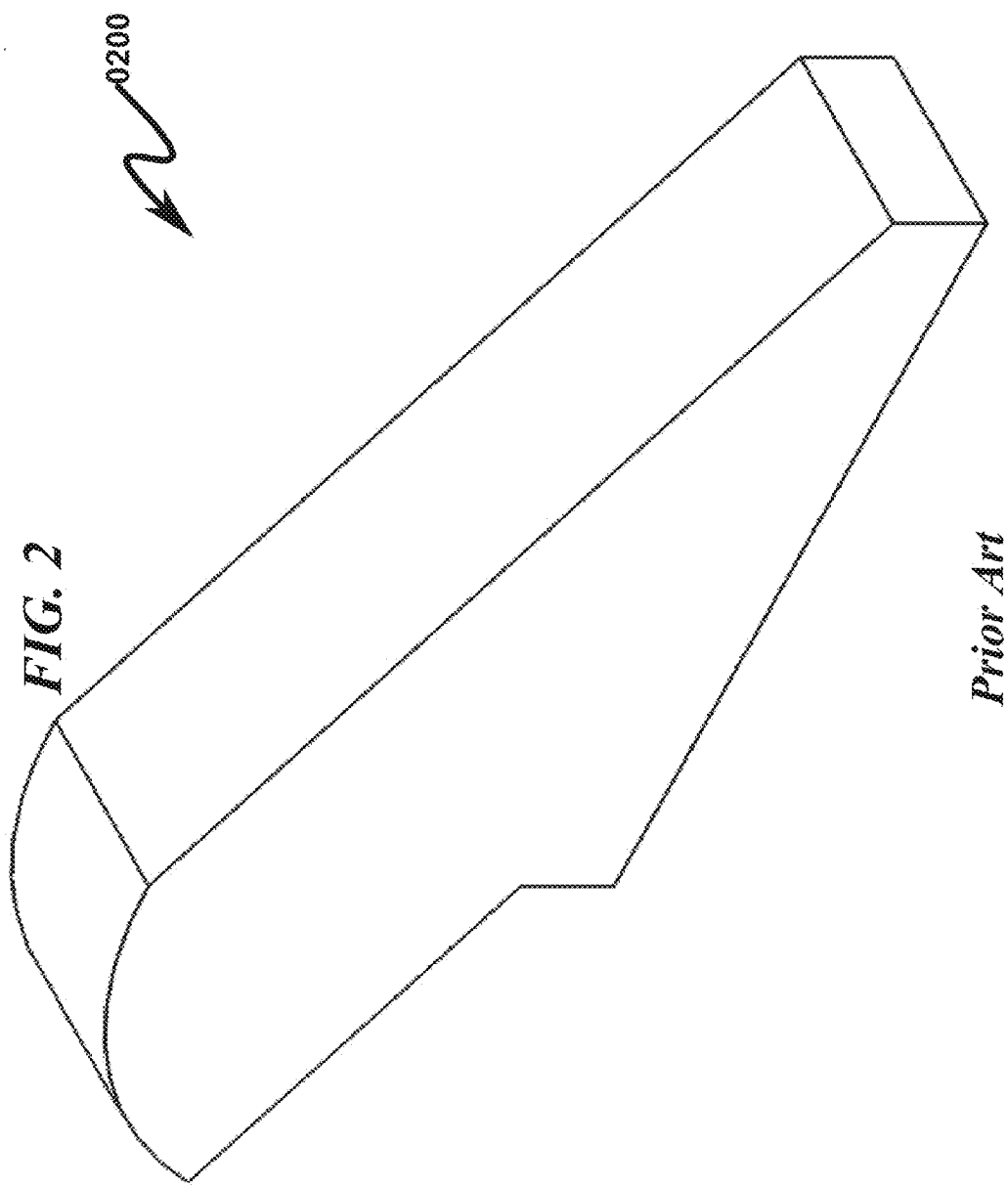
FIG. 2 illustrates a right side top perspective view of a prior art solar collector element from U.S. Pat. No. 8,428,417.
Figure 3:
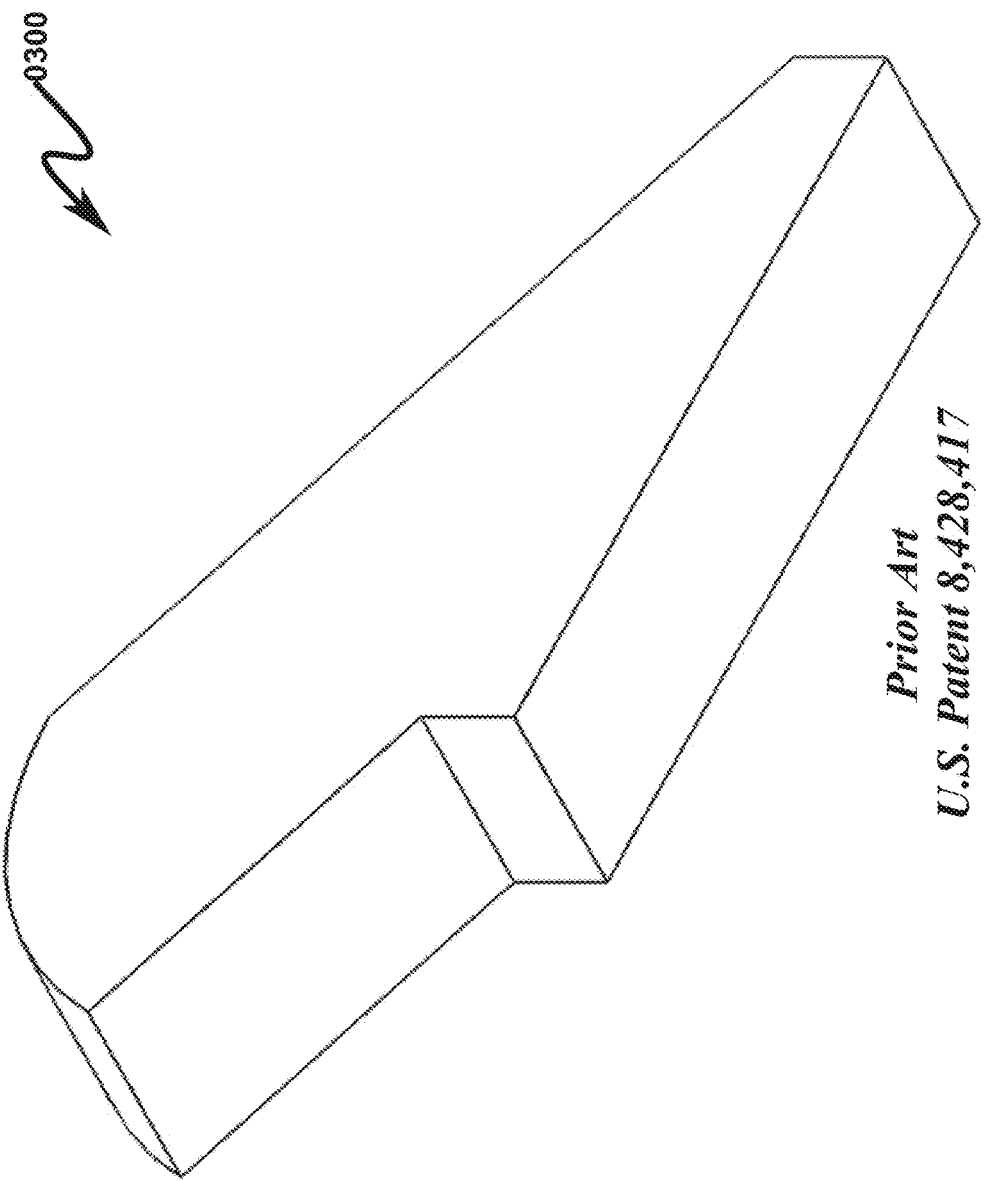
FIG. 3 illustrates a left side bottom perspective view of a prior art solar collector element from U.S. Pat. No. 8,428,417.
Figure 4:
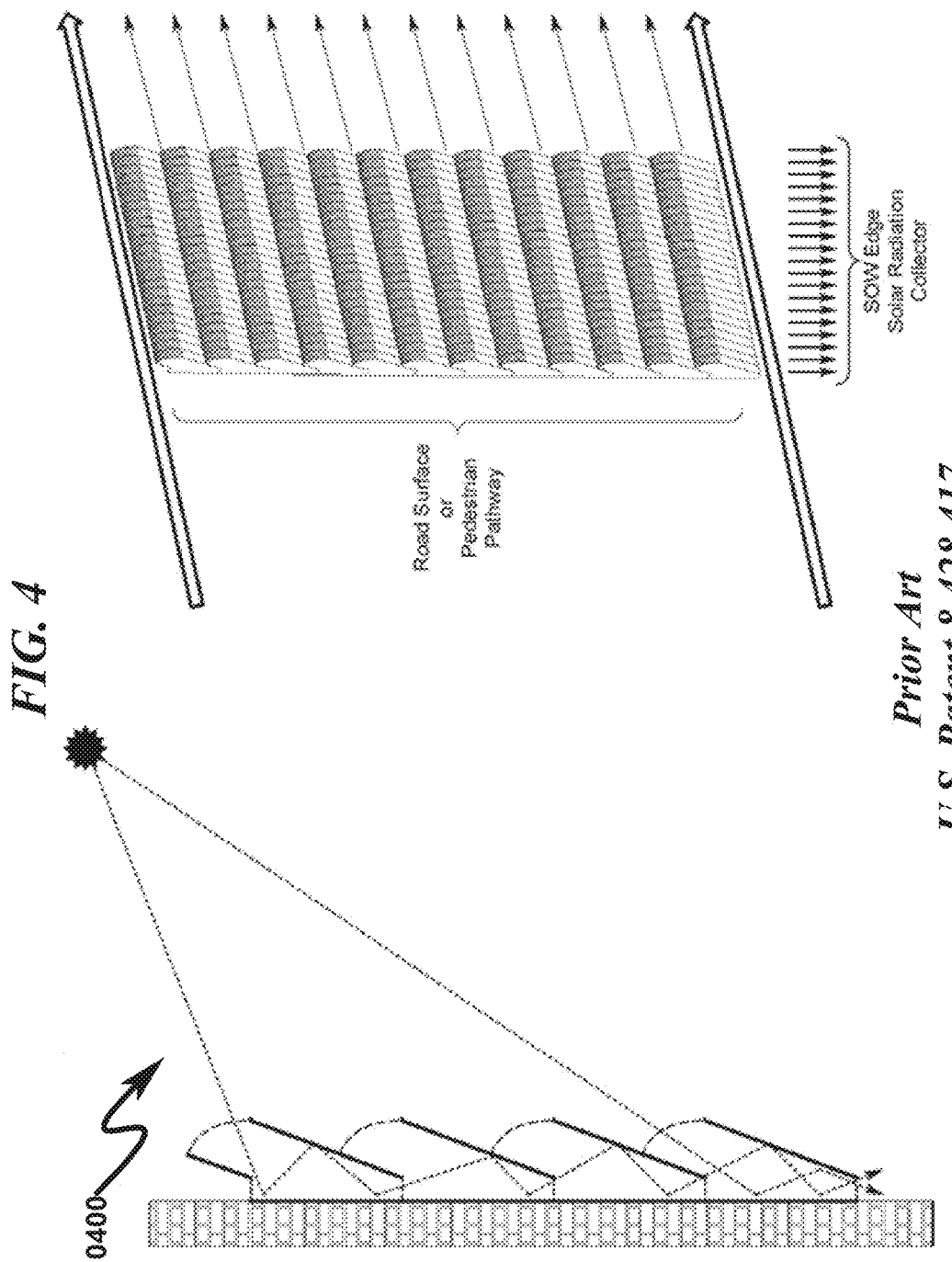
FIG. 4 illustrates combining solar collection elements to form a solar collection panel and the use of same on a road surface from U.S. Pat. No. 8,428,417.

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiment, wherein these innovative teachings are advantageously applied to the particular problems of an SOLAR ROADWAY SYSTEM AND METHOD. However, it should be understood that this embodiment is only one example of the many advantageous uses of the innovative teachings herein. In general, statements made in the specification of the present application do not necessarily limit any of the various claimed inventions. Moreover, some statements may apply to some inventive features but not to others.

Roadway/Transportation Surface Not Limitive

The terms "roadway" and "transportation surface" when used in the following description may refer to any relatively flat transportation surface, such as automobile roadways, highways, and the like; but also train tracks and the like; sidewalks and the like; and vehicle storage areas such as parking lots and the like. Thus, the terms "roadway" and "transportation surface" used herein have a broad context associated with a general transportation surface.

System Overview (0500)-(0800)

Figure 5:
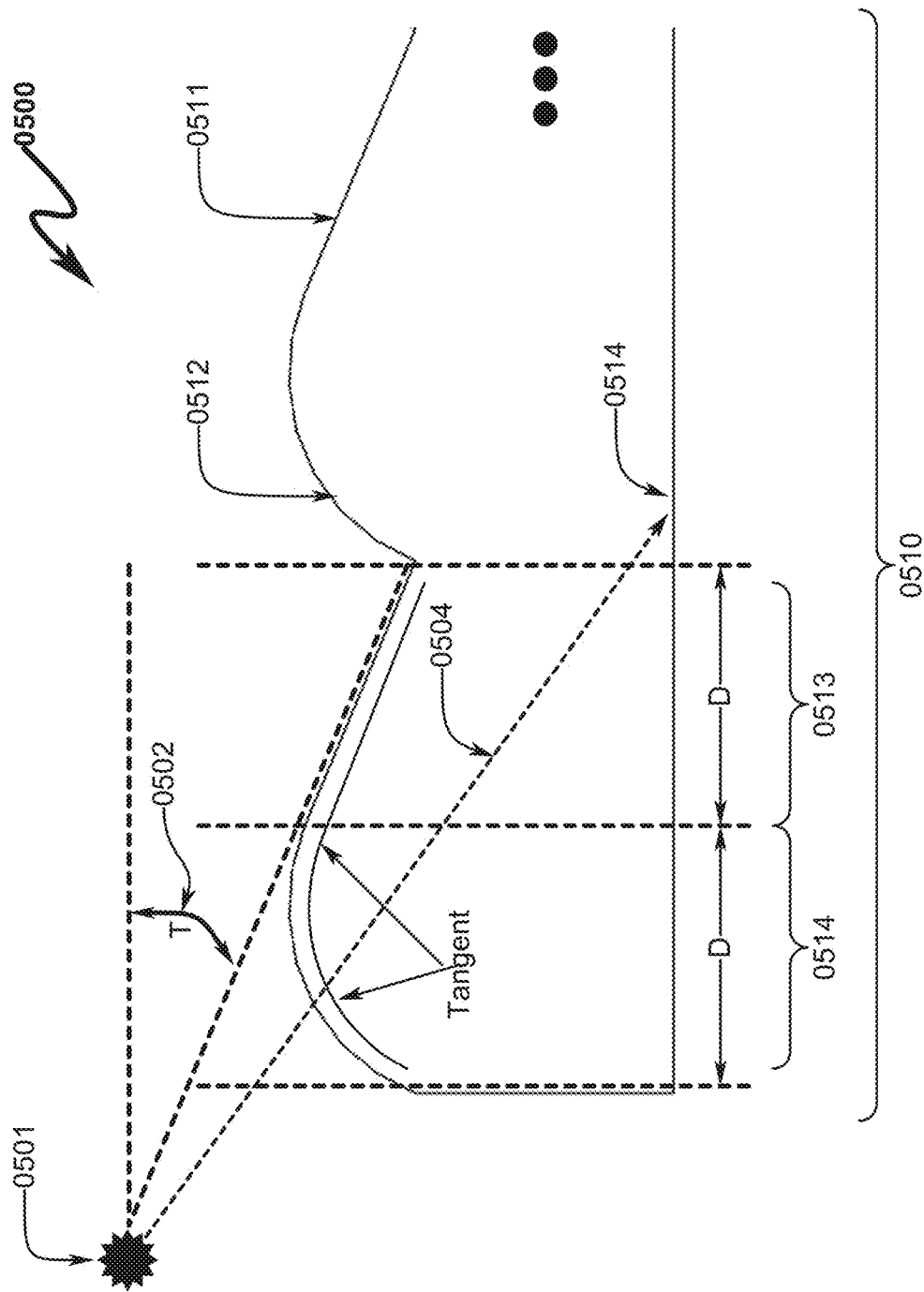
FIG. 5 illustrates a mechanical drawing depicting a preferred exemplary invention embodiment implementing a solar collection strip (SCS)

An overview of a preferred exemplary present invention system embodiment is depicted in FIG. 5 (0500). Here it can be seen that the system comprises a contiguous material of a solar collection strip (SCS) (0510) having a top surface with planes (0511) parallel to an incoming solar radiation source (0501) and a tangent curved portion (0512) intersecting the parallel plane (0511). The relative distances (0513, 0514) covered by the parallel plane (0511) and tangent curved surface (0512) are equal in length within a range of ±20%. Stated another way, in some preferred embodiments the pitch of each individual SCS collection element is equally divided within ±20% between the top surface parallel plane (0513) and the tangent curved portion (0514). The angle of inclination (surface inclination angle (SIA)) (0502) may vary and be in some circumstances determined by the latitude at which the solar collector is installed. As depicted in FIG. 5 (0500), the impinging solar radiation (0504) is collected at the bottom (0514) of the contiguous solar collection material (0510)

Figure 6:
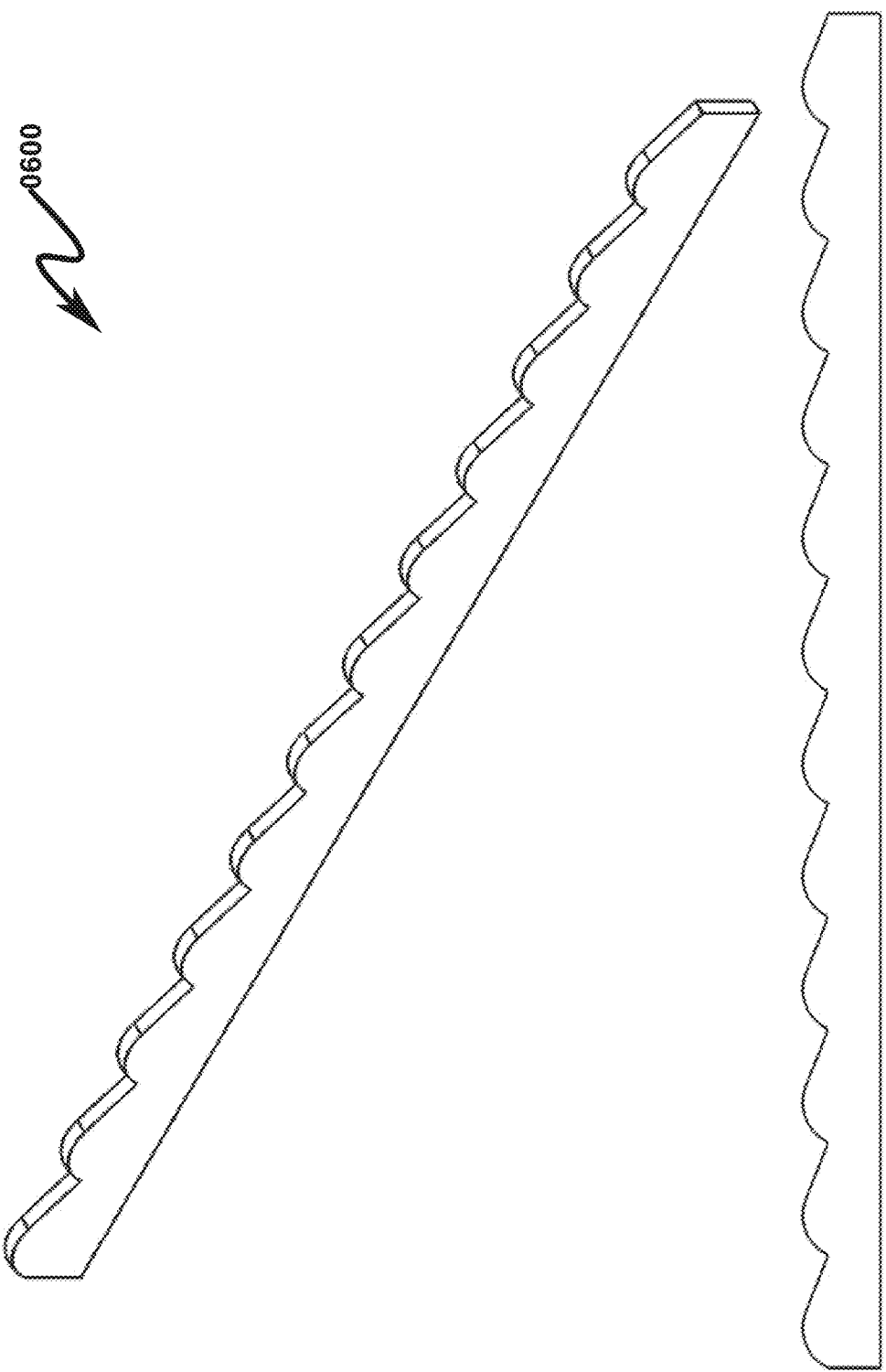
FIG. 6 illustrates perspective and side views of a preferred exemplary invention embodiment implementing a solar collection strip (SCS)
Figure 7:
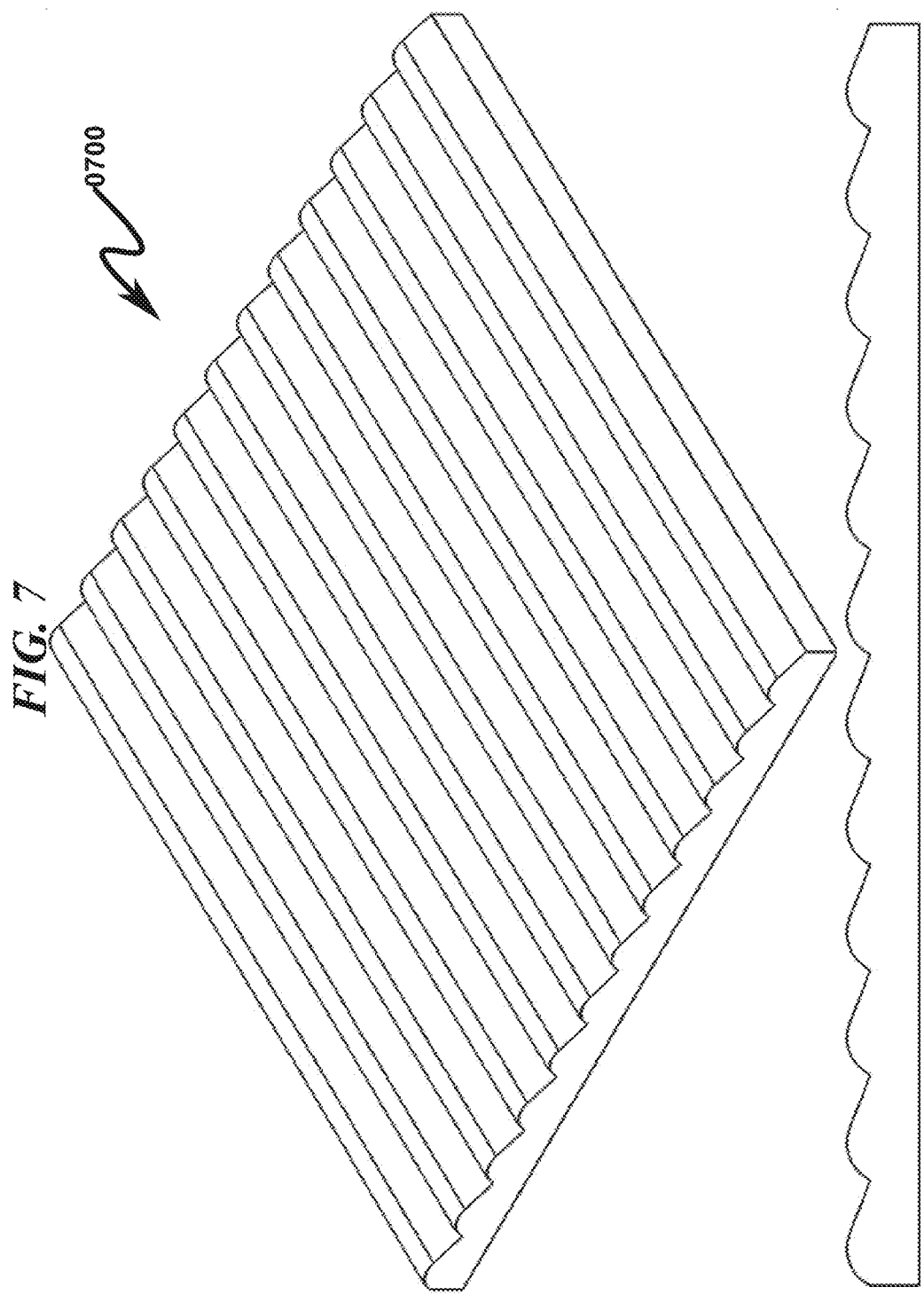
FIG. 7 illustrates perspective and side views of a preferred exemplary invention embodiment implementing a solar collection strip (SCS) elongated into a solar collection panel (SCP)

A contiguous solar collection strip implementing the teachings of FIG. 5 (0500) as implemented in a typical solar collection panel is depicted in FIG. 6 (0600). This structure may be elongated in depth as depicted in FIG. 7 (0700) to form a rectangular or square panel (typically 24×24-inch in size) that collects solar energy and focuses this on the bottom of the panel for solar cell collection.

Figure 8:
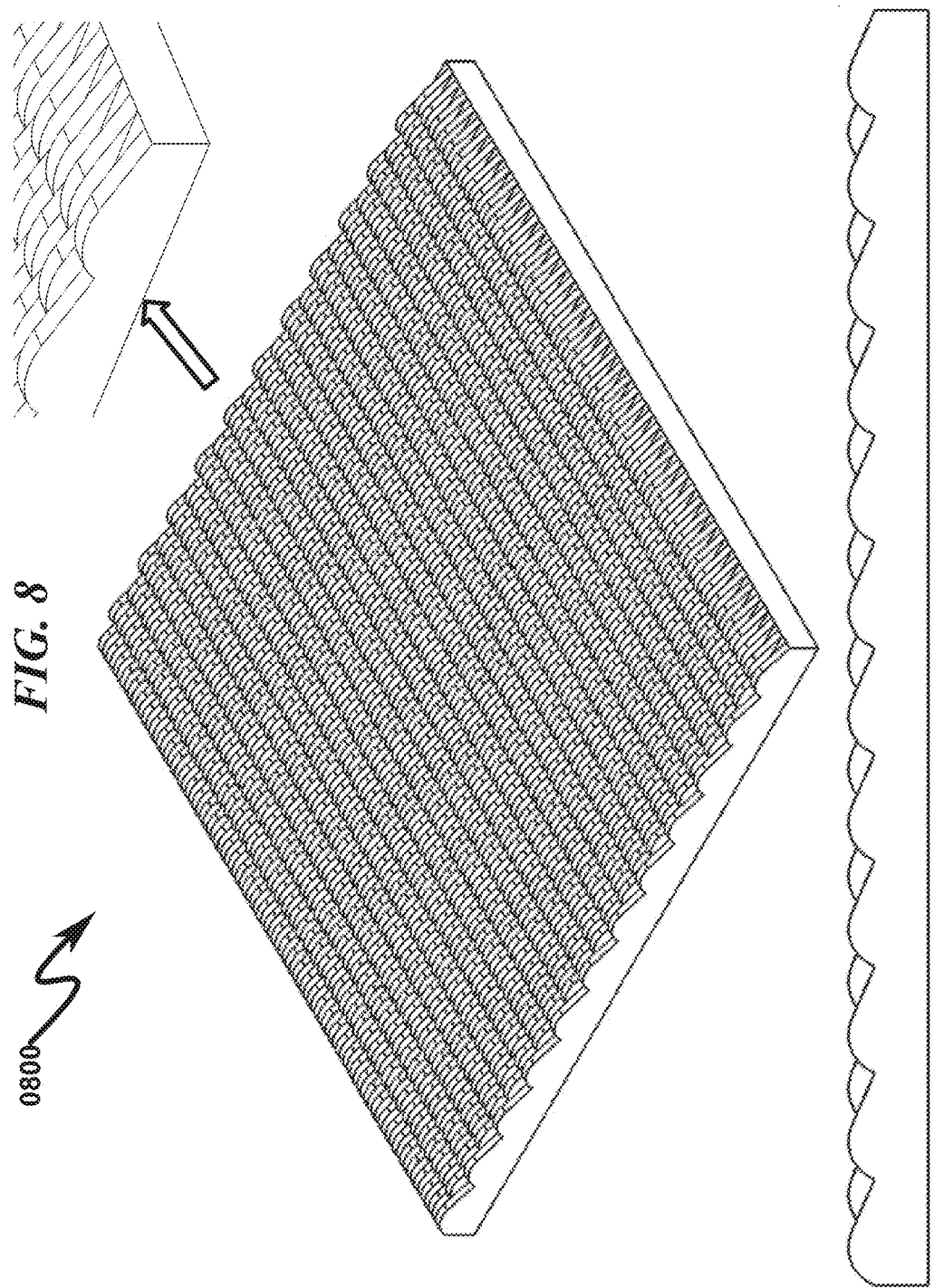
FIG. 8 illustrates perspective, detail, and side views of a preferred exemplary invention embodiment implementing solar collection strips (SCS) combined in an anti-symmetrical alignment pattern into a solar collection panel (SCP)

Another preferred embodiment of this structure that is considered best-mode is depicted in FIG. 8 (0800) wherein the parallel planes and tangent curved surfaces forming the solar collection strip (SCS) are stacked in an anti-symmetrical alignment pattern that allows solar energy to be efficiently collected while simultaneously supporting automobiles and other vehicles. This anti-symmetrical alignment pattern increases the overall strength of the SCS as the thinner portions of the SCS are mated with thicker portions of the adjacent anti-symmetrical SCS strips.

In some circumstances the surface inclination angle (SIA) of the adjacent SCS strips may differ from that used elsewhere in the non-adjacent strips in the solar collection panel (SCP). In other embodiments the SIA may vary across the face of the SCS collection panel such as to allow efficient and relatively stable solar collection during various portions of the year as the position of the sun in the sky varies. In other embodiments the SIA may conform to the inclination angle of the Earth's axis, or 23.4 degrees±1 degree. While the adjacent SCS anti-symmetrical alignment skew is illustrated as 50% in FIG. 8 (0800), in other embodiments the anti-symmetrical alignment pattern may skew the alignment of adjacent SCS strips in the SCP by 10%-90% of the pitch of each individual SCS collection element.

Exemplary Embodiment Detail (0900)-(5600)

Figure 9:
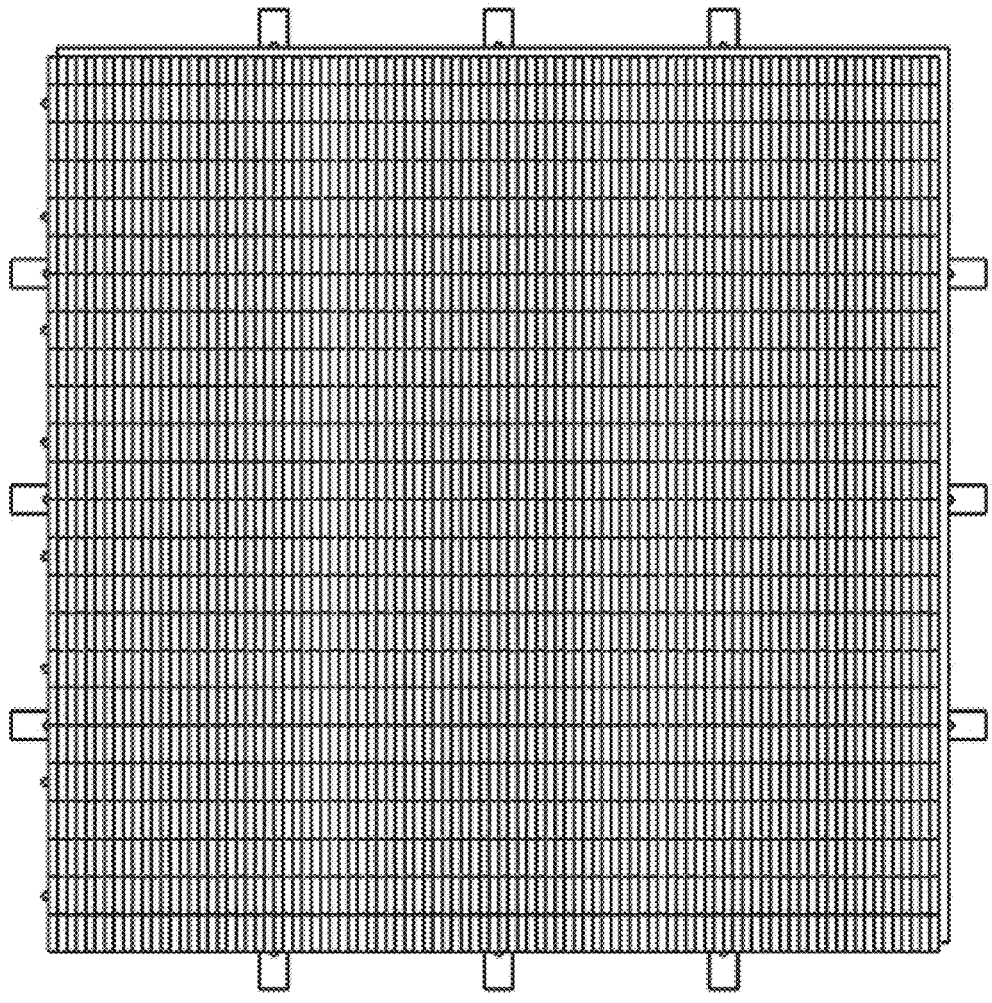
FIG. 9 illustrates a top view of a preferred exemplary invention embodiment implementing solar collection strips (SCS) combined in an anti-symmetrical alignment pattern into a solar collection panel (SCP)
Figure 10:
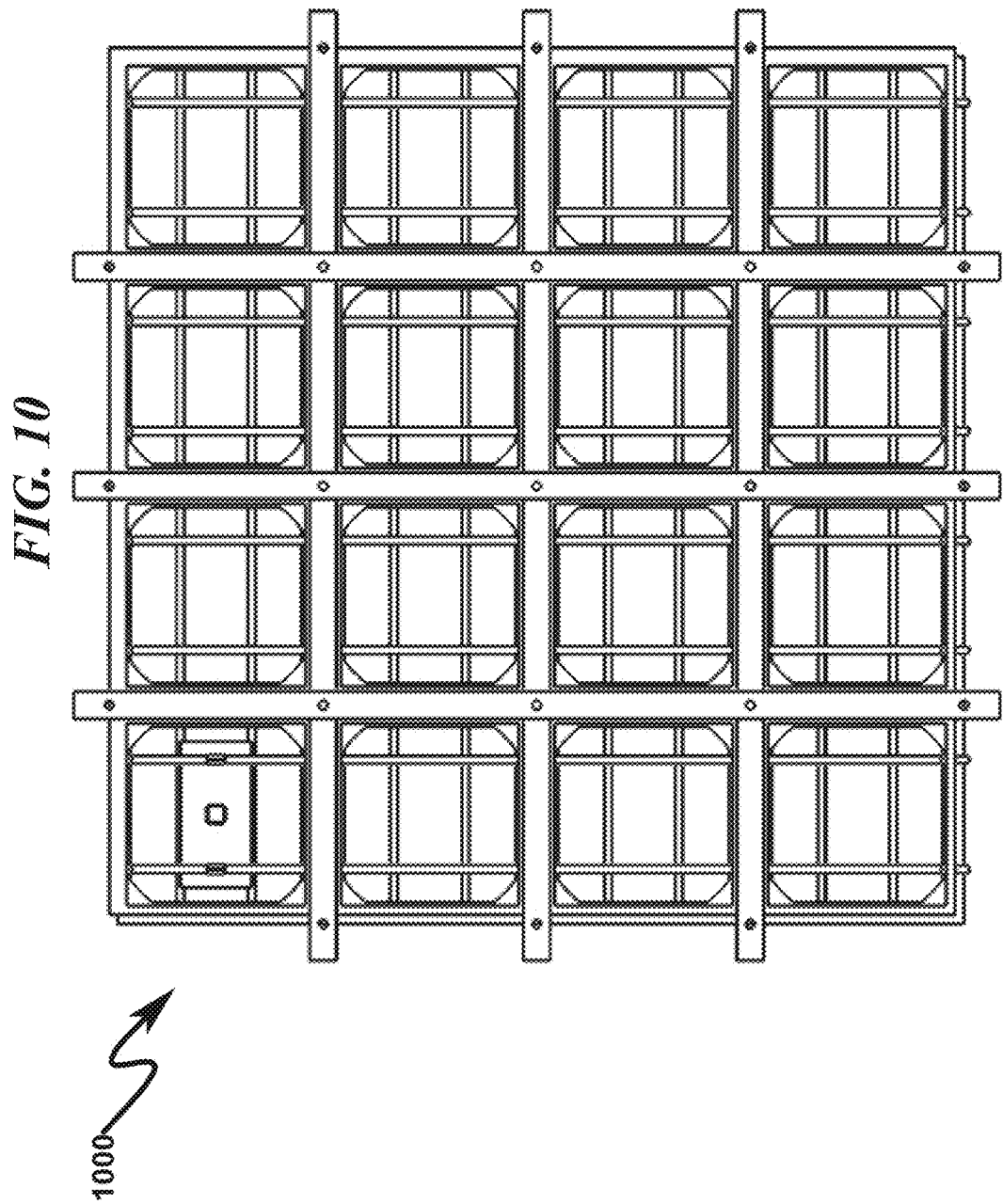
FIG. 10 illustrates a bottom view of a preferred exemplary invention embodiment implementing solar collection strips (SCS) combined in an anti-symmetrical alignment pattern into a solar collection panel (SCP)
Figure 11:
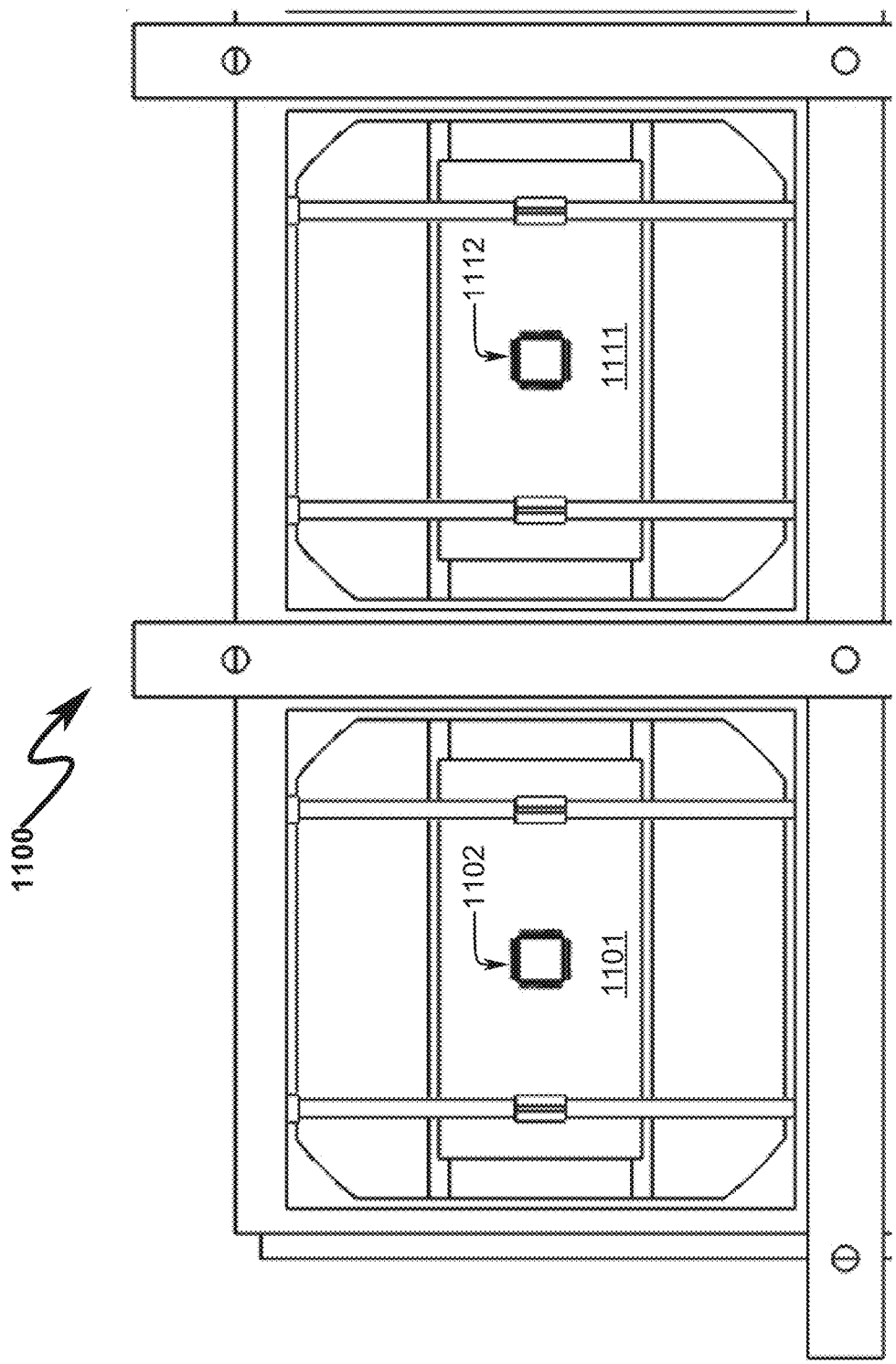
FIG. 11 illustrates a top detail view of a preferred exemplary invention embodiment implementing solar collection strips (SCS) combined in an anti-symmetrical alignment pattern into a solar collection panel (SCP) and illustrates two exemplary photovoltaic cell cavities (PCC)
Figure 12:
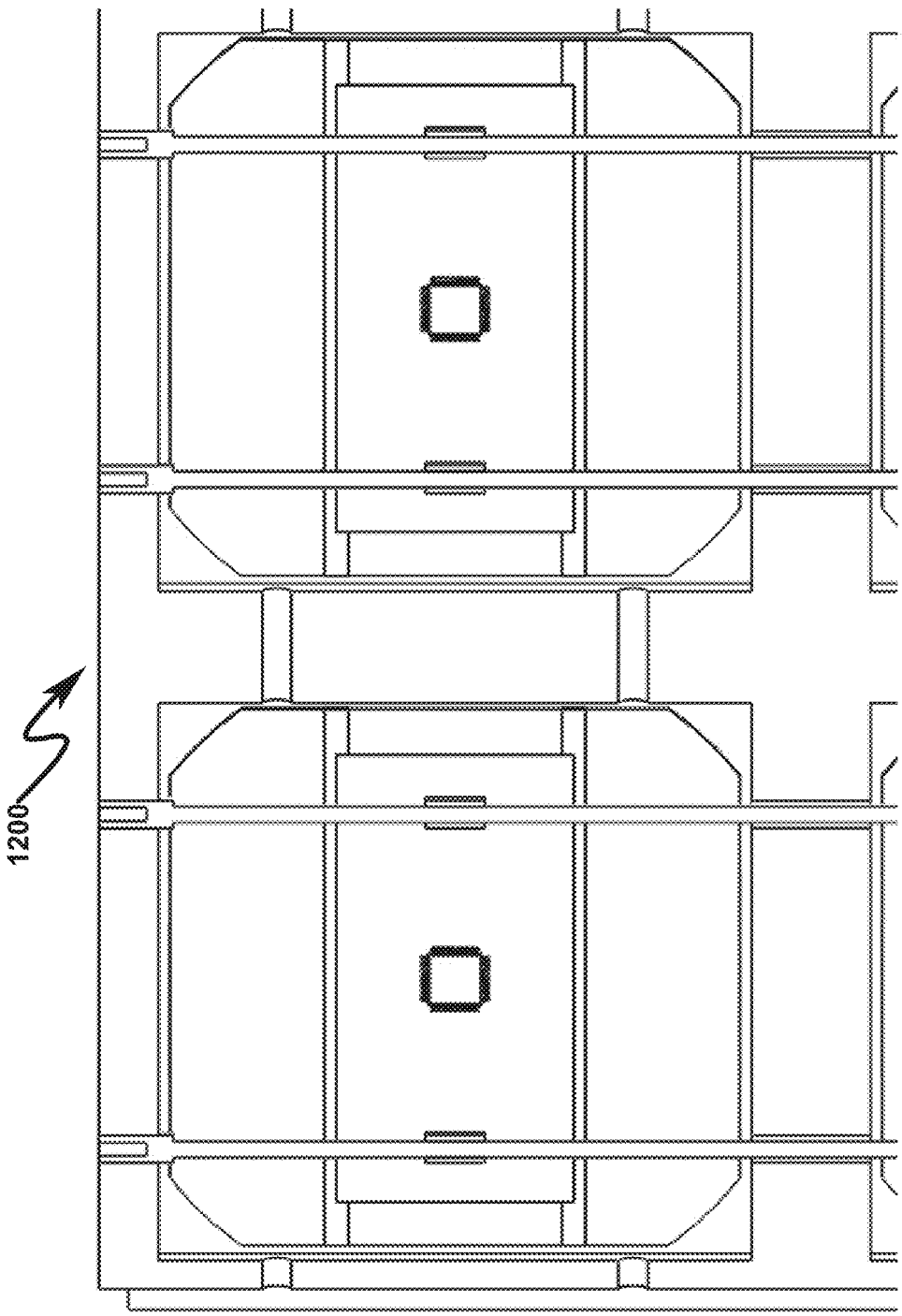
FIG. 12 illustrates a top detail view of a preferred exemplary invention embodiment implementing solar collection strips (SCS) combined in an anti-symmetrical alignment pattern into a solar collection panel (SCP) and illustrates two exemplary photovoltaic cell cavities (PCC) in a cross section across the power cables.
Figure 13:
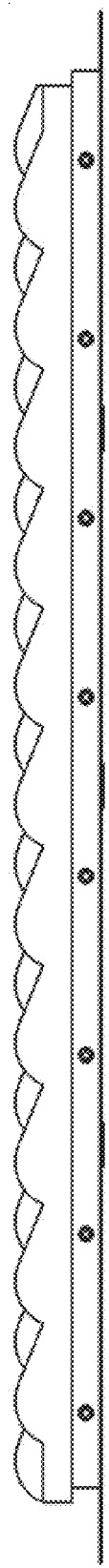
FIG. 13 illustrates a front view of a preferred exemplary invention embodiment implementing solar collection strips (SCS) combined in an anti-symmetrical alignment pattern into a solar collection panel (SCP)
Figure 14:
FIG. 14 illustrates a rear view of a preferred exemplary invention embodiment implementing solar collection strips (SCS) combined in an anti-symmetrical alignment pattern into a solar collection panel (SCP)
Figure 15:
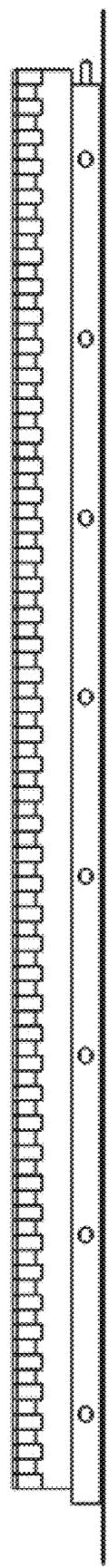
FIG. 15 illustrates a right view of a preferred exemplary invention embodiment implementing solar collection strips (SCS) combined in an anti-symmetrical alignment pattern into a solar collection panel (SCP)
Figure 16:
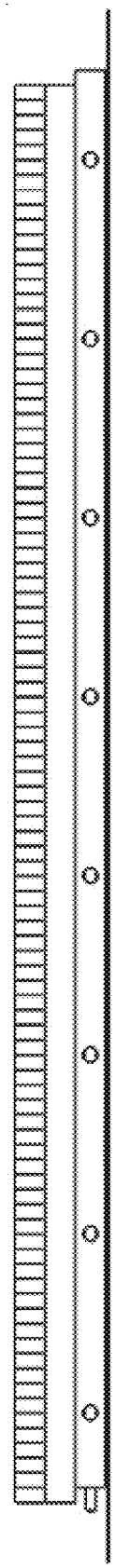
FIG. 16 illustrates a left view of a preferred exemplary invention embodiment implementing solar collection strips (SCS) combined in an anti-symmetrical alignment pattern into a solar collection panel (SCP)
Figure 17:
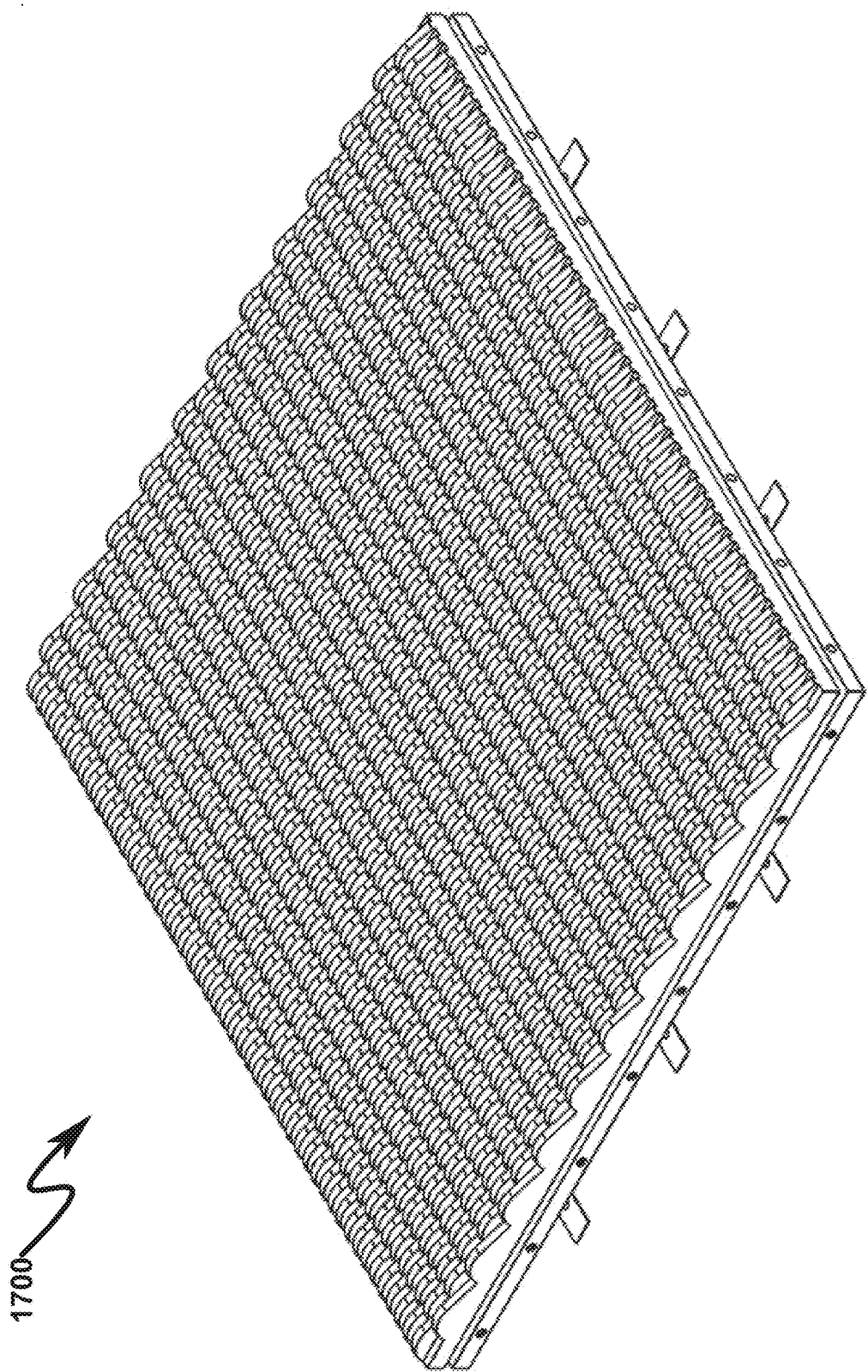
FIG. 17 illustrates a top view of a preferred exemplary invention embodiment implementing solar collection strips (SCS) (hidden in this view) combined in an anti-symmetrical alignment pattern into a solar collection panel (SCP)
Figure 18:
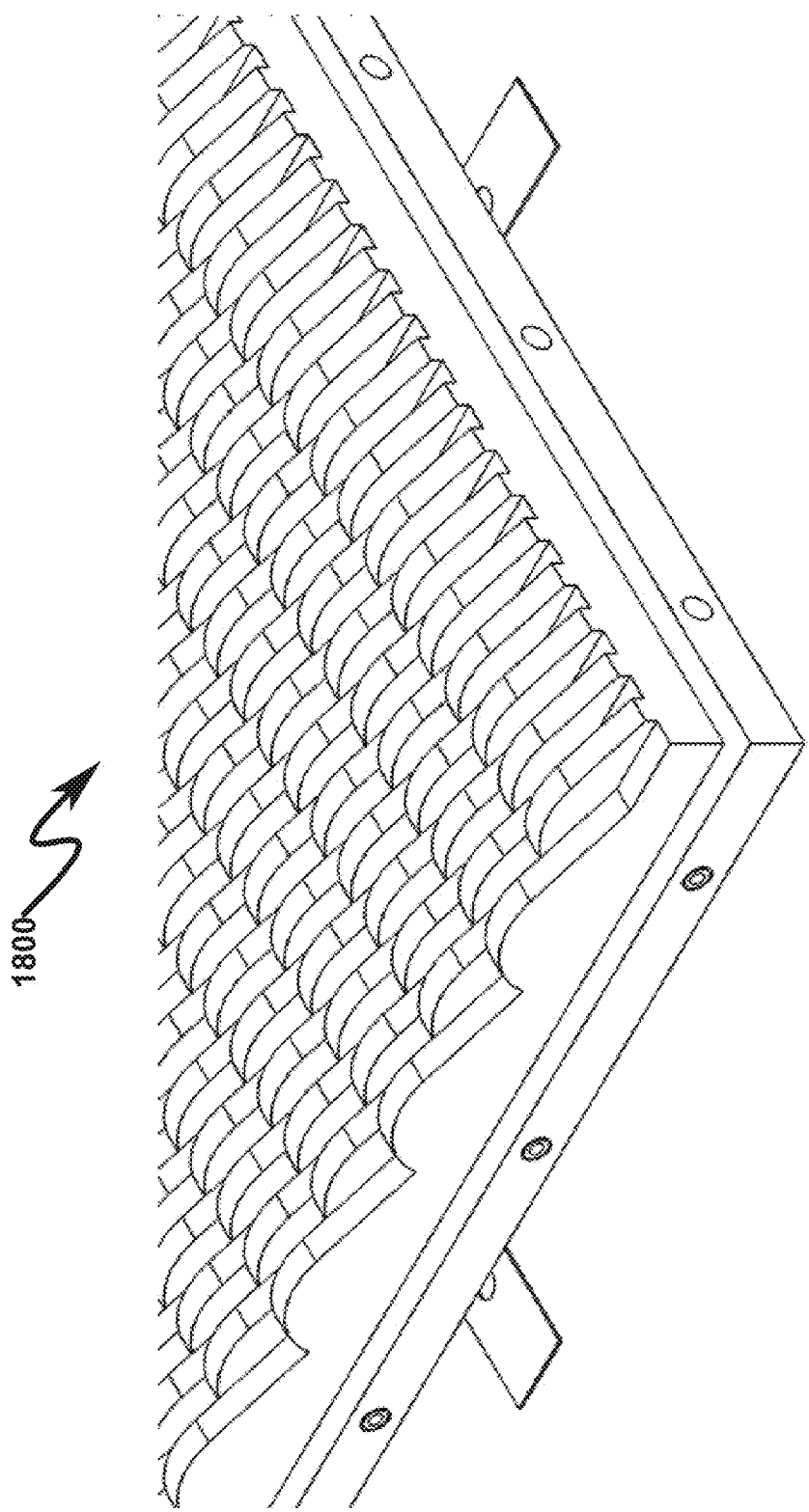
FIG. 18 illustrates a bottom view of a preferred exemplary invention embodiment implementing solar collection strips (SCS) (hidden in this view) combined in an anti-symmetrical alignment pattern into a solar collection panel (SCP)
Figure 19:
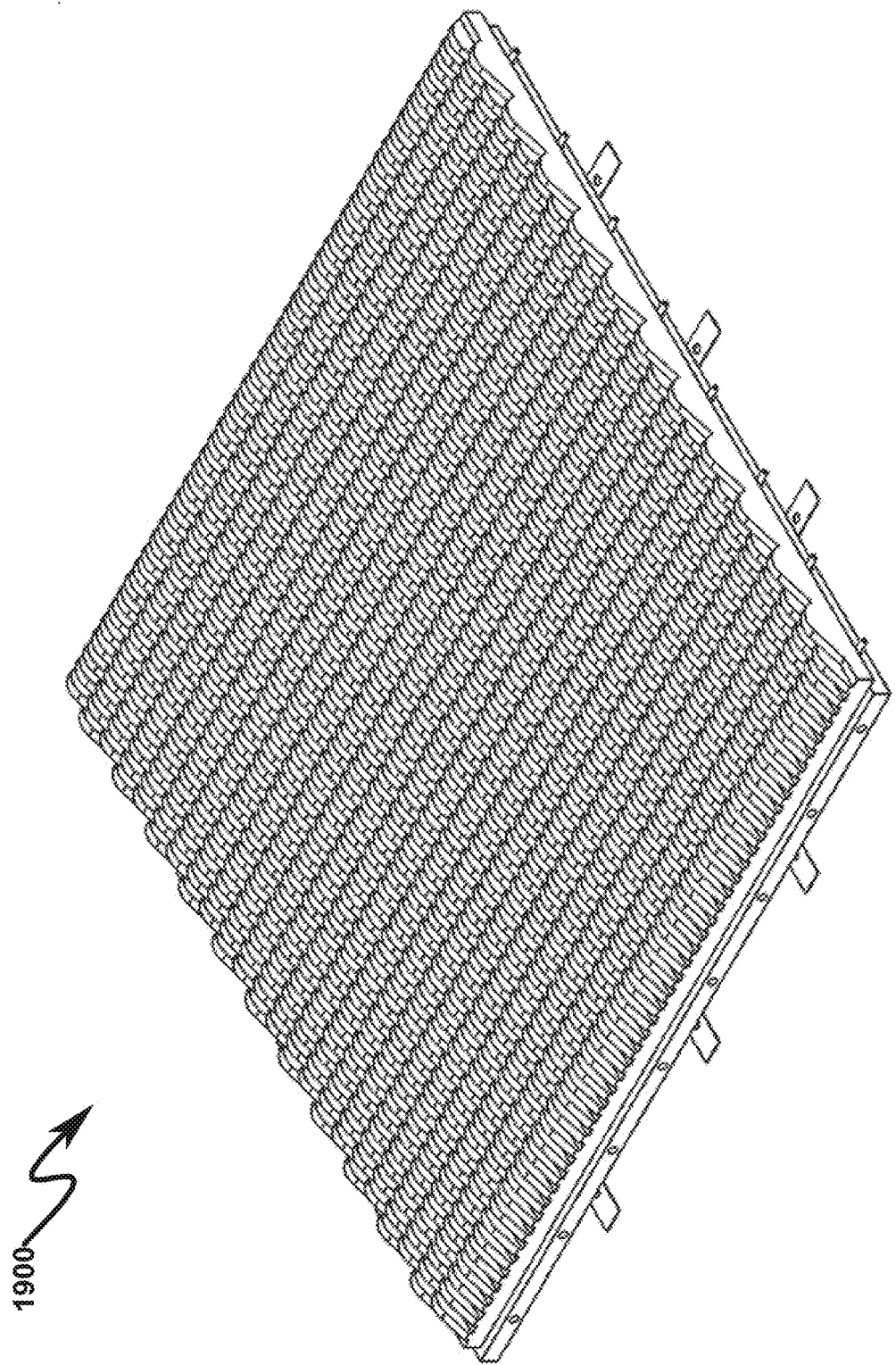
FIG. 19 illustrates a top detail view of a preferred exemplary invention embodiment implementing solar collection strips (SCS) (hidden in this view) combined in an anti-symmetrical alignment pattern into a solar collection panel (SCP) and illustrates two exemplary photovoltaic cell cavities (PCC)
Figure 20:
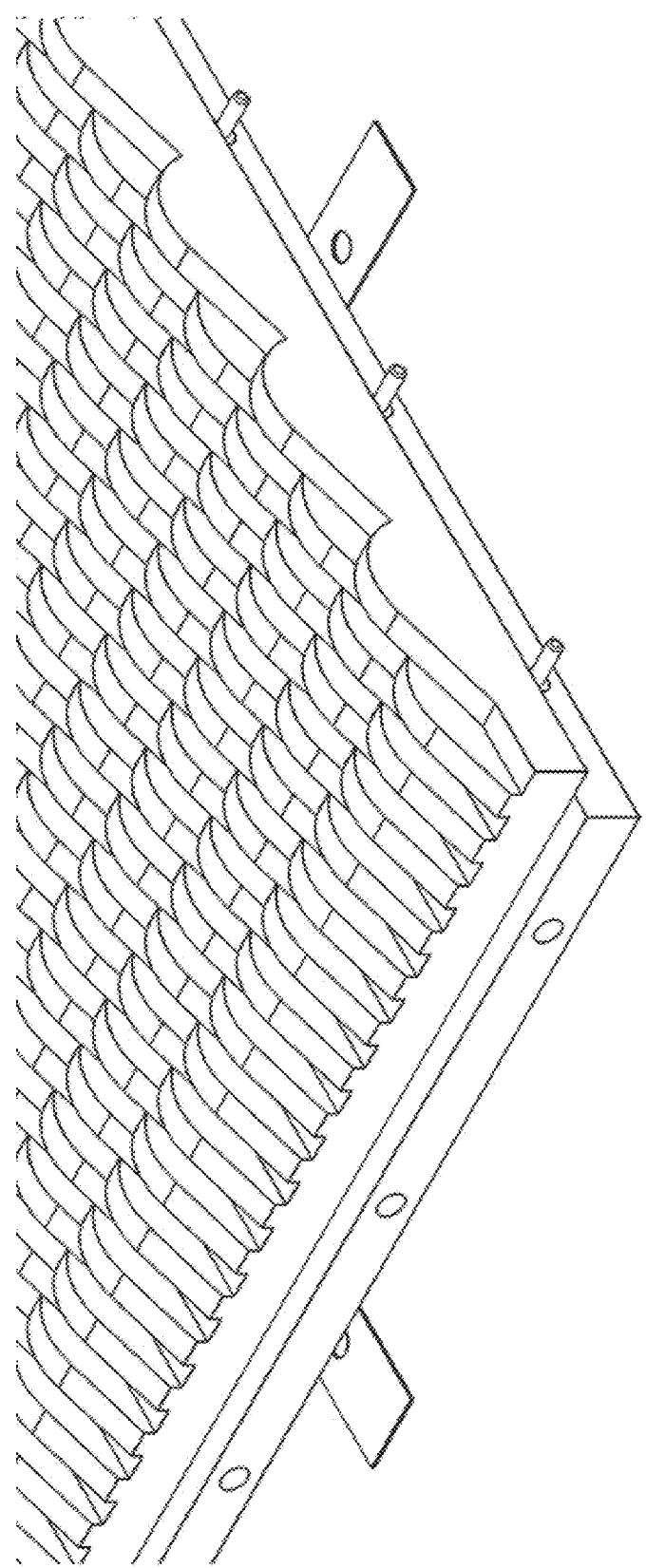
FIG. 20 illustrates a top detail view of a preferred exemplary invention embodiment implementing solar collection strips (SCS) (hidden in this view) combined in an anti-symmetrical alignment pattern into a solar collection panel (SCP) and illustrates two exemplary photovoltaic cell cavities (PCC) in a cross section across the power cables.
Figure 21:
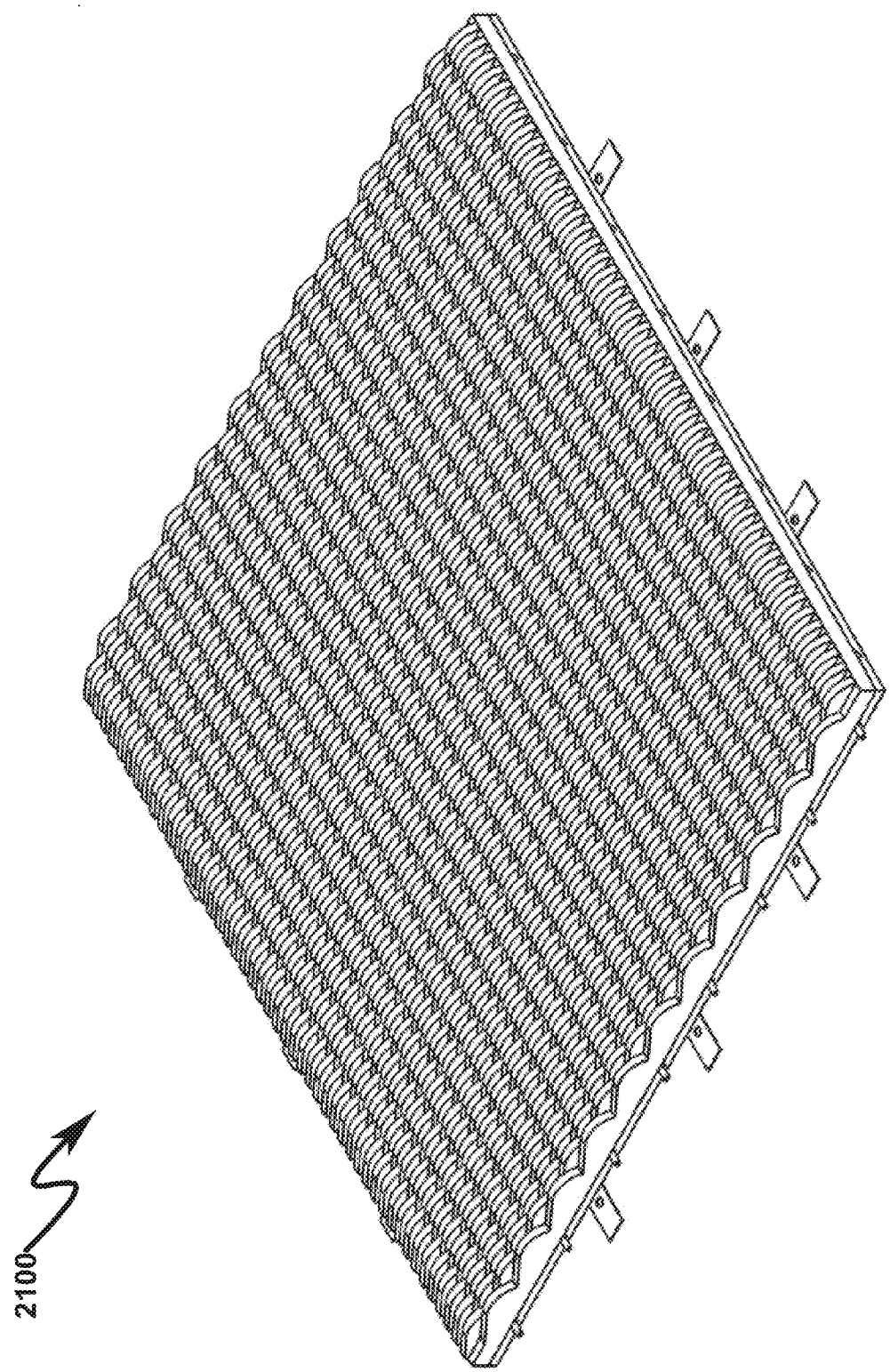
FIG. 21 illustrates a front view of a preferred exemplary invention embodiment implementing solar collection strips (SCS) (hidden in this view) combined in an anti-symmetrical alignment pattern into a solar collection panel (SCP)
Figure 22:
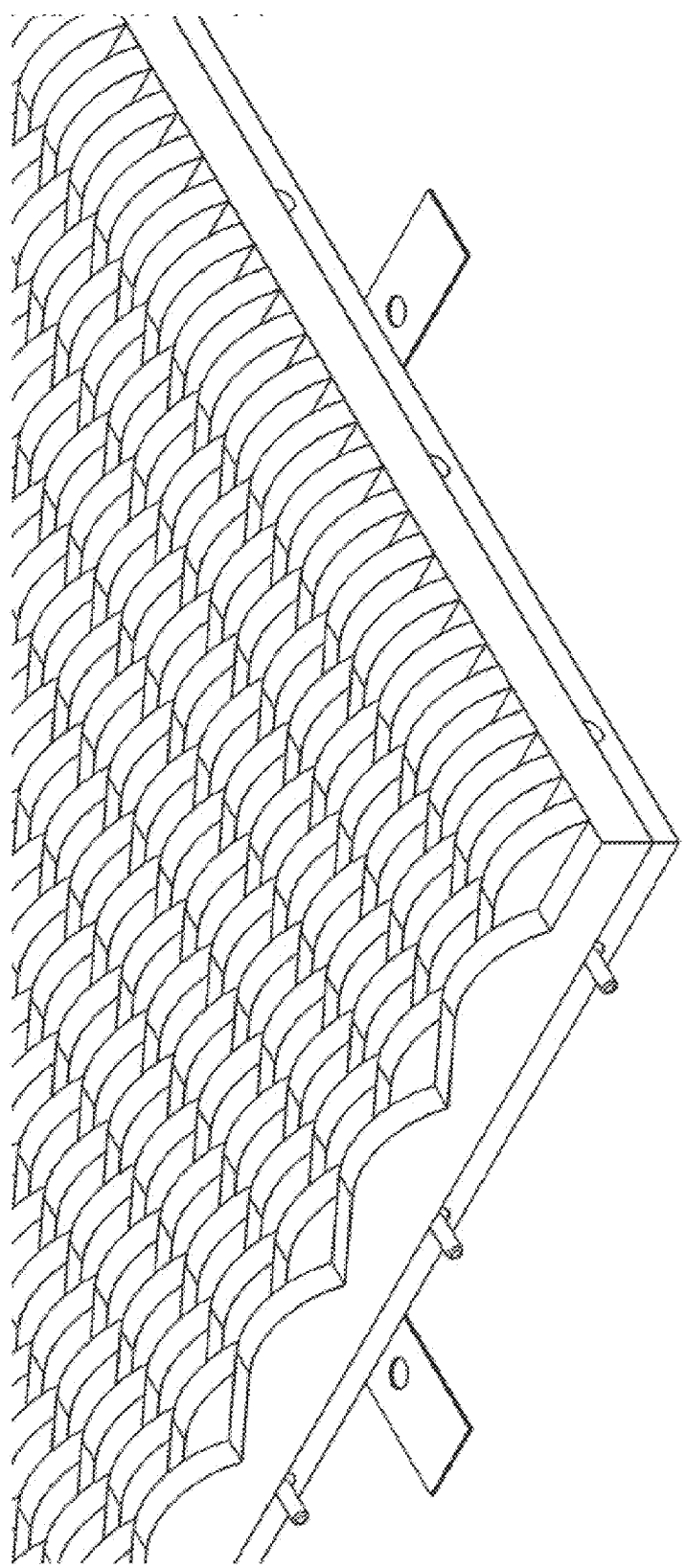
FIG. 22 illustrates a rear view of a preferred exemplary invention embodiment implementing solar collection strips (SCS) (hidden in this view) combined in an anti-symmetrical alignment pattern into a solar collection panel (SCP)
Figure 23:
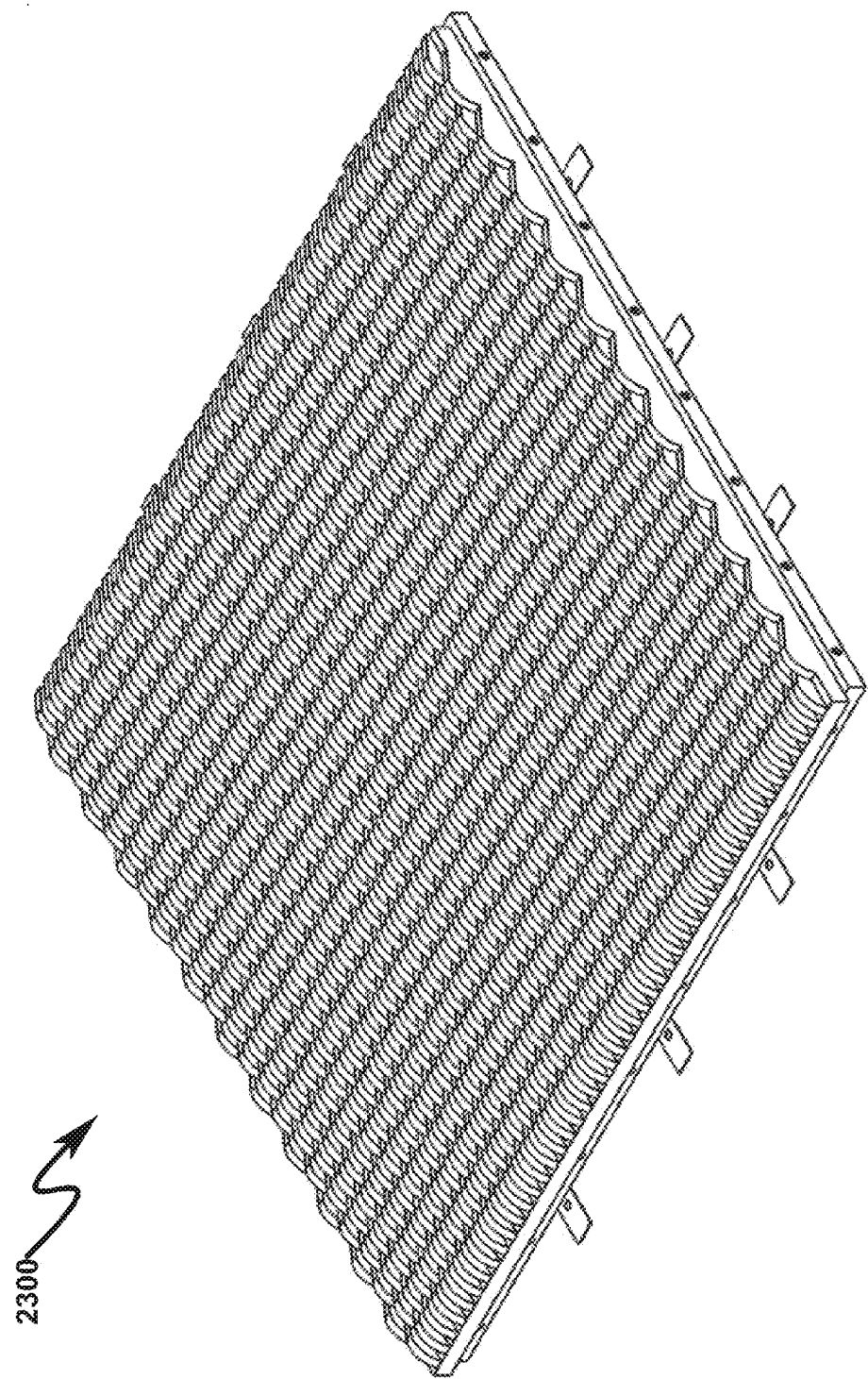
FIG. 23 illustrates a right view of a preferred exemplary invention embodiment implementing solar collection strips (SCS) (hidden in this view) combined in an anti-symmetrical alignment pattern into a solar collection panel (SCP)
Figure 24:
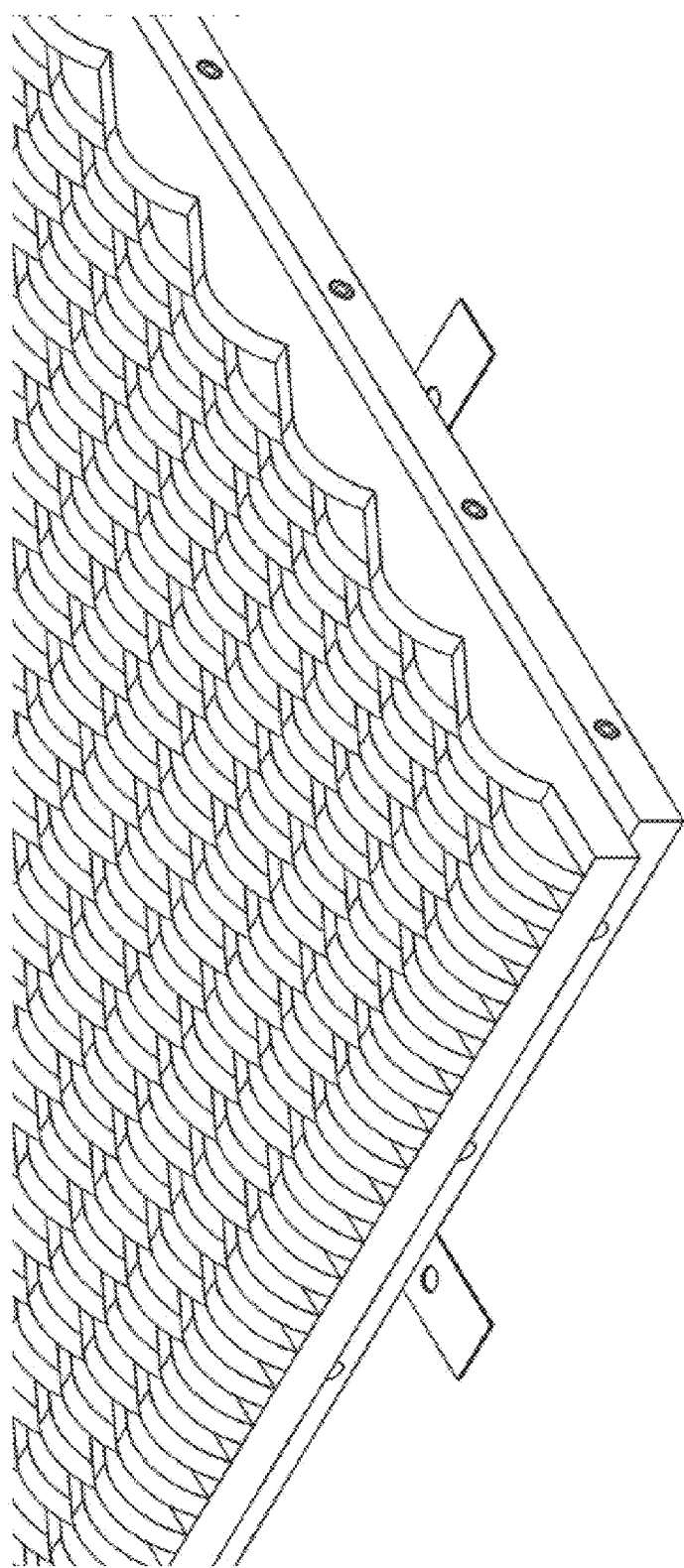
FIG. 24 illustrates a left view of a preferred exemplary invention embodiment implementing solar collection strips (SCS) (hidden in this view) combined in an anti-symmetrical alignment pattern into a solar collection panel (SCP)
Figure 25:
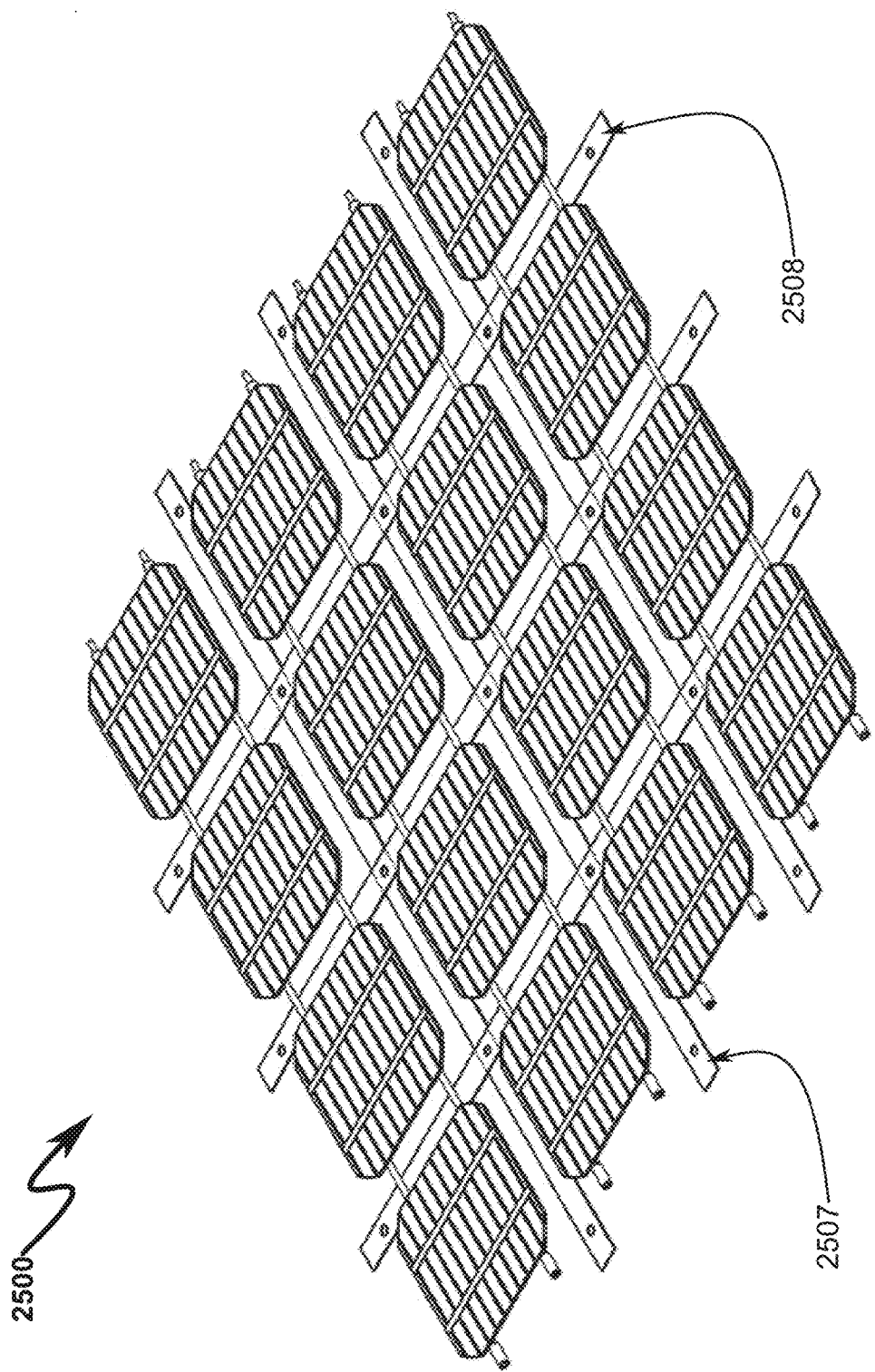
FIG. 25 illustrates a top right front perspective view of a preferred exemplary invention embodiment implementing solar collection strips (SCS) combined in an anti-symmetrical alignment pattern into a solar collection panel (SCP)
Figure 26:
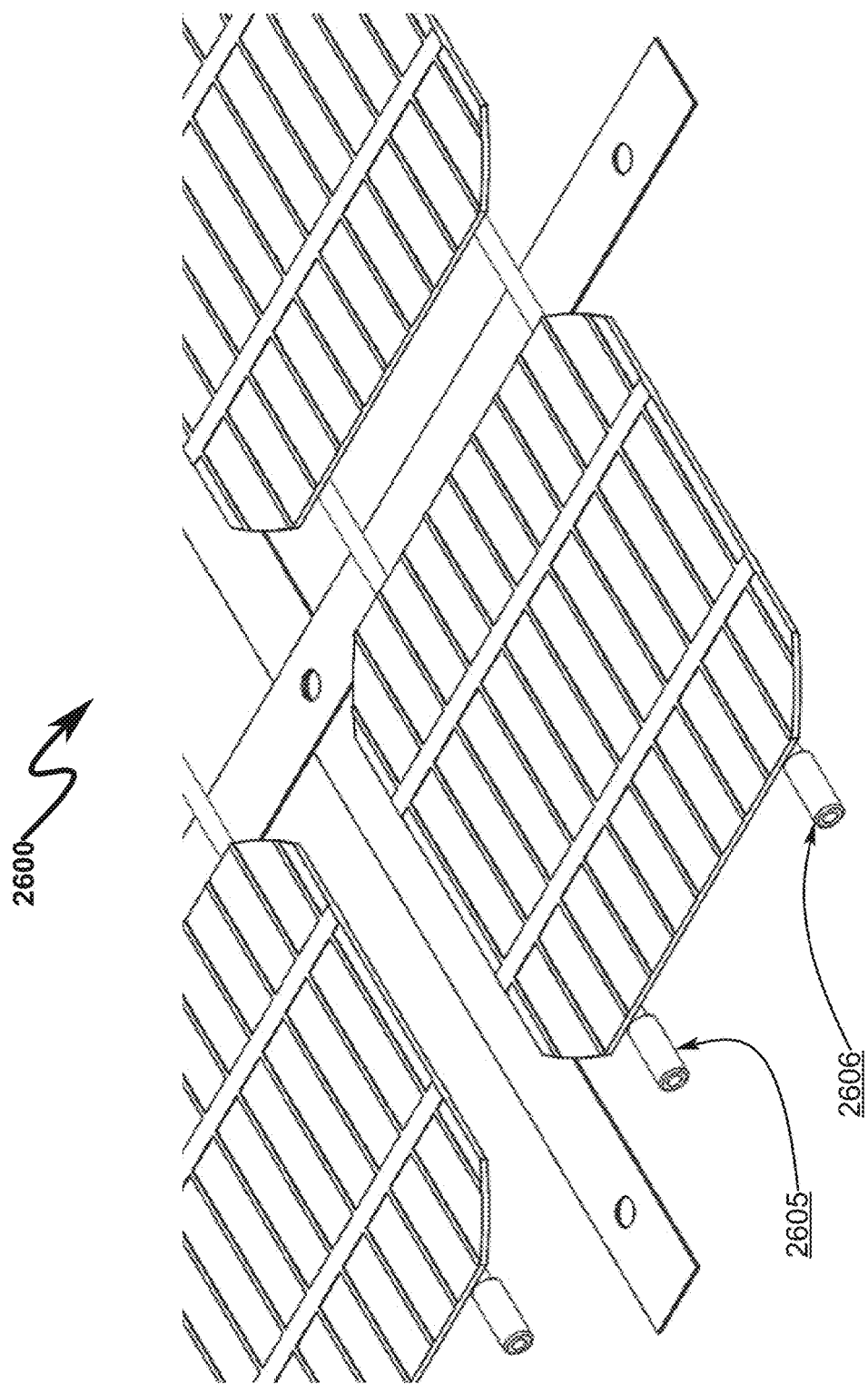
FIG. 26 illustrates a top right front detail perspective view of a preferred exemplary invention embodiment implementing solar collection strips (SCS) combined in an anti-symmetrical alignment pattern into a solar collection panel (SCP)
Figure 27:
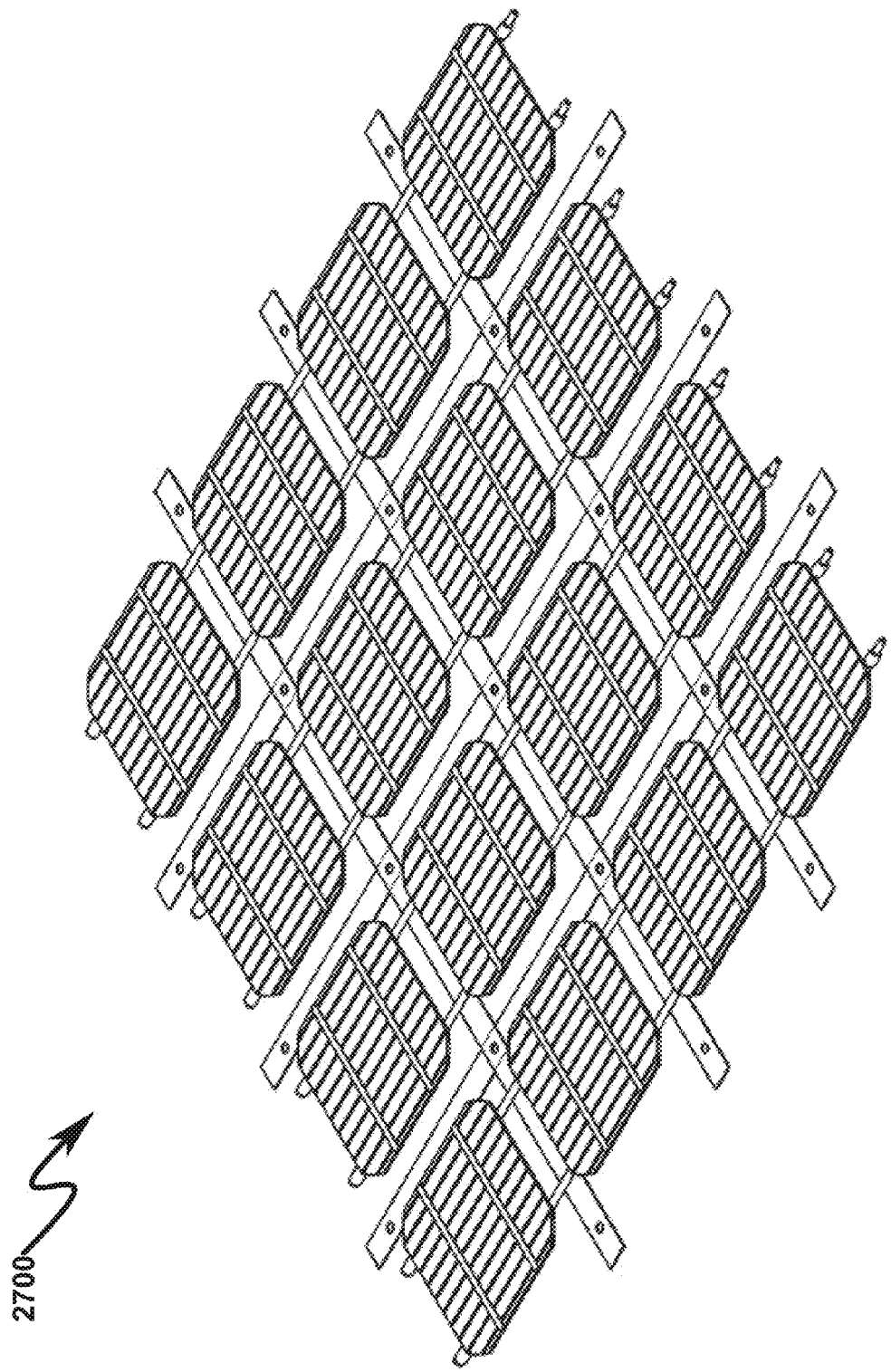
FIG. 27 illustrates a top right rear perspective view of a preferred exemplary invention embodiment implementing solar collection strips (SCS) combined in an anti-symmetrical alignment pattern into a solar collection panel (SCP)
Figure 28:
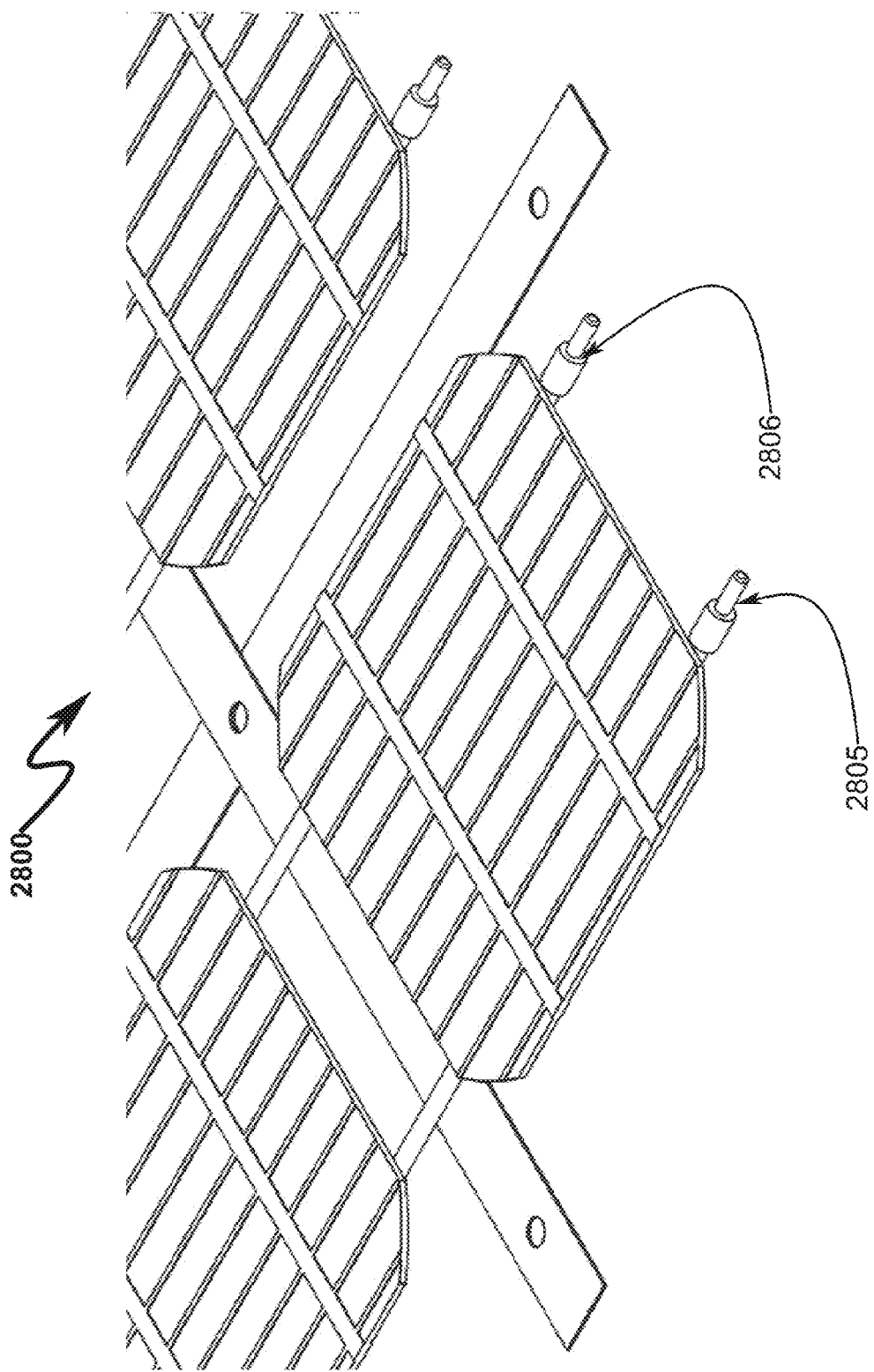
FIG. 28 illustrates a top right rear detail perspective view of a preferred exemplary invention embodiment implementing solar collection strips (SCS) combined in an anti-symmetrical alignment pattern into a solar collection panel (SCP)
Figure 29:
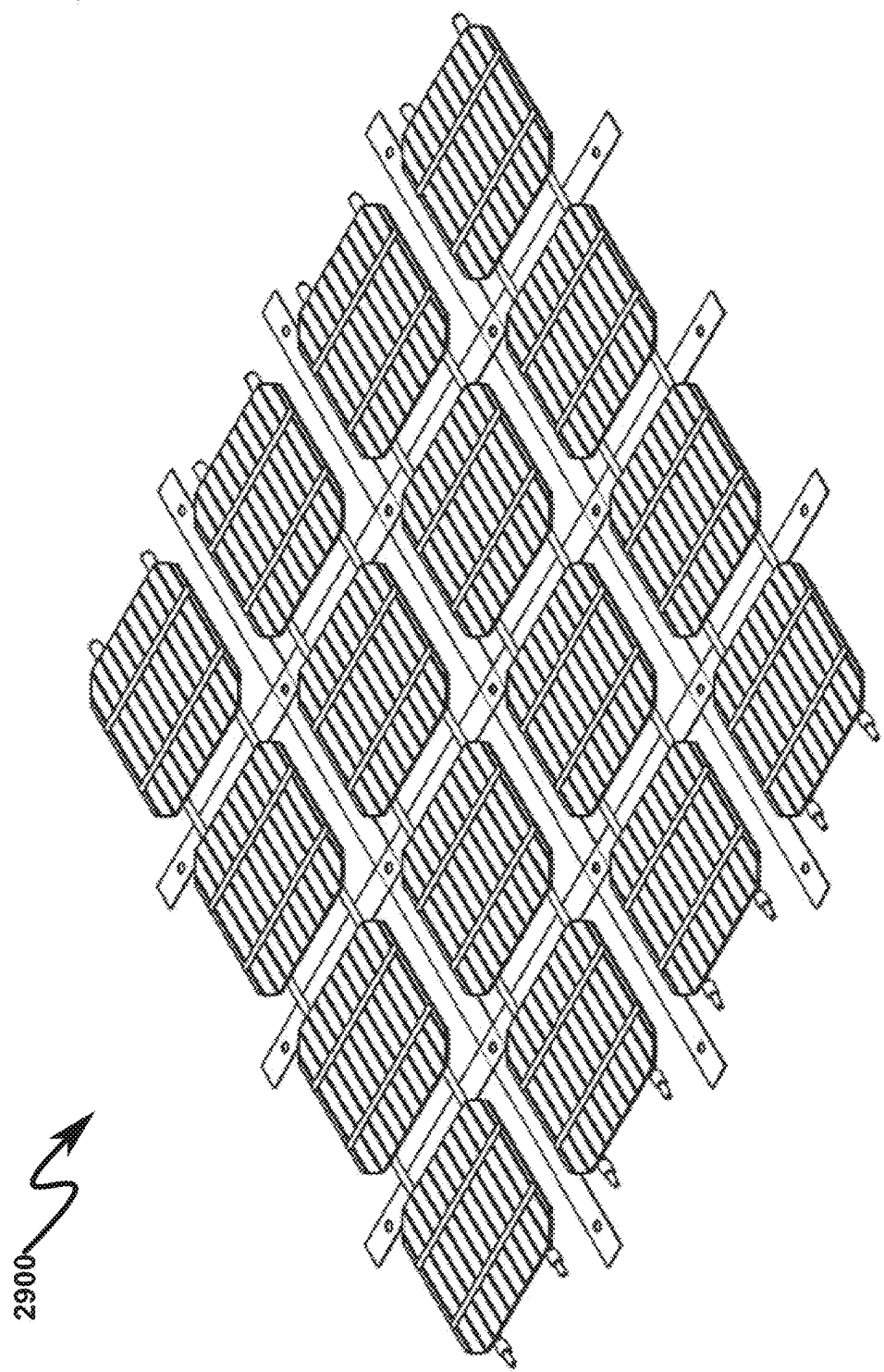
FIG. 29 illustrates a top left rear perspective view of a preferred exemplary invention embodiment implementing solar collection strips (SCS) combined in an anti-symmetrical alignment pattern into a solar collection panel (SCP)
Figure 30:
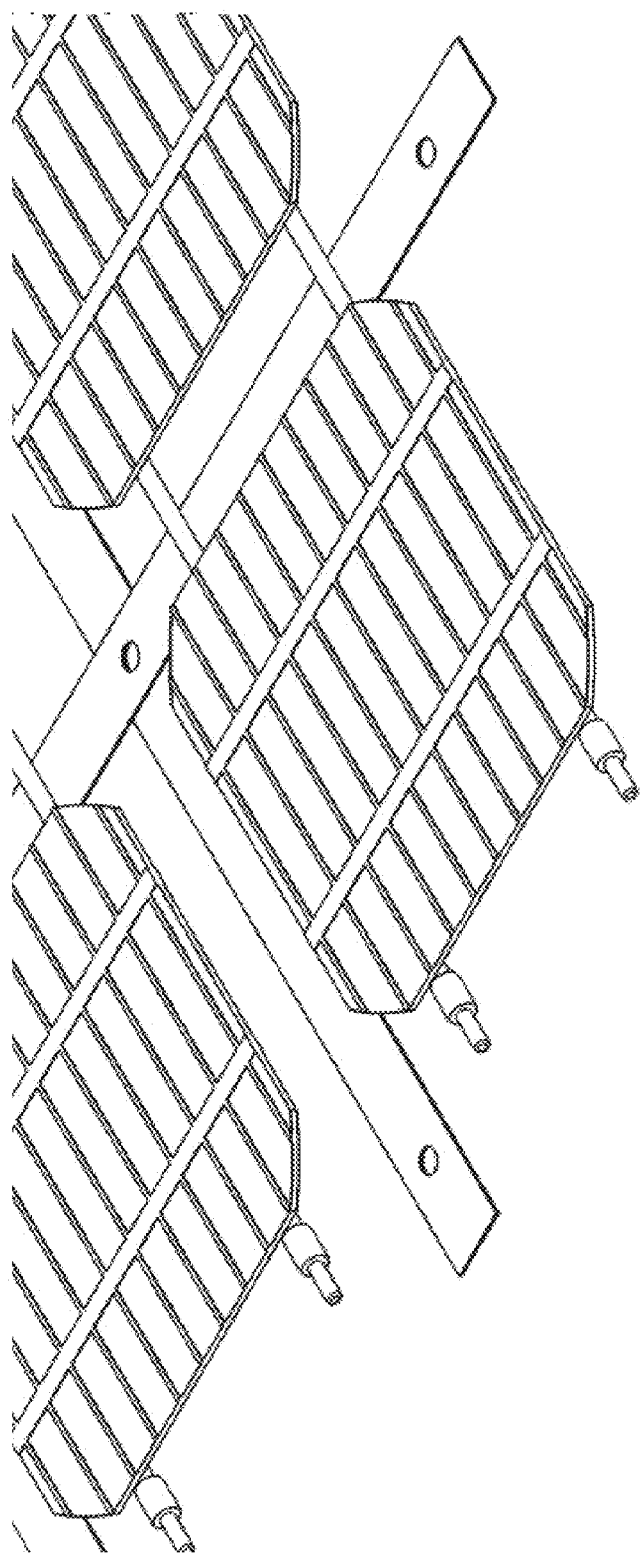
FIG. 30 illustrates a top left rear detail perspective view of a preferred exemplary invention embodiment implementing solar collection strips (SCS) combined in an anti-symmetrical alignment pattern into a solar collection panel (SCP)
Figure 31:
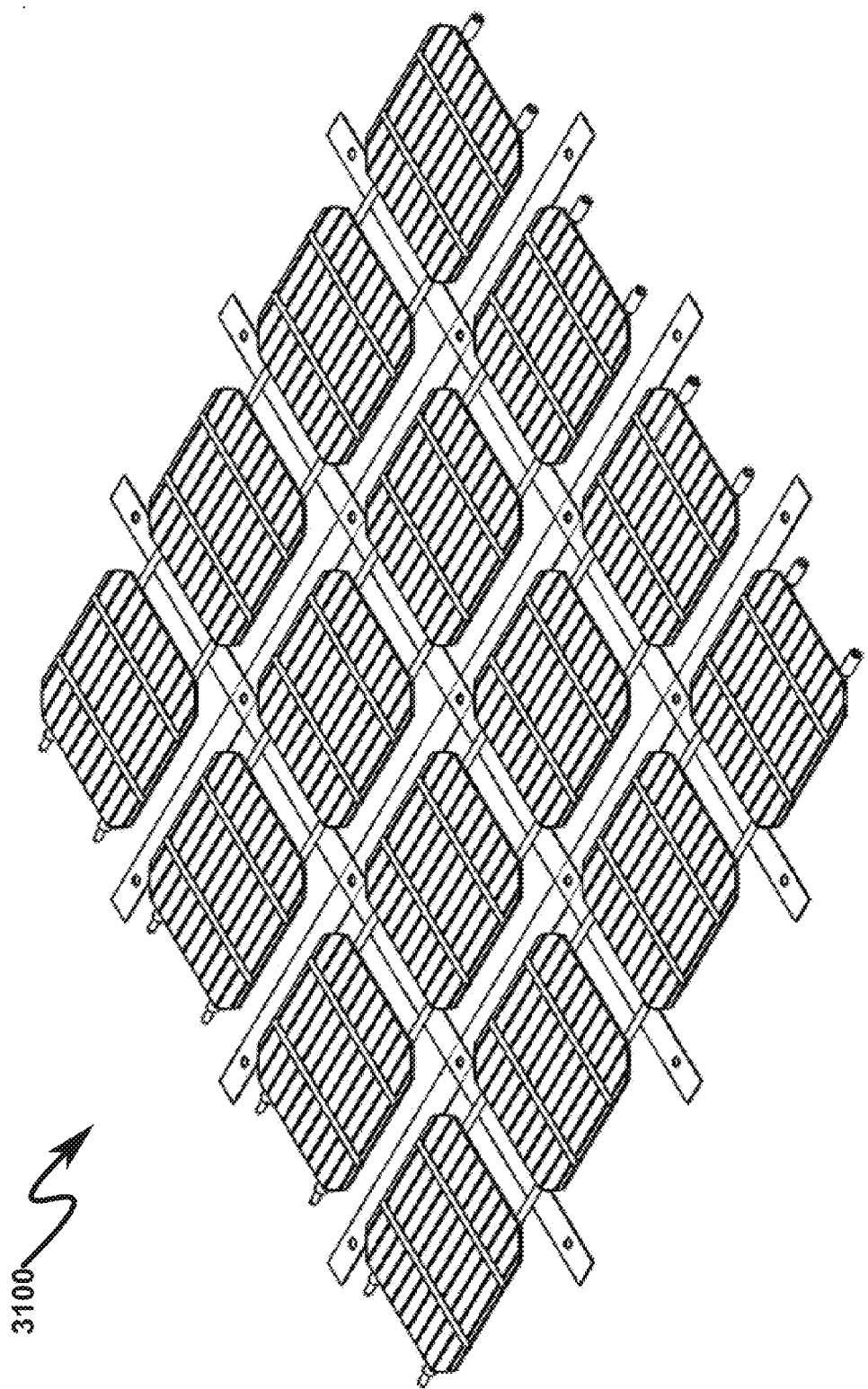
FIG. 31 illustrates a top left front perspective view of a preferred exemplary invention embodiment implementing solar collection strips (SCS) combined in an anti-symmetrical alignment pattern into a solar collection panel (SCP)
Figure 32:
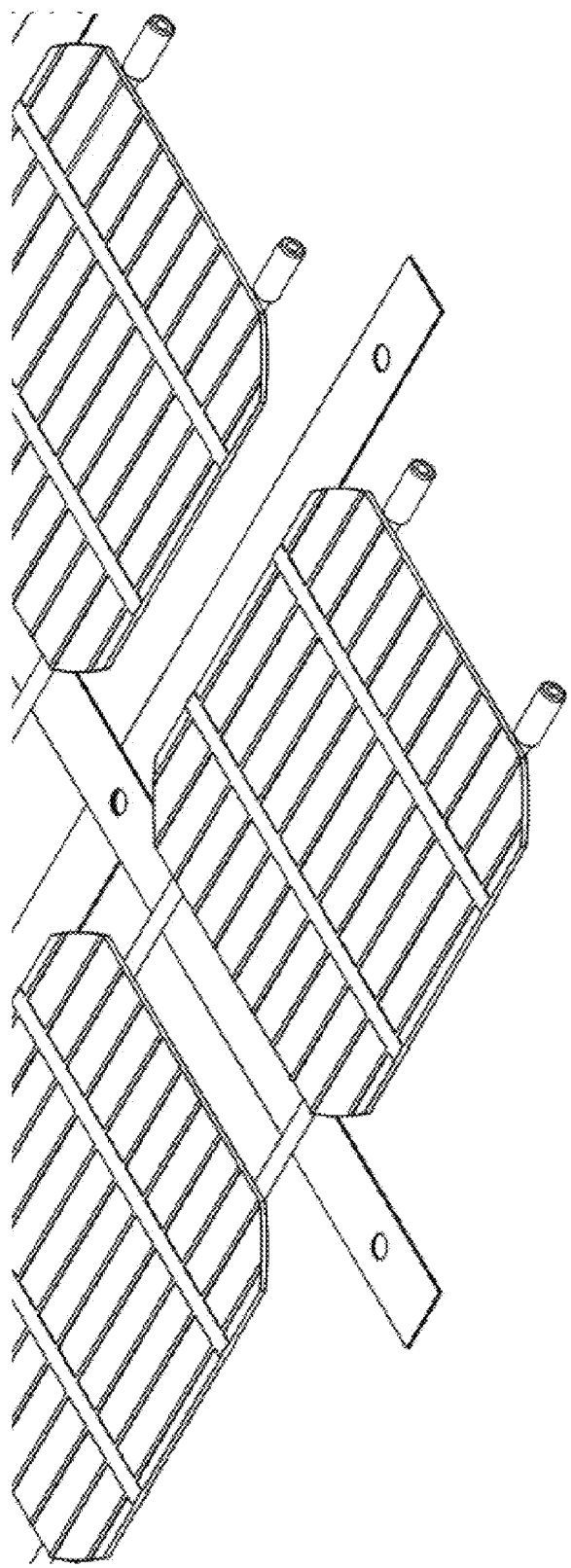
FIG. 32 illustrates a top left front detail perspective view of a preferred exemplary invention embodiment implementing solar collection strips (SCS) combined in an anti-symmetrical alignment pattern into a solar collection panel (SCP)
Figure 33:
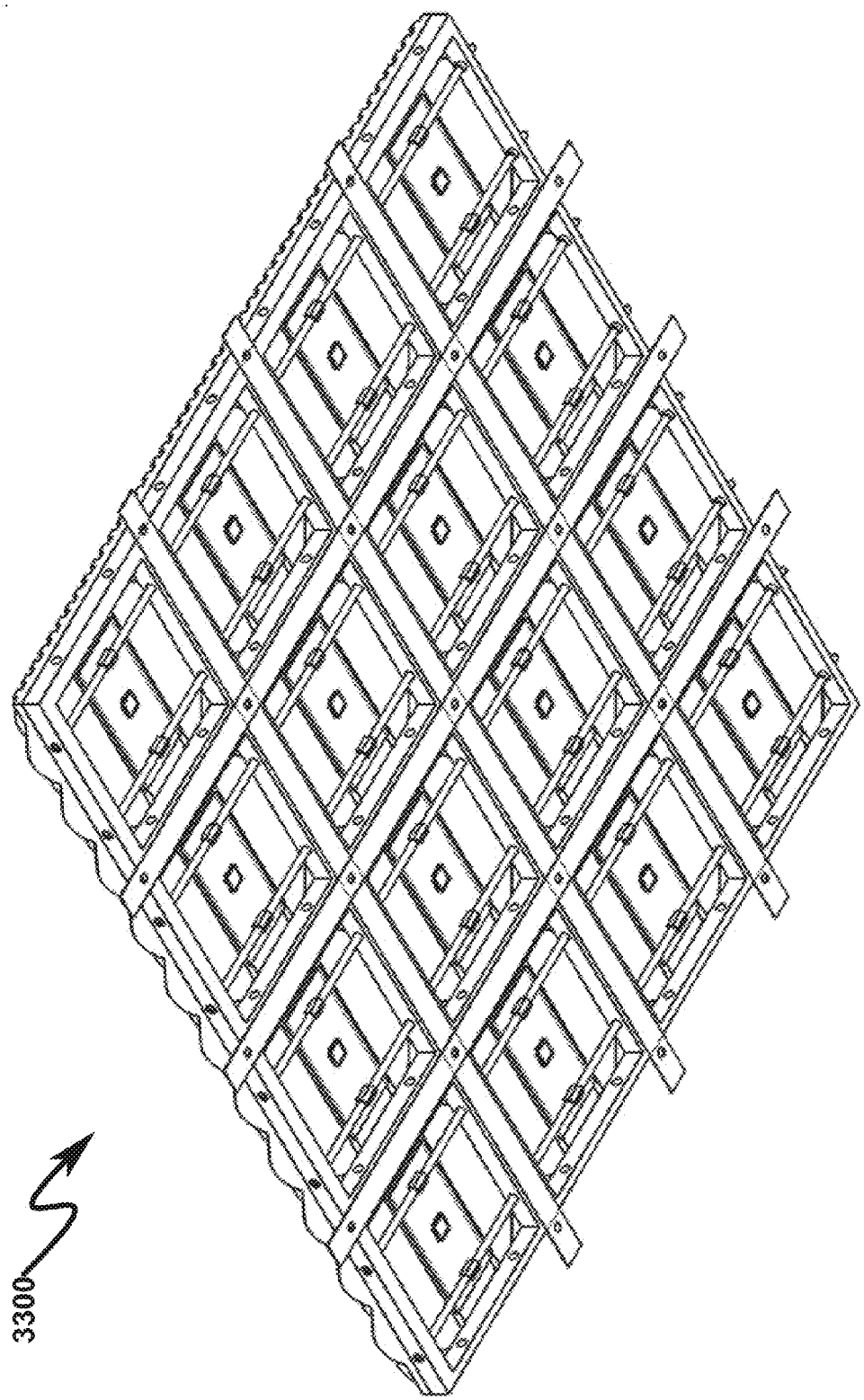
FIG. 33 illustrates a bottom right front perspective view of a preferred exemplary invention embodiment implementing solar collection strips (SCS) combined in an anti-symmetrical alignment pattern into a solar collection panel (SCP)
Figure 34:
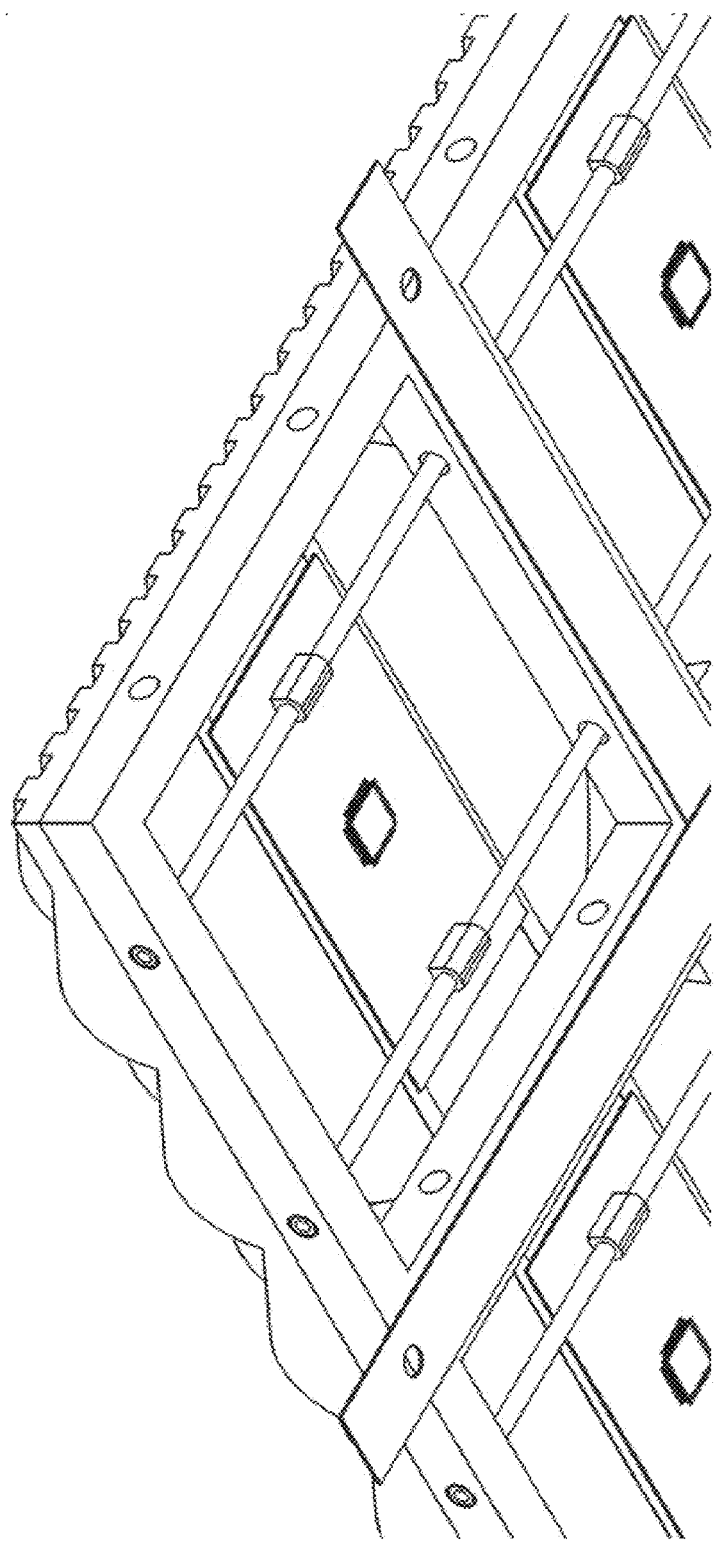
FIG. 34 illustrates a bottom right front detail perspective view of a preferred exemplary invention embodiment implementing solar collection strips (SCS) combined in an anti-symmetrical alignment pattern into a solar collection panel (SCP)
Figure 35:
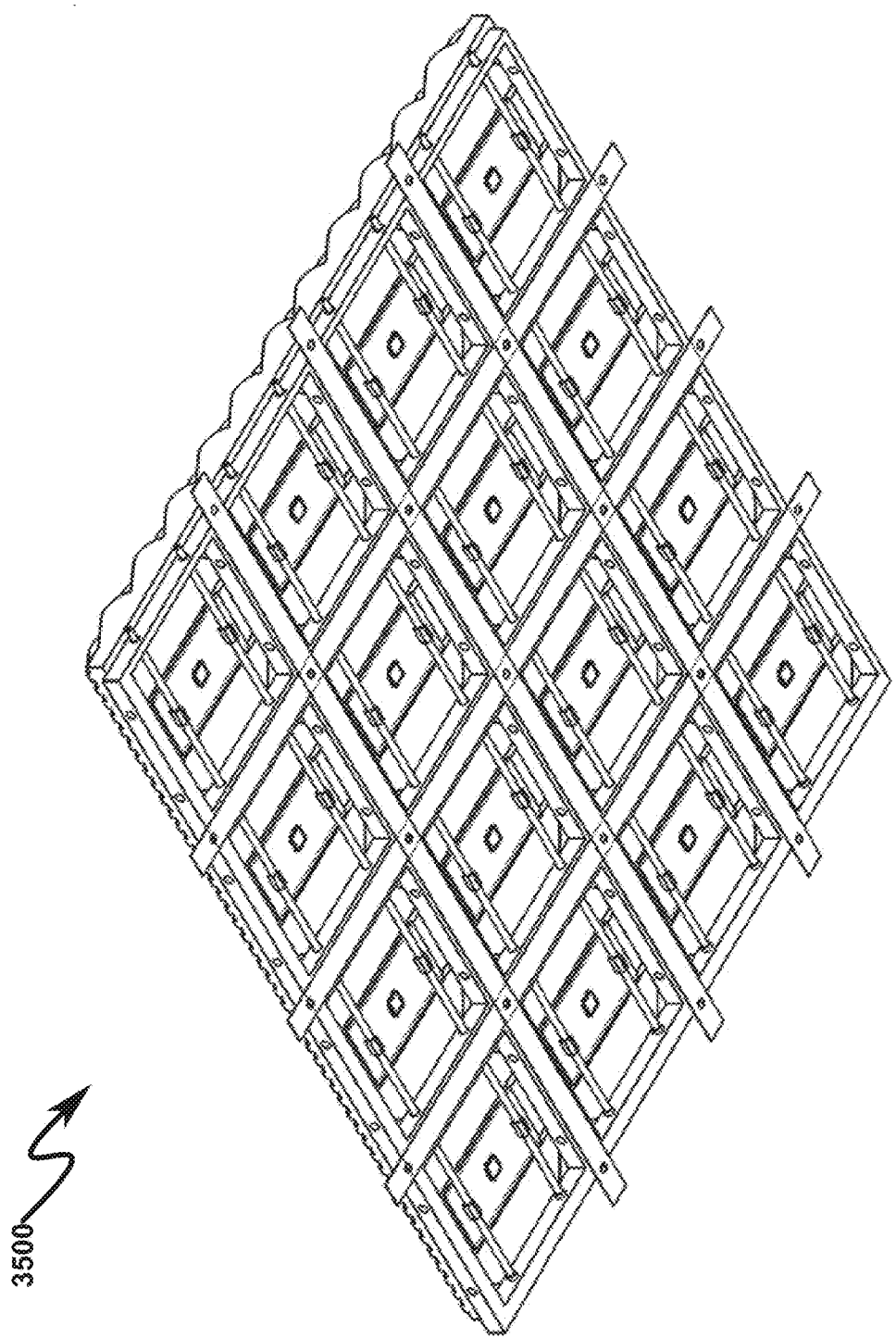
FIG. 35 illustrates a bottom right rear perspective view of a preferred exemplary invention embodiment implementing solar collection strips (SCS) combined in an anti-symmetrical alignment pattern into a solar collection panel (SCP)
Figure 36:
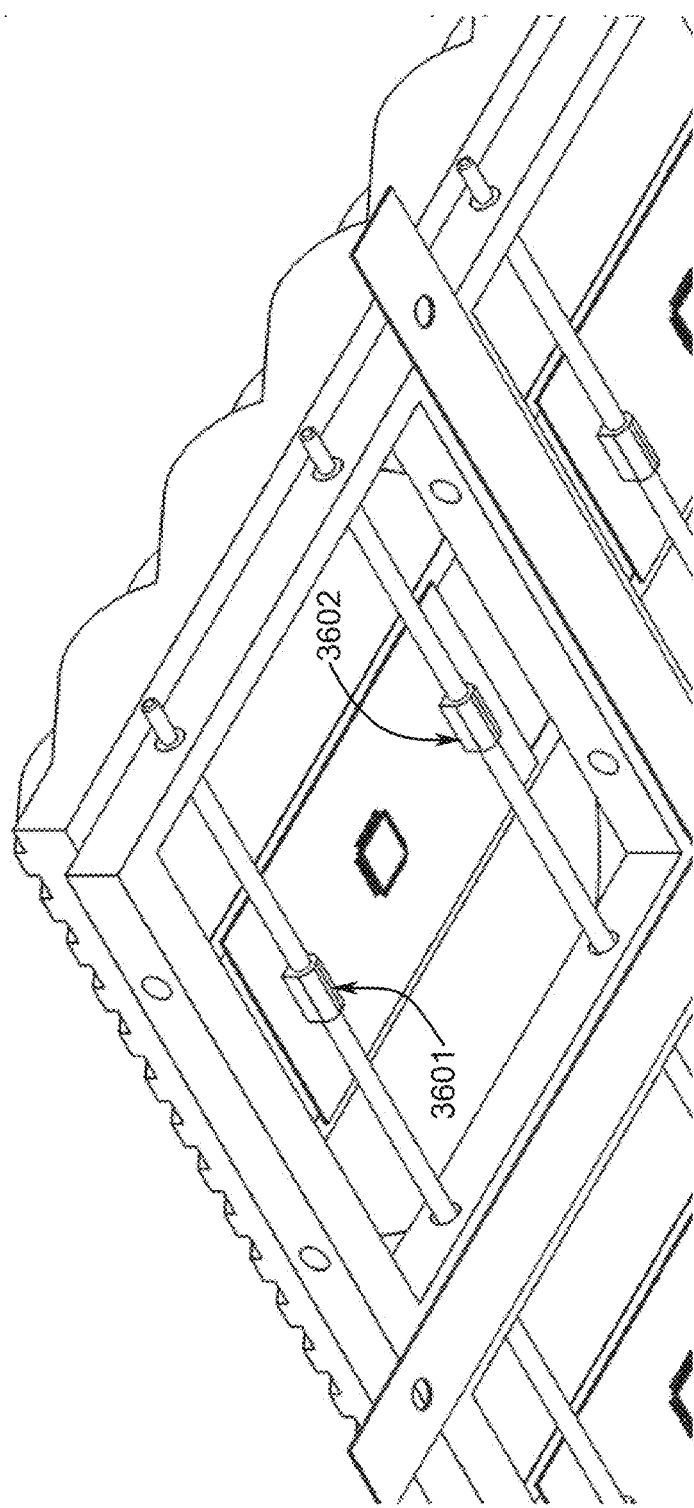
FIG. 36 illustrates a bottom right rear detail perspective view of a preferred exemplary invention embodiment implementing solar collection strips (SCS) combined in an anti-symmetrical alignment pattern into a solar collection panel (SCP)
Figure 37:
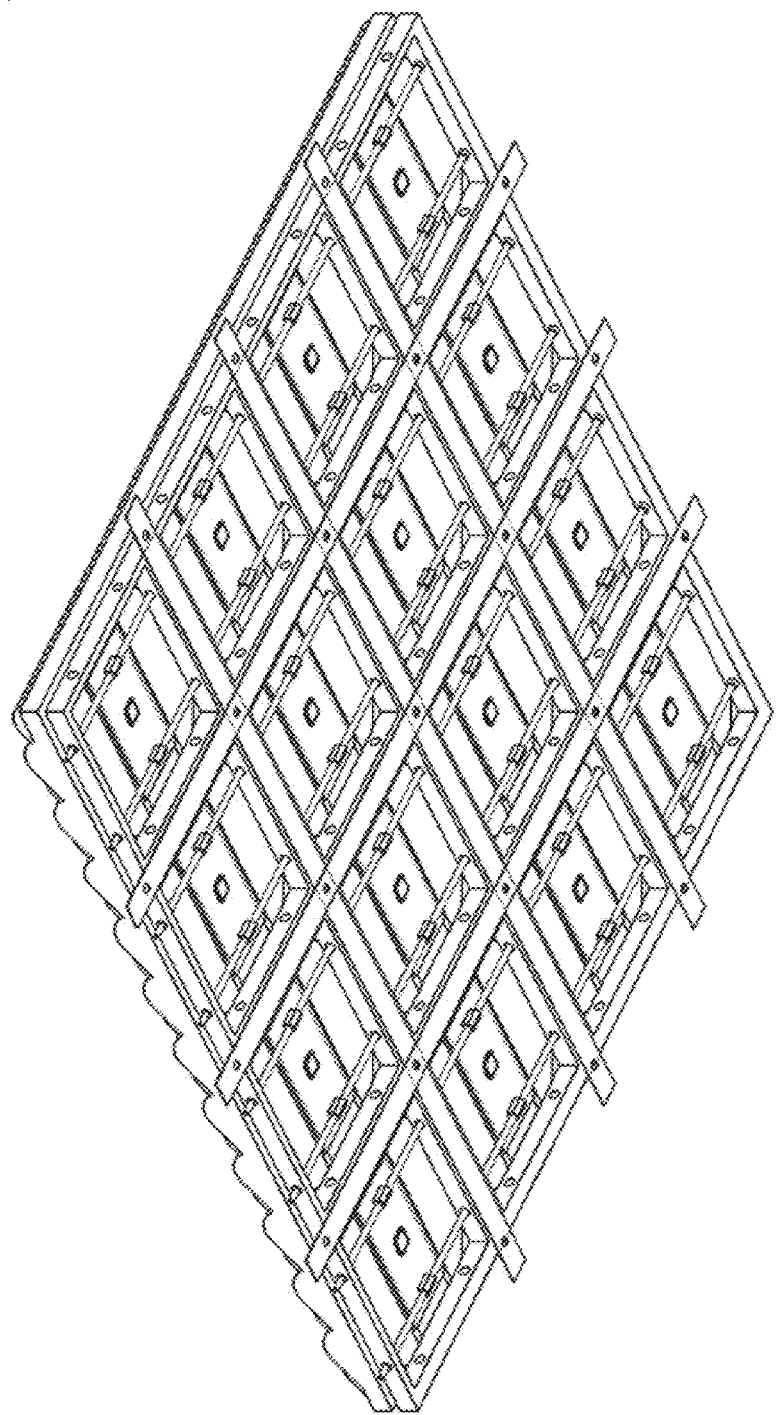
FIG. 37 illustrates a bottom left rear perspective view of a preferred exemplary invention embodiment implementing solar collection strips (SCS) combined in an anti-symmetrical alignment pattern into a solar collection panel (SCP)
Figure 38:
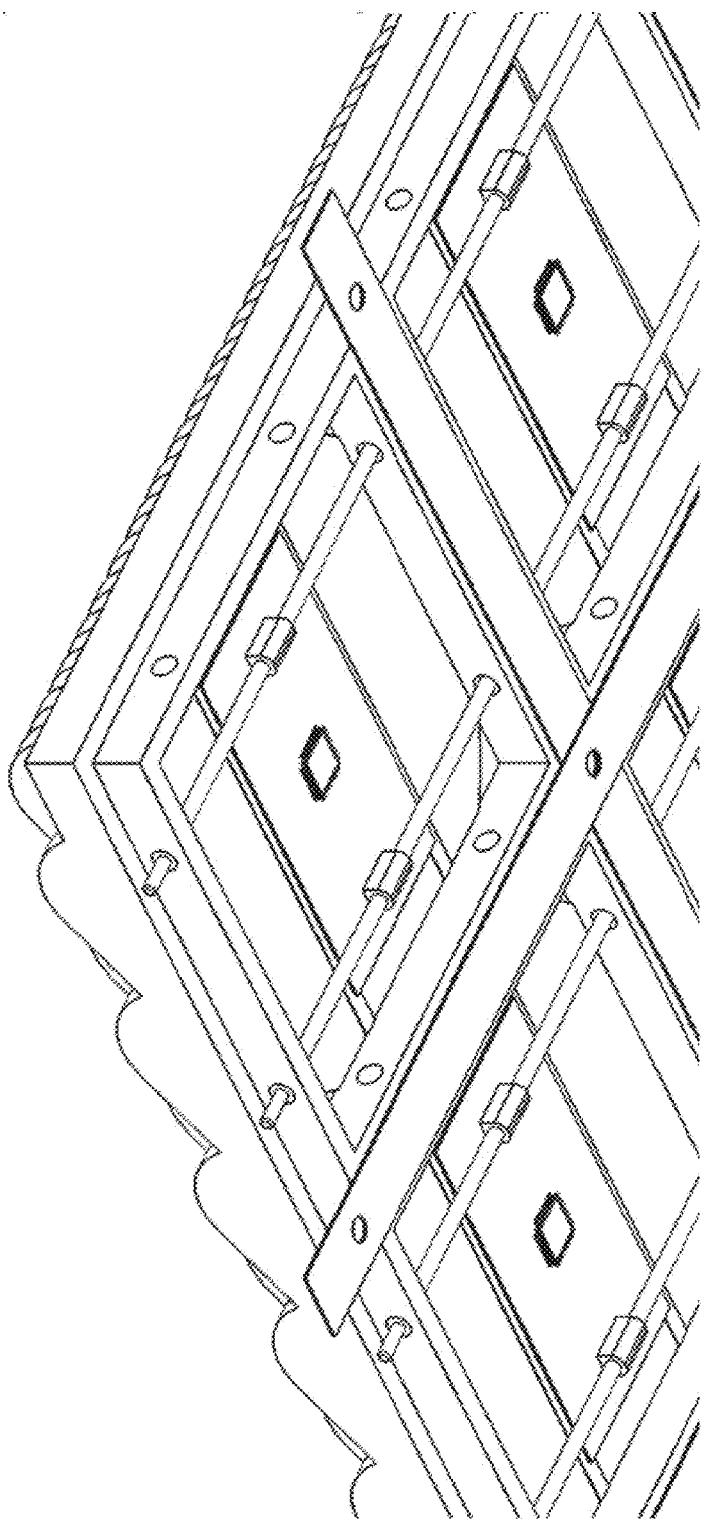
FIG. 38 illustrates a bottom left rear detail perspective view of a preferred exemplary invention embodiment implementing solar collection strips (SCS) combined in an anti-symmetrical alignment pattern into a solar collection panel (SCP)
Figure 39:
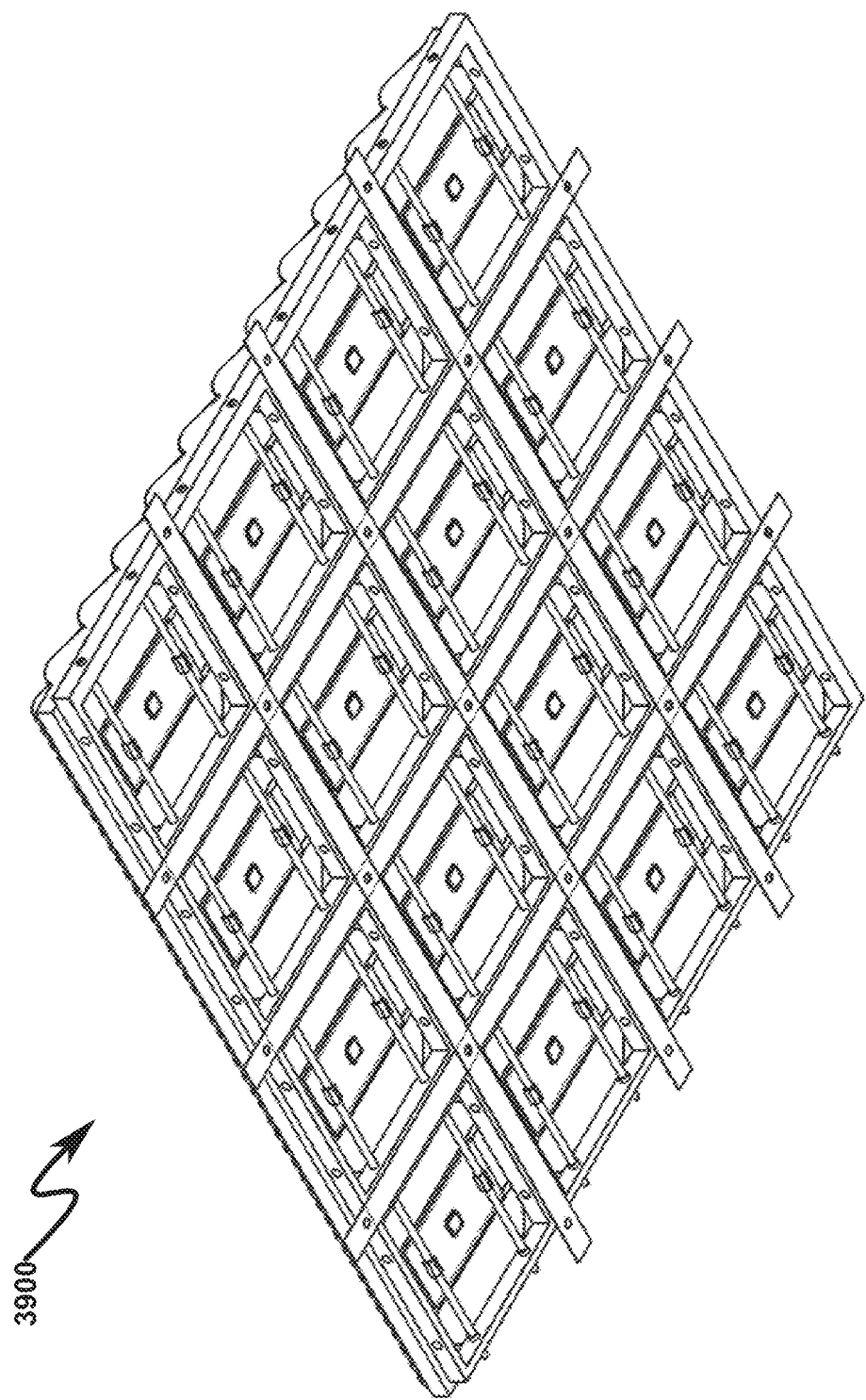
FIG. 39 illustrates a bottom left front perspective view of a preferred exemplary invention embodiment implementing solar collection strips (SCS) combined in an anti-symmetrical alignment pattern into a solar collection panel (SCP)
Figure 40:
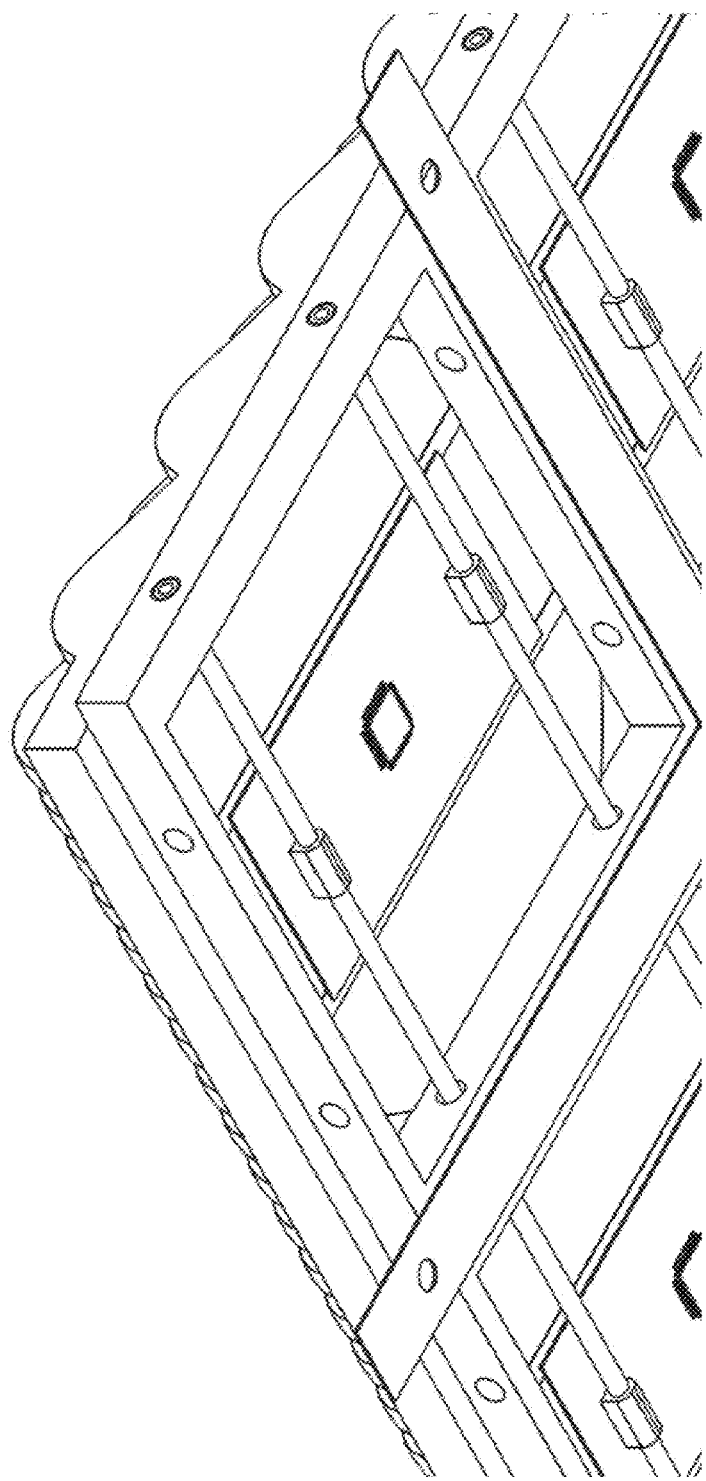
FIG. 40 illustrates a bottom left front detail perspective view of a preferred exemplary invention embodiment implementing solar collection strips (SCS) combined in an anti-symmetrical alignment pattern into a solar collection panel (SCP)
Figure 41:
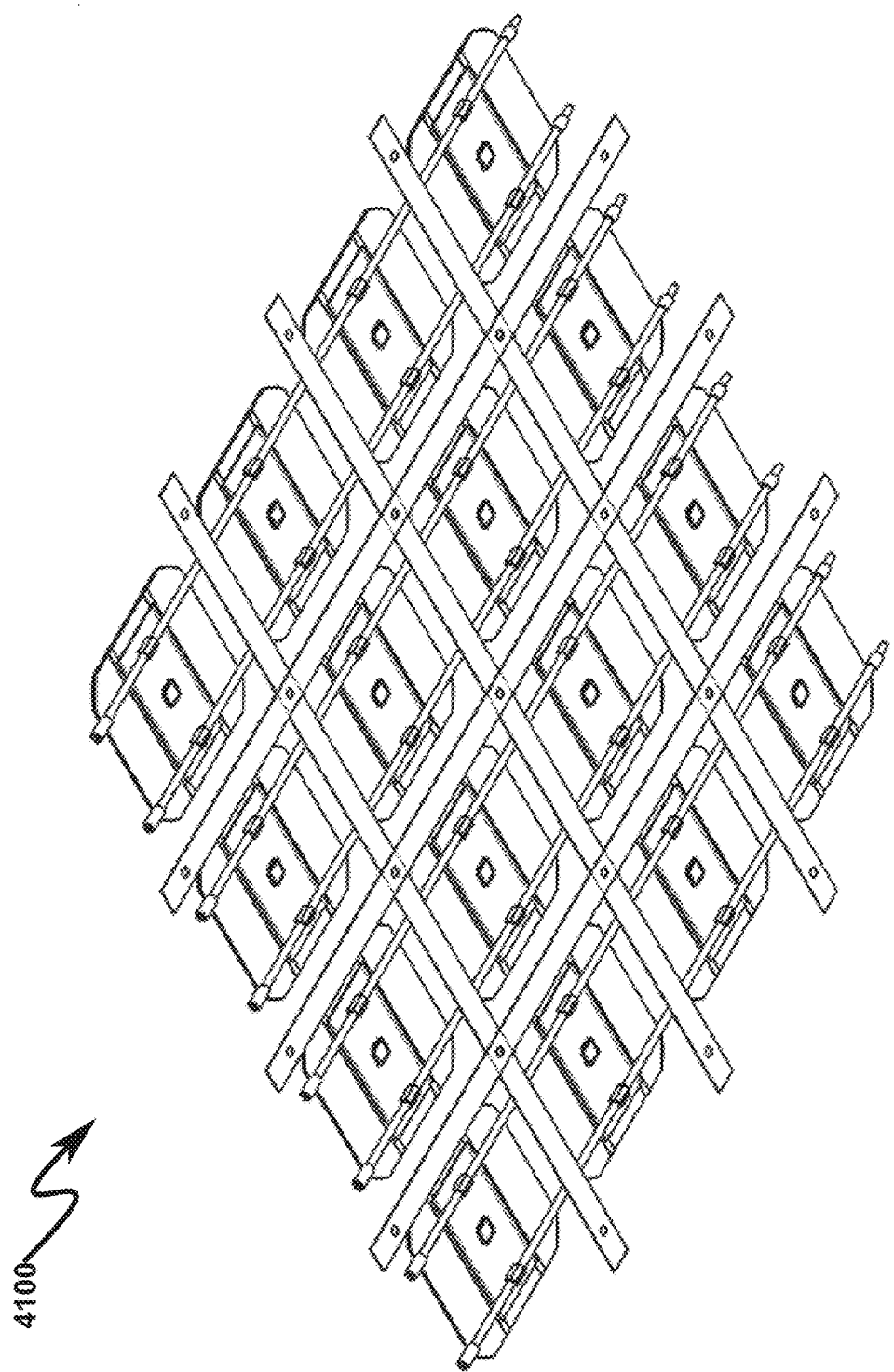
FIG. 41 illustrates a bottom right front perspective view of a preferred exemplary invention embodiment implementing solar collection strips (SCS) (hidden in this view) combined in an anti-symmetrical alignment pattern into a solar collection panel (SCP)
Figure 42:
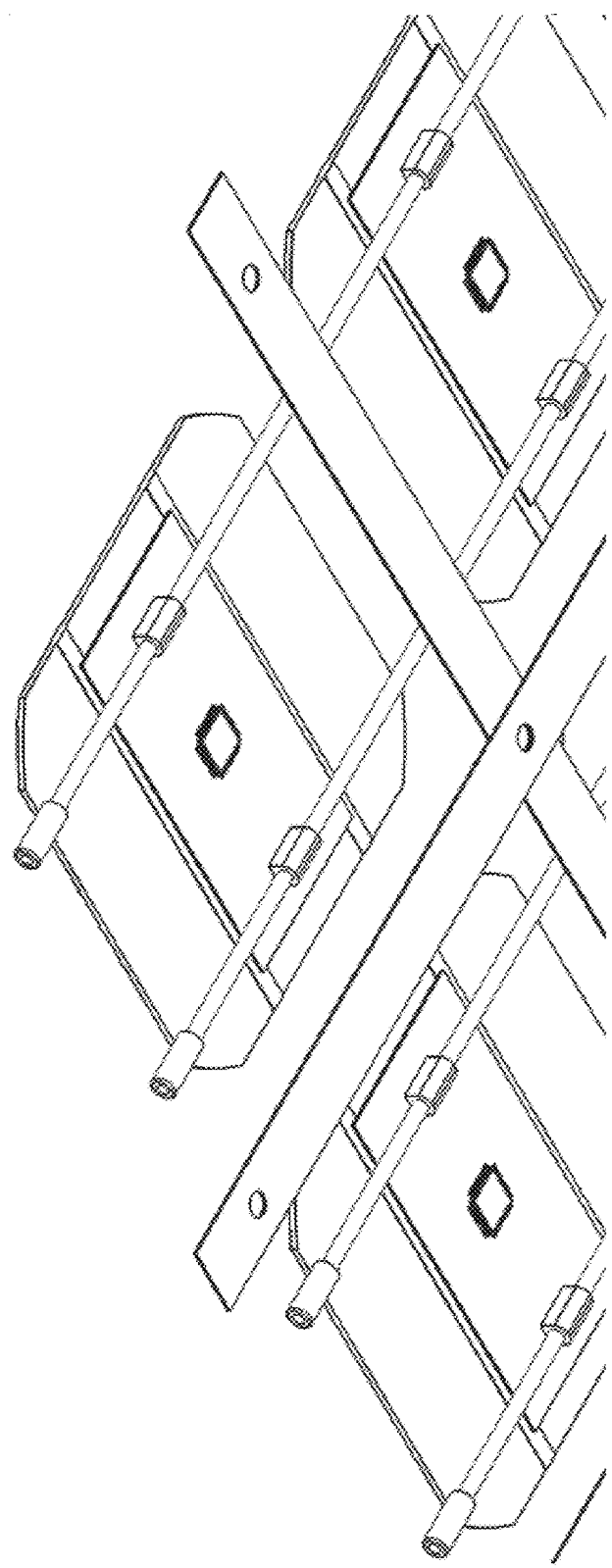
FIG. 42 illustrates a bottom right front detail perspective view of a preferred exemplary invention embodiment implementing solar collection strips (SCS) (hidden in this view) combined in an anti-symmetrical alignment pattern into a solar collection panel (SCP)
Figure 43:
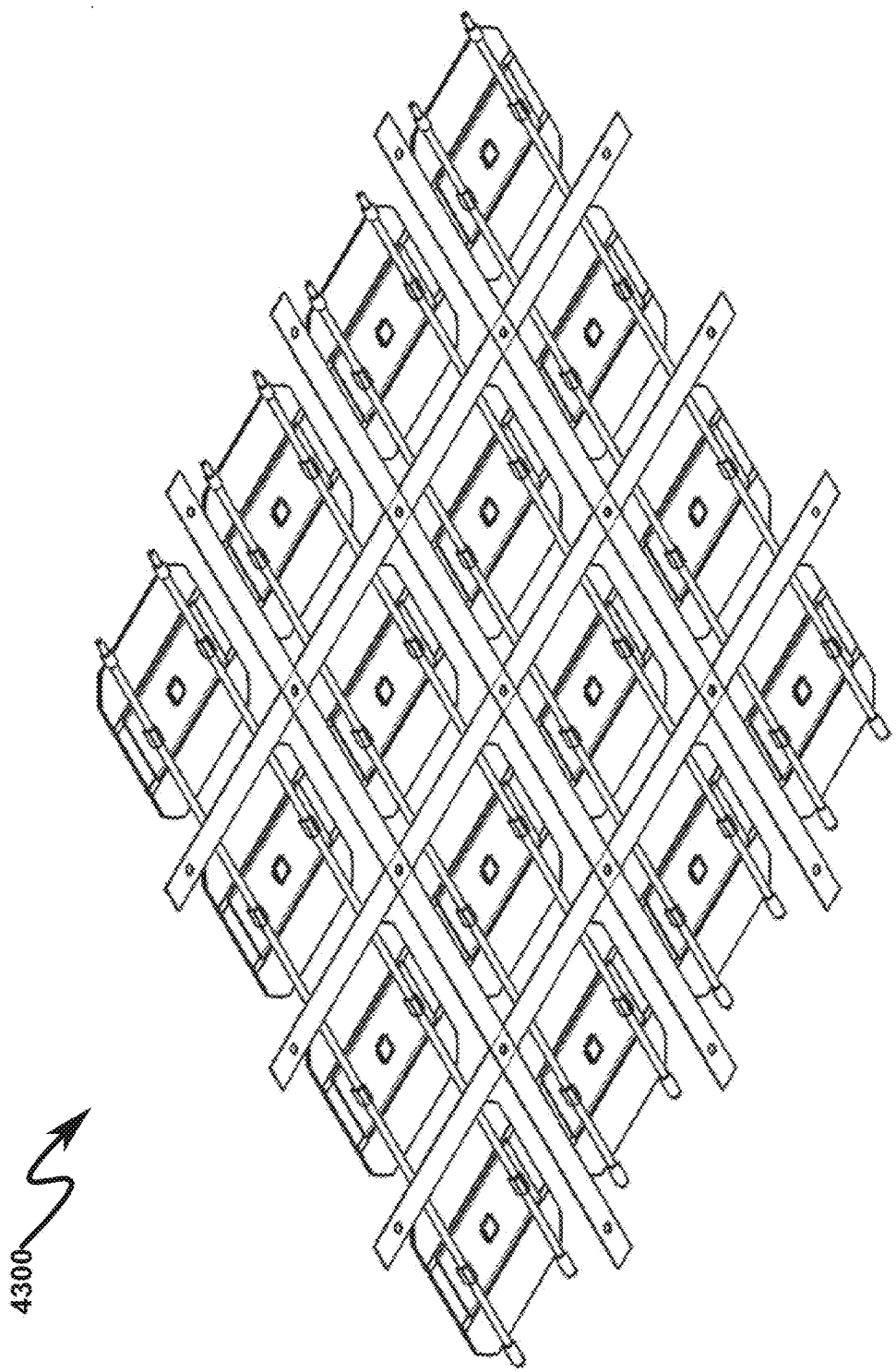
FIG. 43 illustrates a bottom right rear perspective view of a preferred exemplary invention embodiment implementing solar collection strips (SCS) (hidden in this view) combined in an anti-symmetrical alignment pattern into a solar collection panel (SCP)
Figure 44:
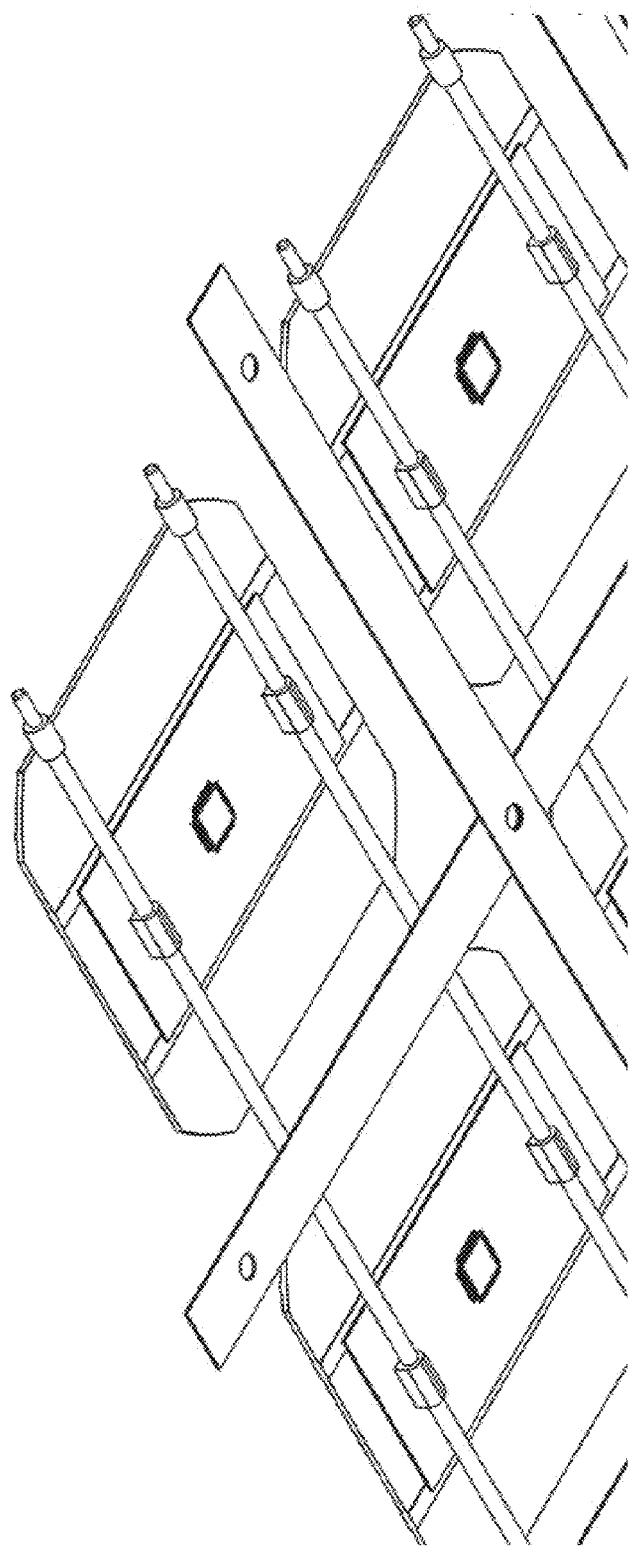
FIG. 44 illustrates a bottom right rear detail perspective view of a preferred exemplary invention embodiment implementing solar collection strips (SCS) (hidden in this view) combined in an anti-symmetrical alignment pattern into a solar collection panel (SCP)
Figure 45:
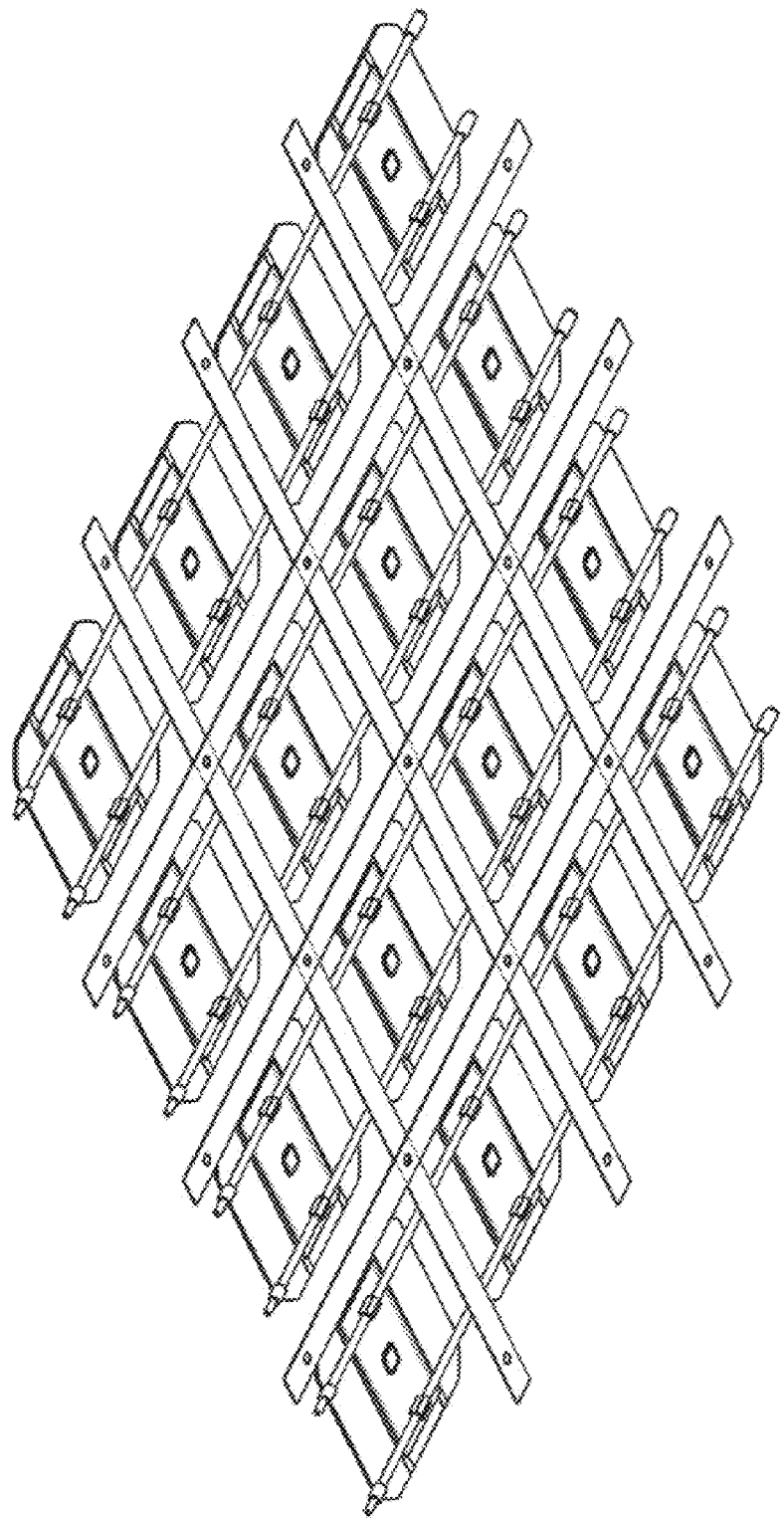
FIG. 45 illustrates a bottom left rear perspective view of a preferred exemplary invention embodiment implementing solar collection strips (SCS) (hidden in this view) combined in an anti-symmetrical alignment pattern into a solar collection panel (SCP)
Figure 46:
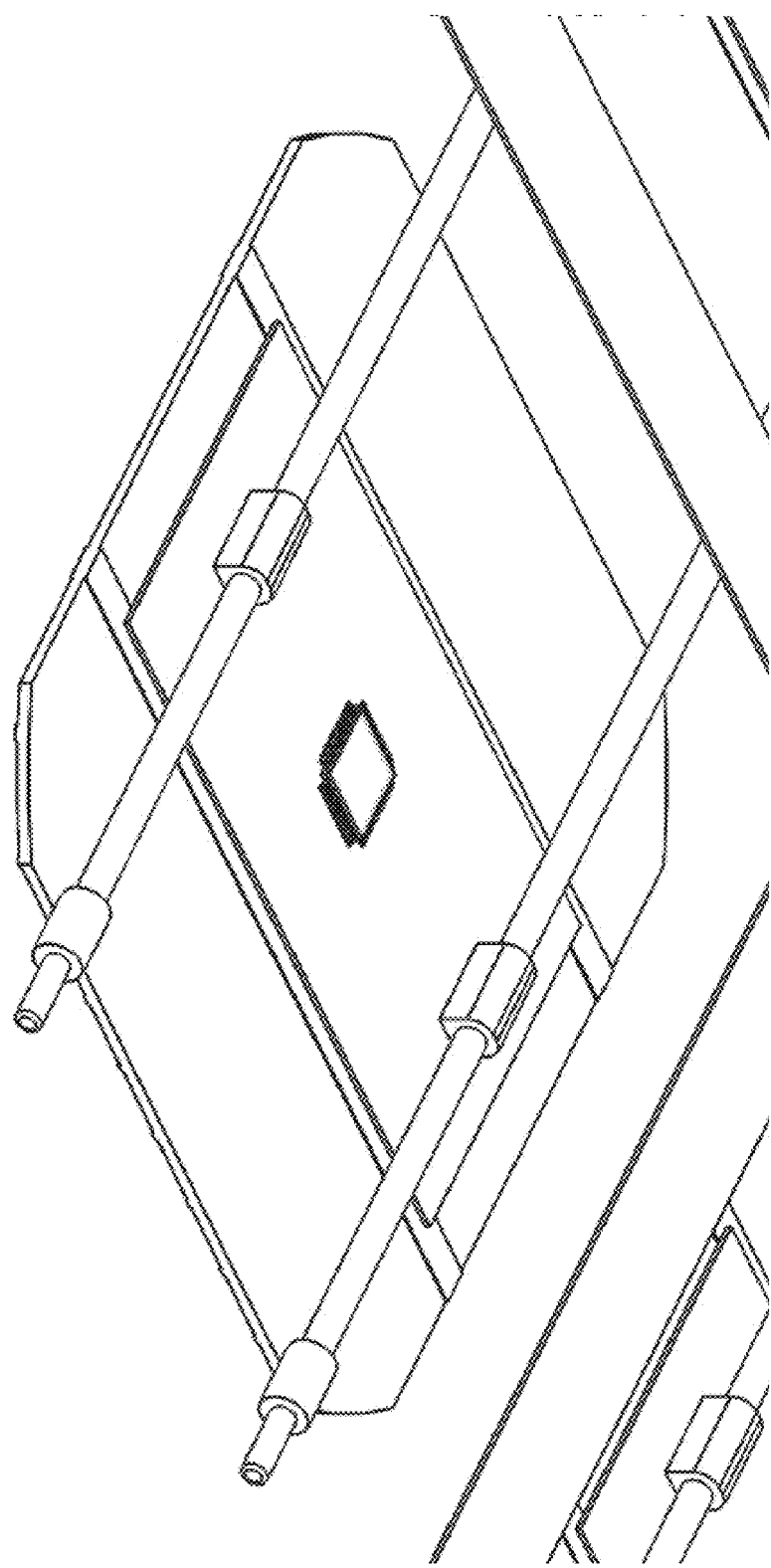
FIG. 46 illustrates a bottom left rear detail perspective view of a preferred exemplary invention embodiment implementing solar collection strips (SCS) (hidden in this view) combined in an anti-symmetrical alignment pattern into a solar collection panel (SCP)
Figure 47:
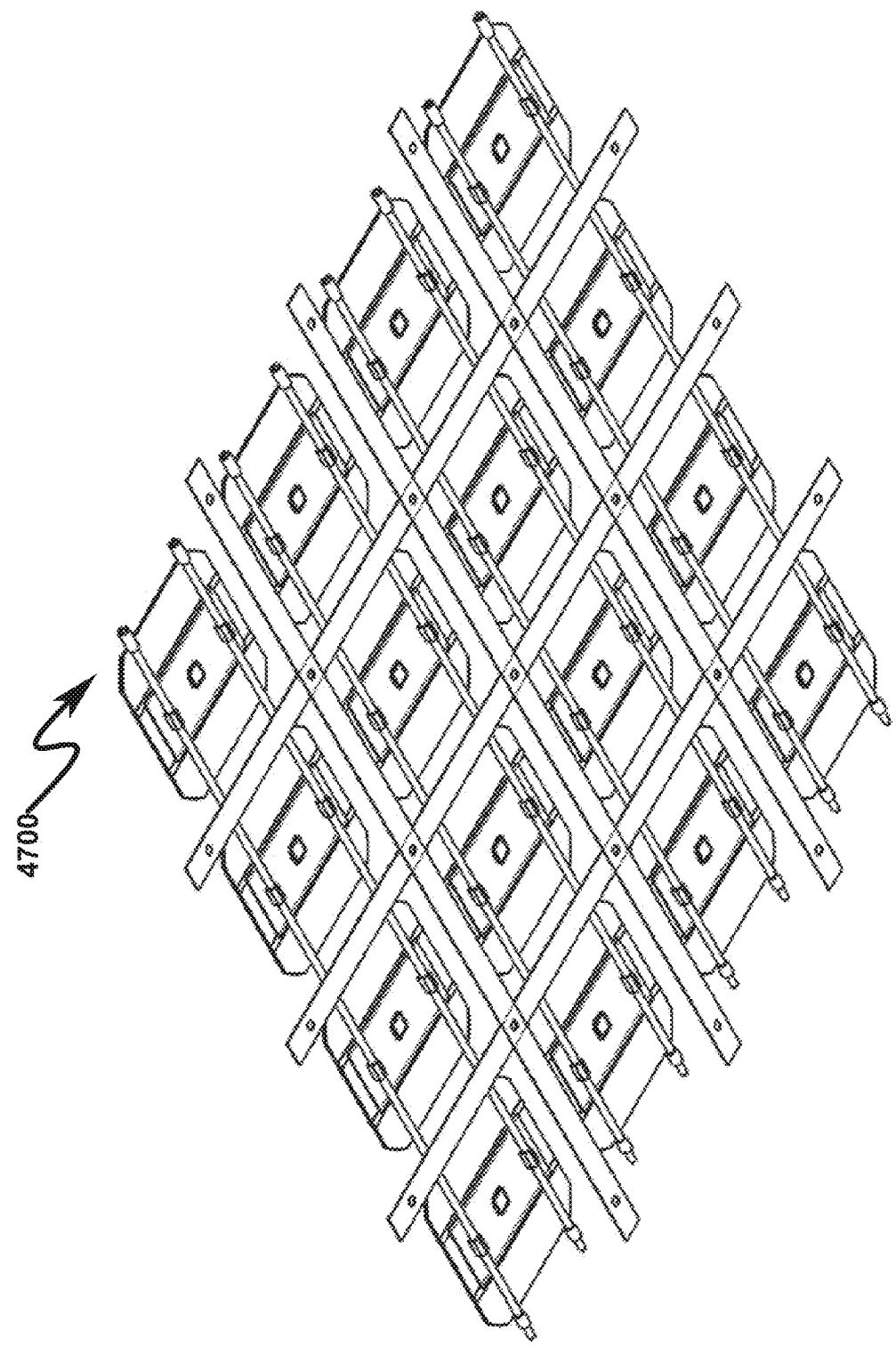
FIG. 47 illustrates a bottom left front perspective view of a preferred exemplary invention embodiment implementing solar collection strips (SCS) (hidden in this view) combined in an anti-symmetrical alignment pattern into a solar collection panel (SCP)
Figure 48:
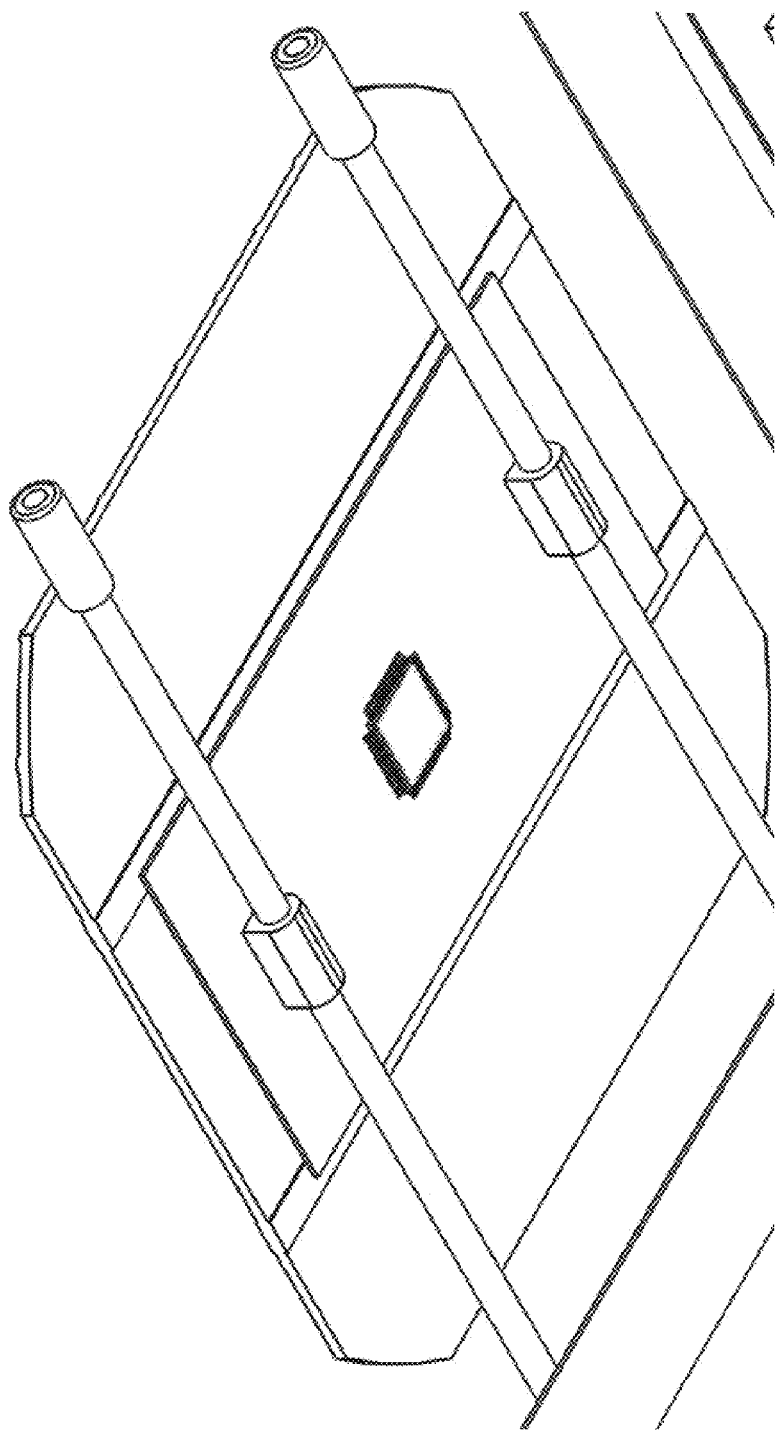
FIG. 48 illustrates a bottom left front detail perspective view of a preferred exemplary invention embodiment implementing solar collection strips (SCS) (hidden in this view) combined in an anti-symmetrical alignment pattern into a solar collection panel (SCP)
Figure 56:
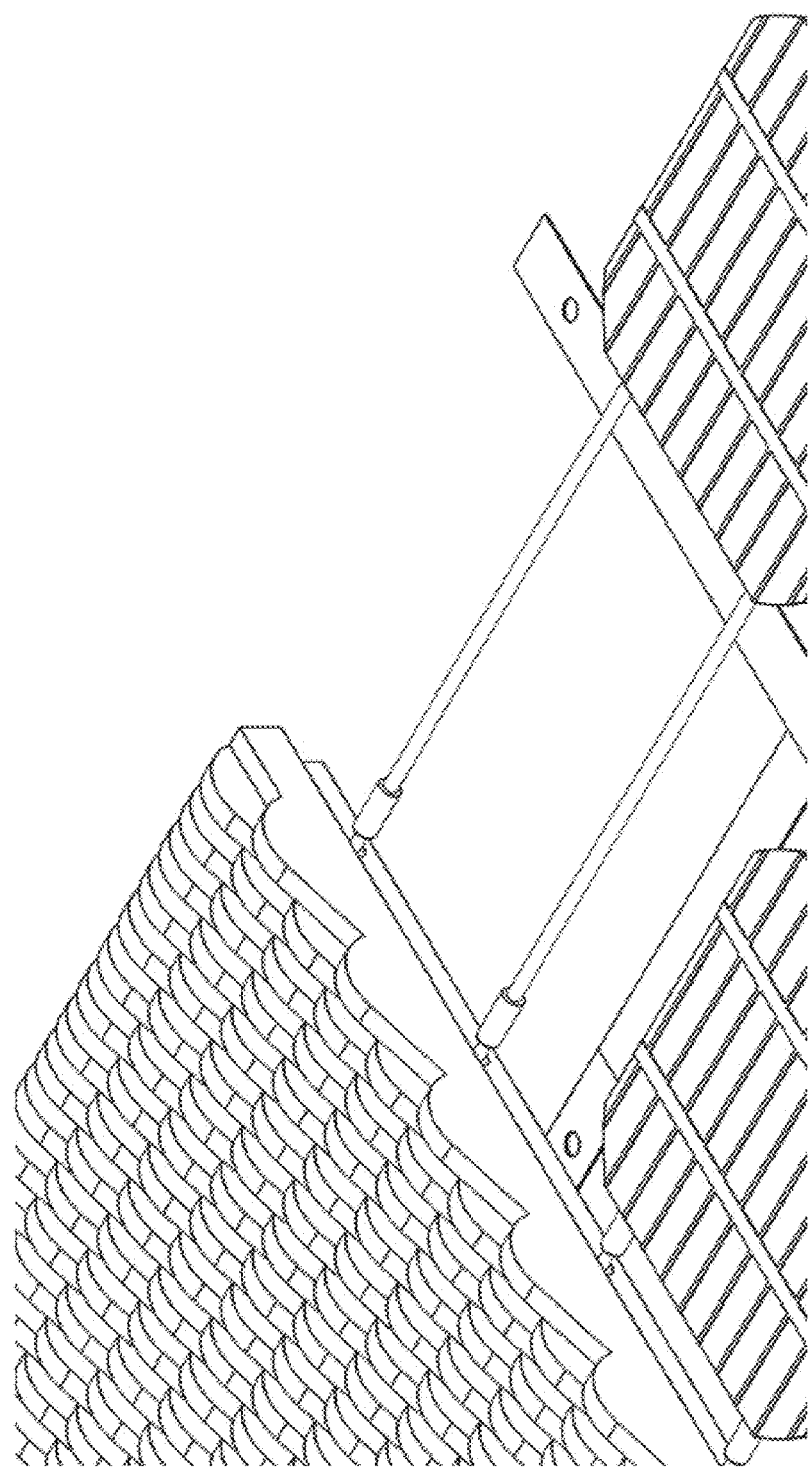
FIG. 56 illustrates a perspective detail view of an array of interconnected SCP panels.

Detailed views of the solar/optical collection panel (SCP) are provided in FIG. 9 (0900)-FIG. 56 (5600). The stacked solar collection strips (SCS) in this preferred exemplary embodiment are provided with nine photovoltaic cell cavities (PCC) into which solar cells and individual micro-converter PCBs are installed. Wiring is fed through the sides of the SCS panel and attached to connectors (3601, 3602) on the PCBs. The wiring provided incorporates integral connector/receptacle combinations at the distal ends to permit each panel to be connected to an adjacent panel or electrical distribution hub if necessary. In large rolled arrays the wiring will in many cases be continuous among a number of panels in the roll.

The micro-converter PCB (1101, 1111, 5501) is designed to directly mate to the rear of the photovoltaic cell and allow generated electricity to flow to a micro-converter integrated circuit (IC) (1102, 1112) that interfaces with the wiring harness (5503, 5504) and connectors (2605, 2606, 2805, 2806, 5505, 5506) within each PCC. In this illustrated embodiment there is a micro-converter PCB (1101, 1111, 5501) for each solar cell. This in some embodiments may be reduced to one micro-converter per SCP.

Straps (2507, 2508, 5507, 5508) are provided to allow a number of SCP panels to be mechanically coupled and allow rolling of the panes on a large cylinder for deployment in long roadway applications. This strapping material provides mechanical coupling between the SCP during deployment and after installation.

While not shown in the diagrams, each PCC may be encapsulated or potted with an electrically insulating material to prevent moisture and other contaminants from reaching the photovoltaic cell, wiring, and/or micro-converter.

Figure 49:
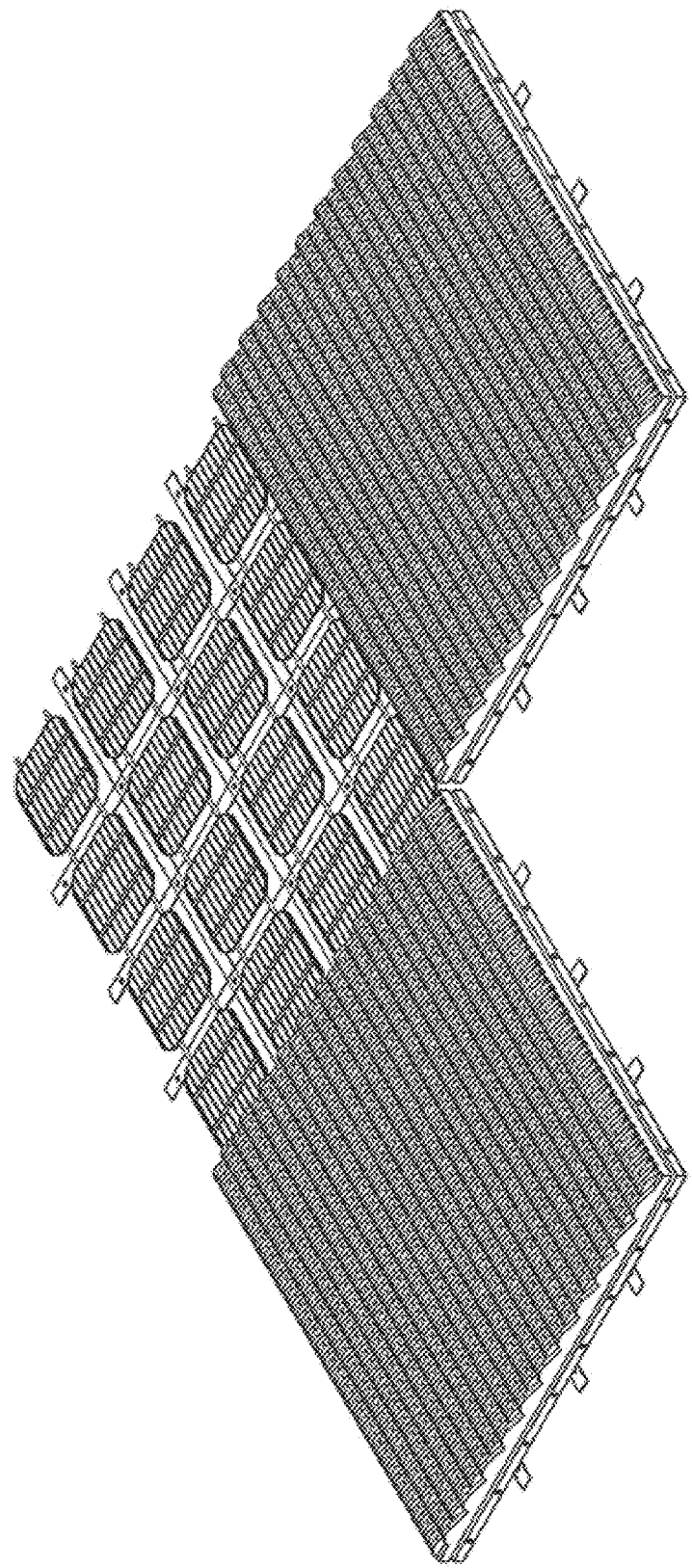
FIG. 49 illustrates a perspective view of an array of interconnected SCP panels.
Figure 50:
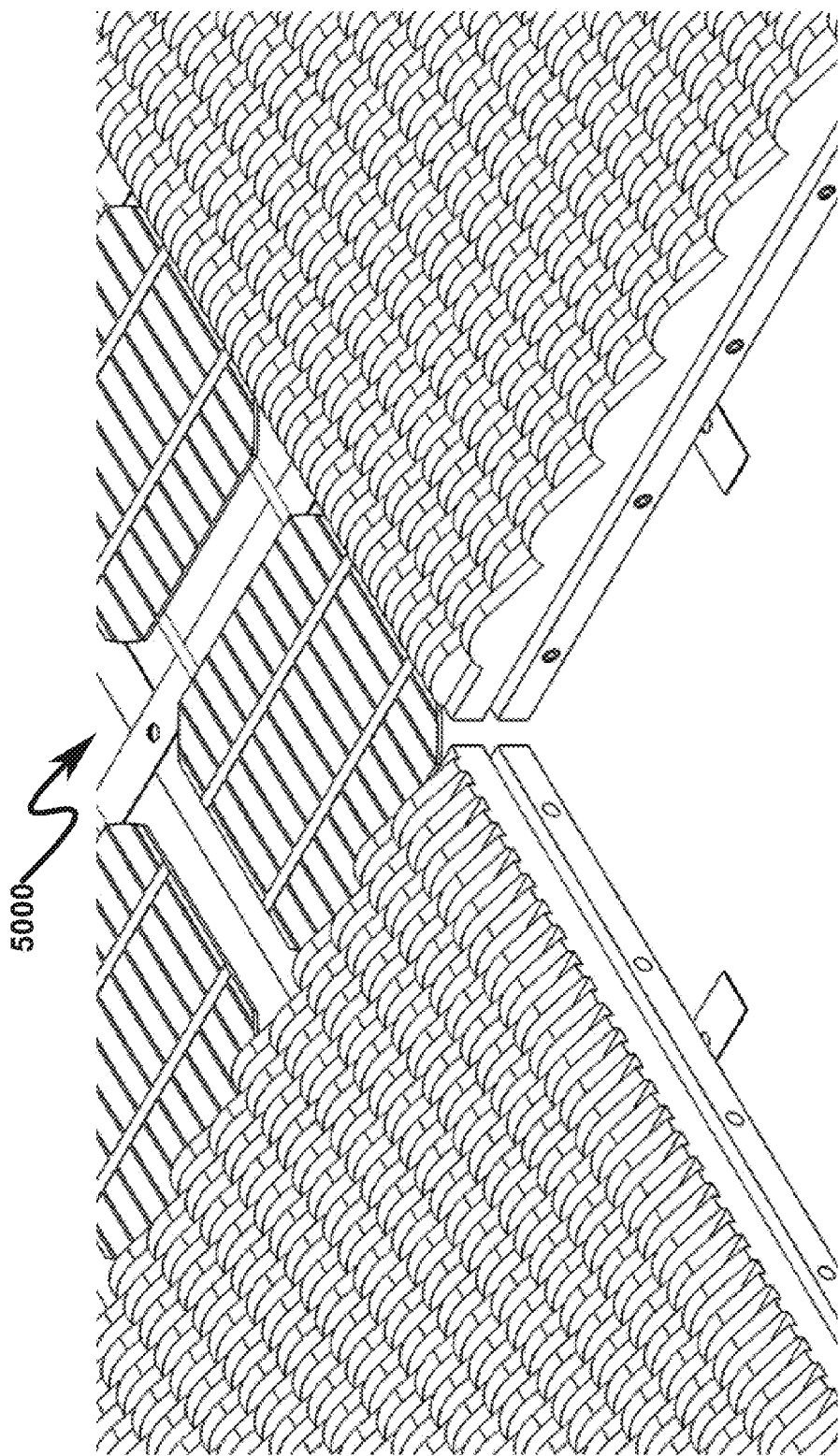
FIG. 50 illustrates a perspective detail view of an array of interconnected SCP panels.
Figure 51:
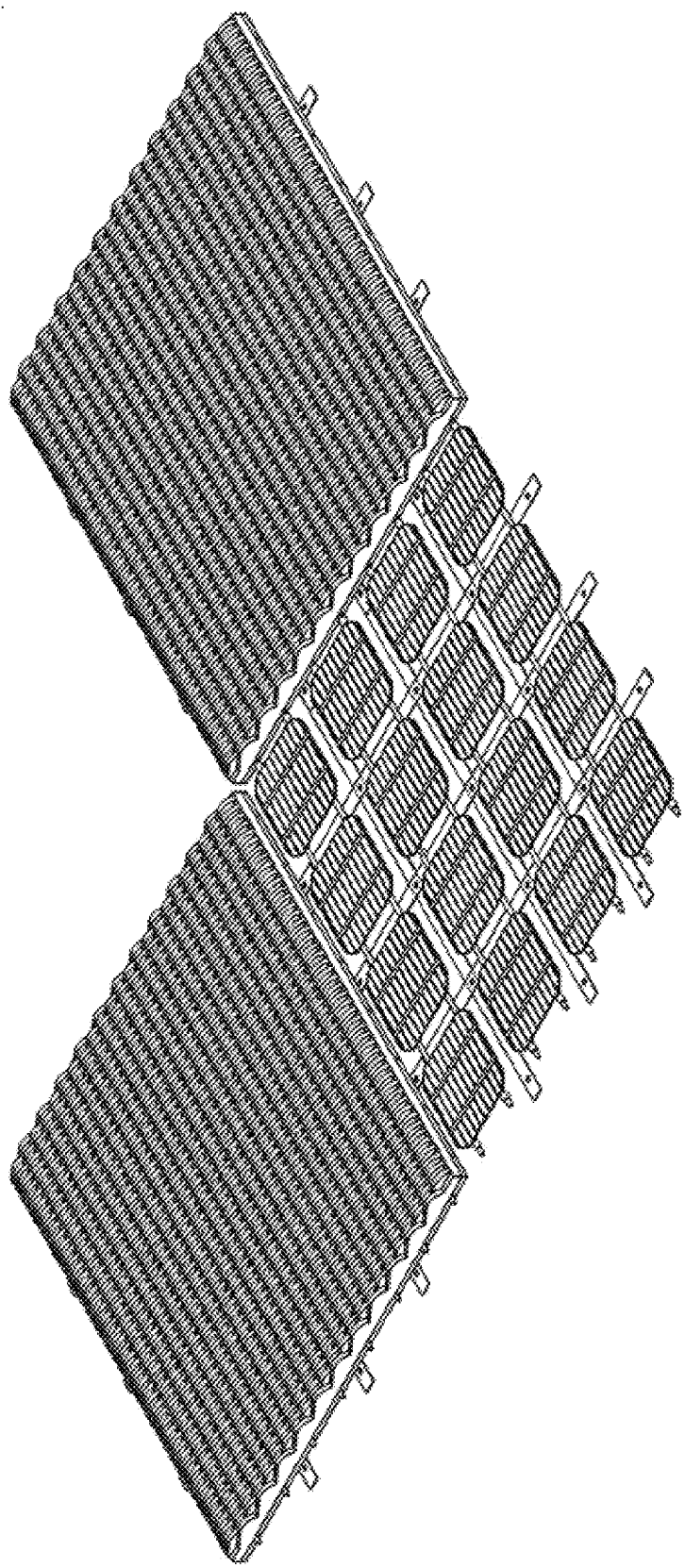
FIG. 51 illustrates a perspective view of an array of interconnected SCP panels.
Figure 52:
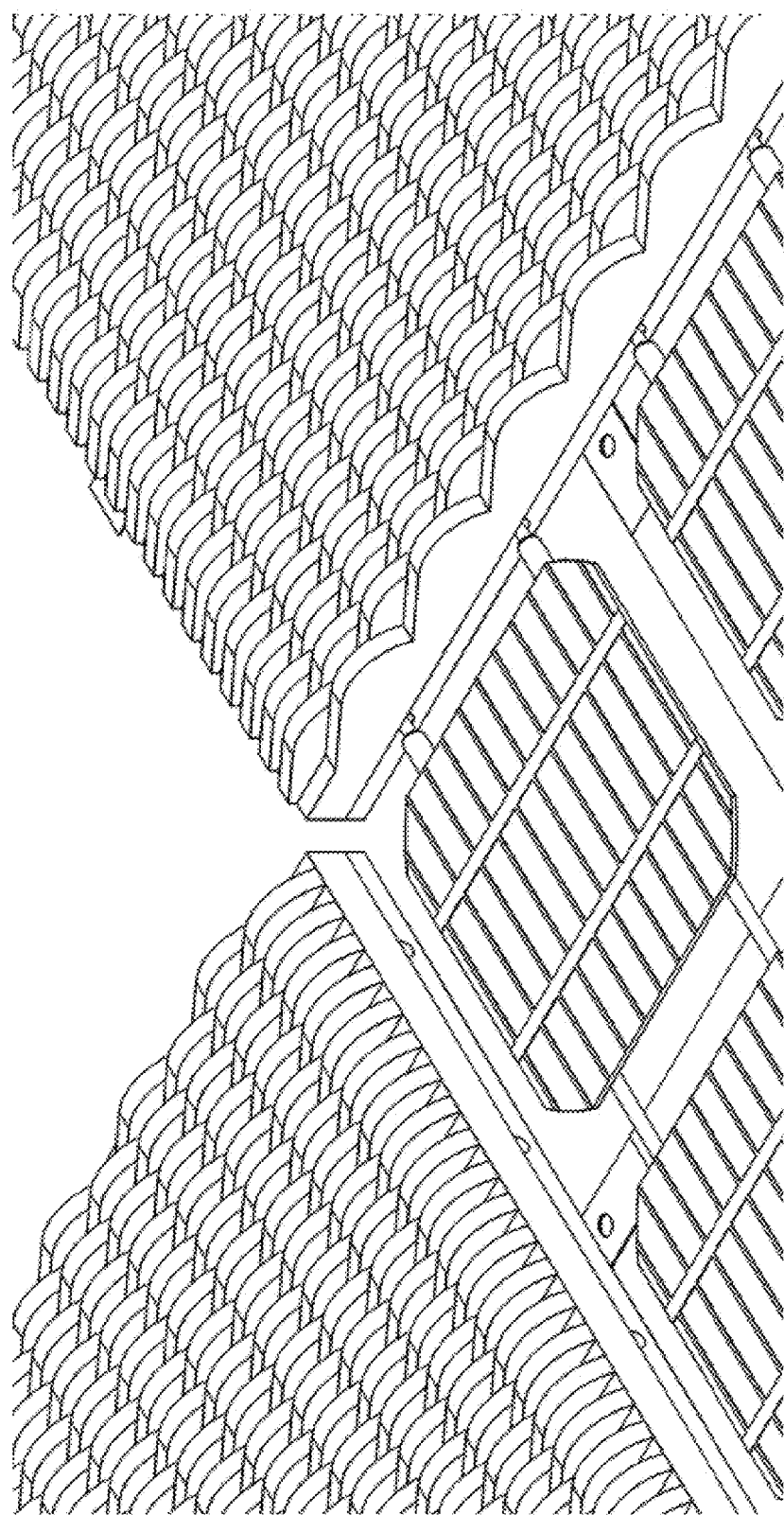
FIG. 52 illustrates a perspective detail view of an array of interconnected SCP panels.
Figure 53:
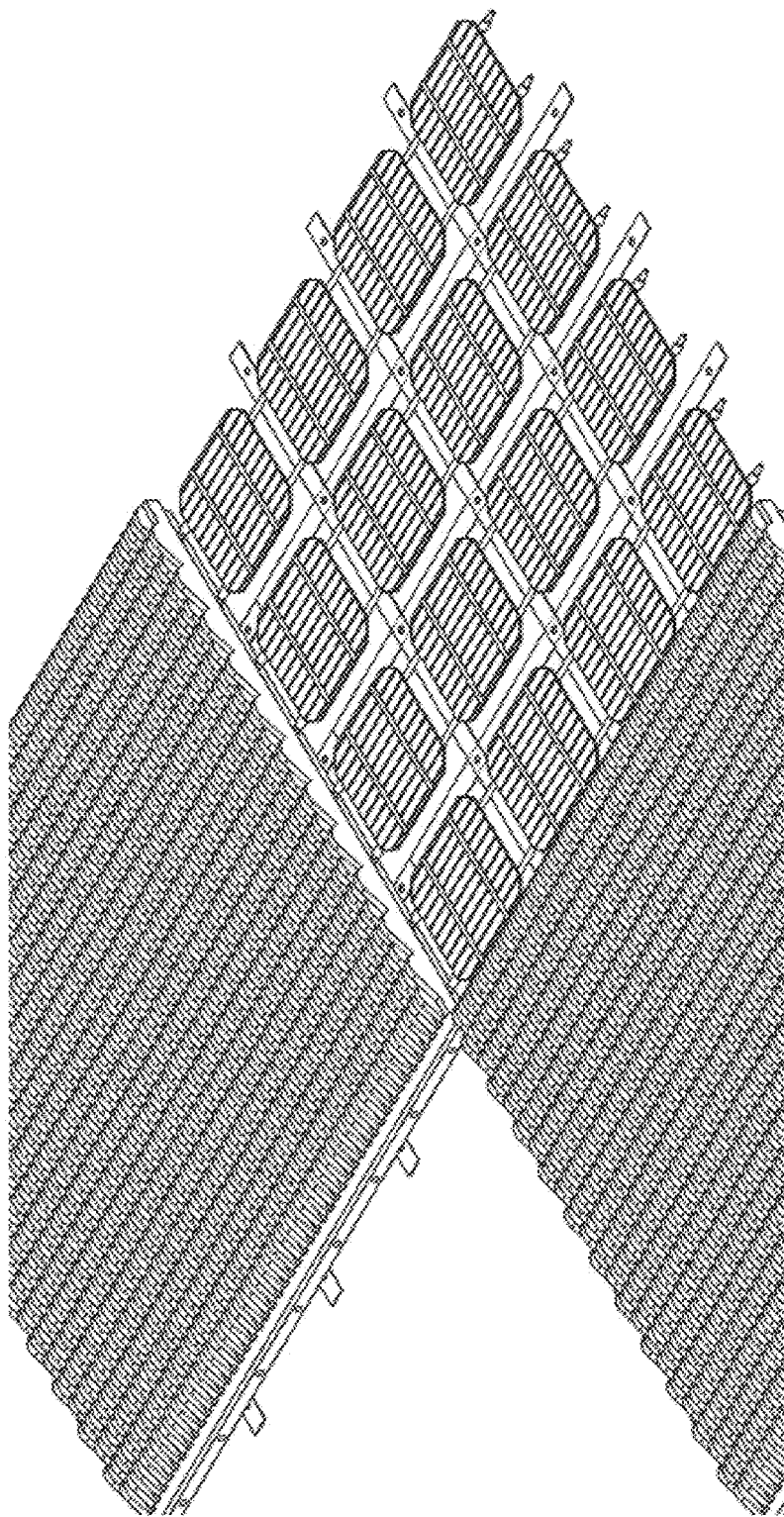
FIG. 53 illustrates a perspective view of an array of interconnected SCP panels.
Figure 54:
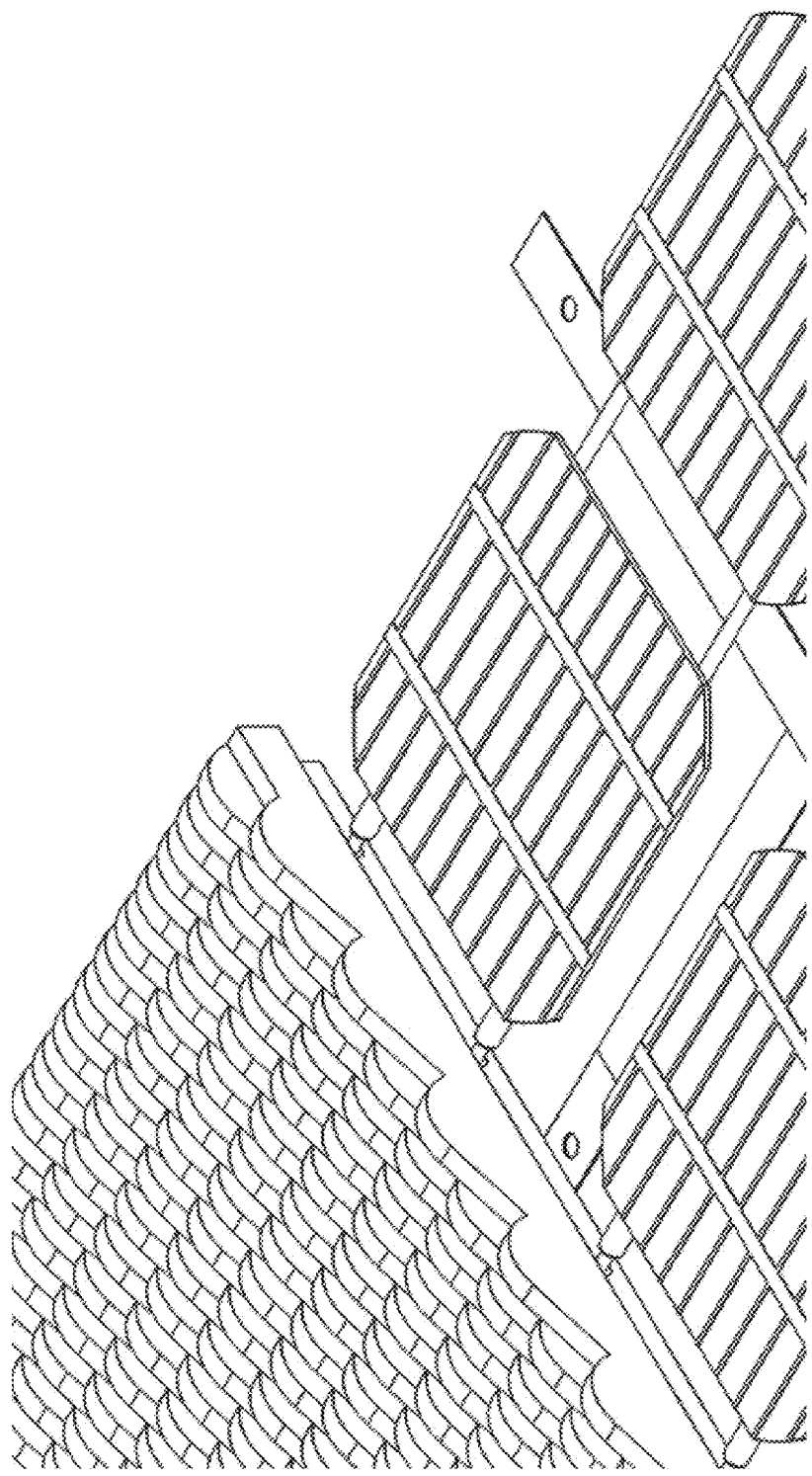
FIG. 54 illustrates a perspective detail view of an array of interconnected SCP panels.
Figure 55:
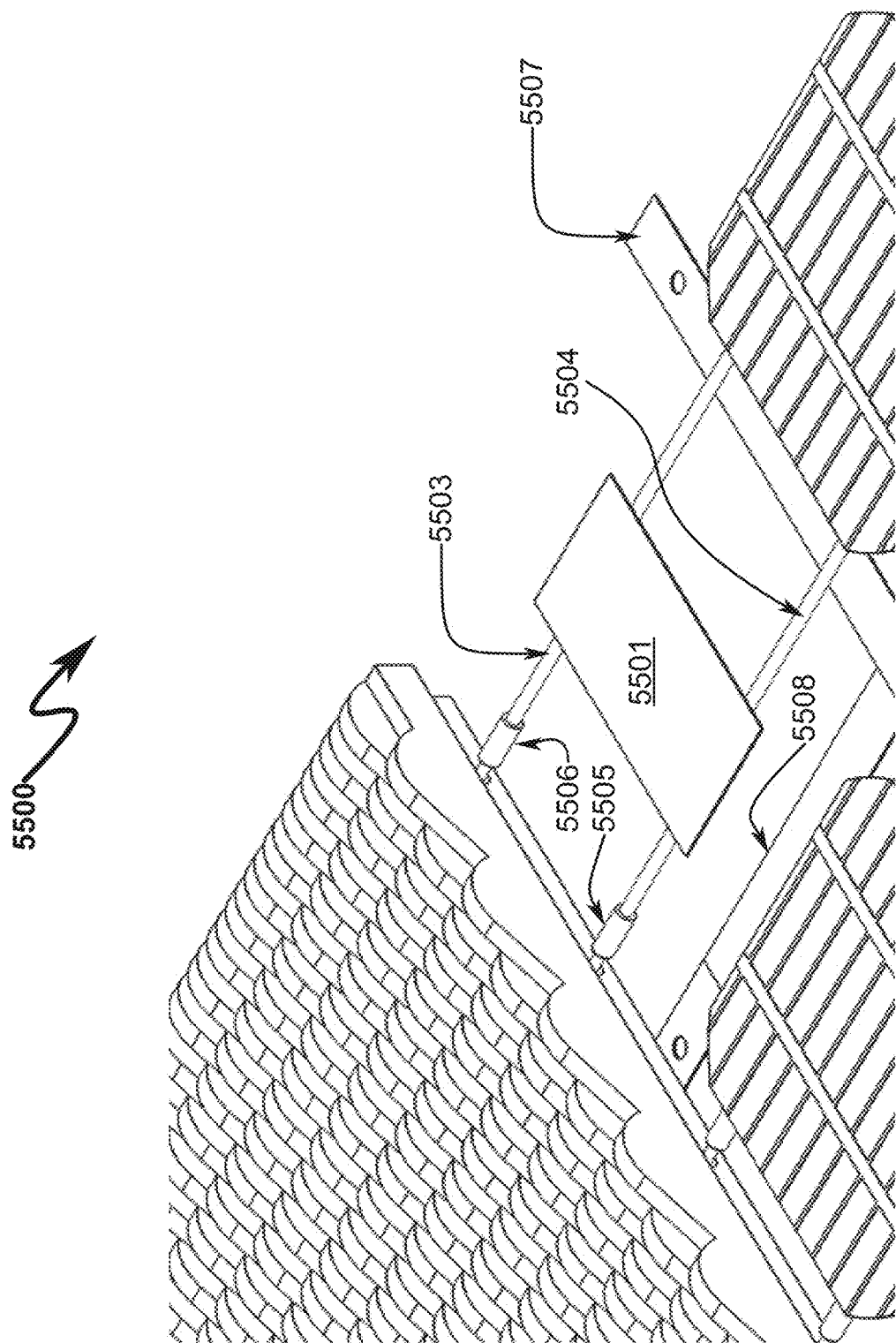
FIG. 55 illustrates a perspective view of an array of interconnected SCP panels.

As depicted in the diagrams depicted in FIG. 49 (4900)-FIG. 56 (5600), each SCP is configured with interlocking edges that overlap to form a tight seal on all four corners of each SCP element that is placed in an array.

SCP Rolled Form (5700)-(6000)

Figure 57:
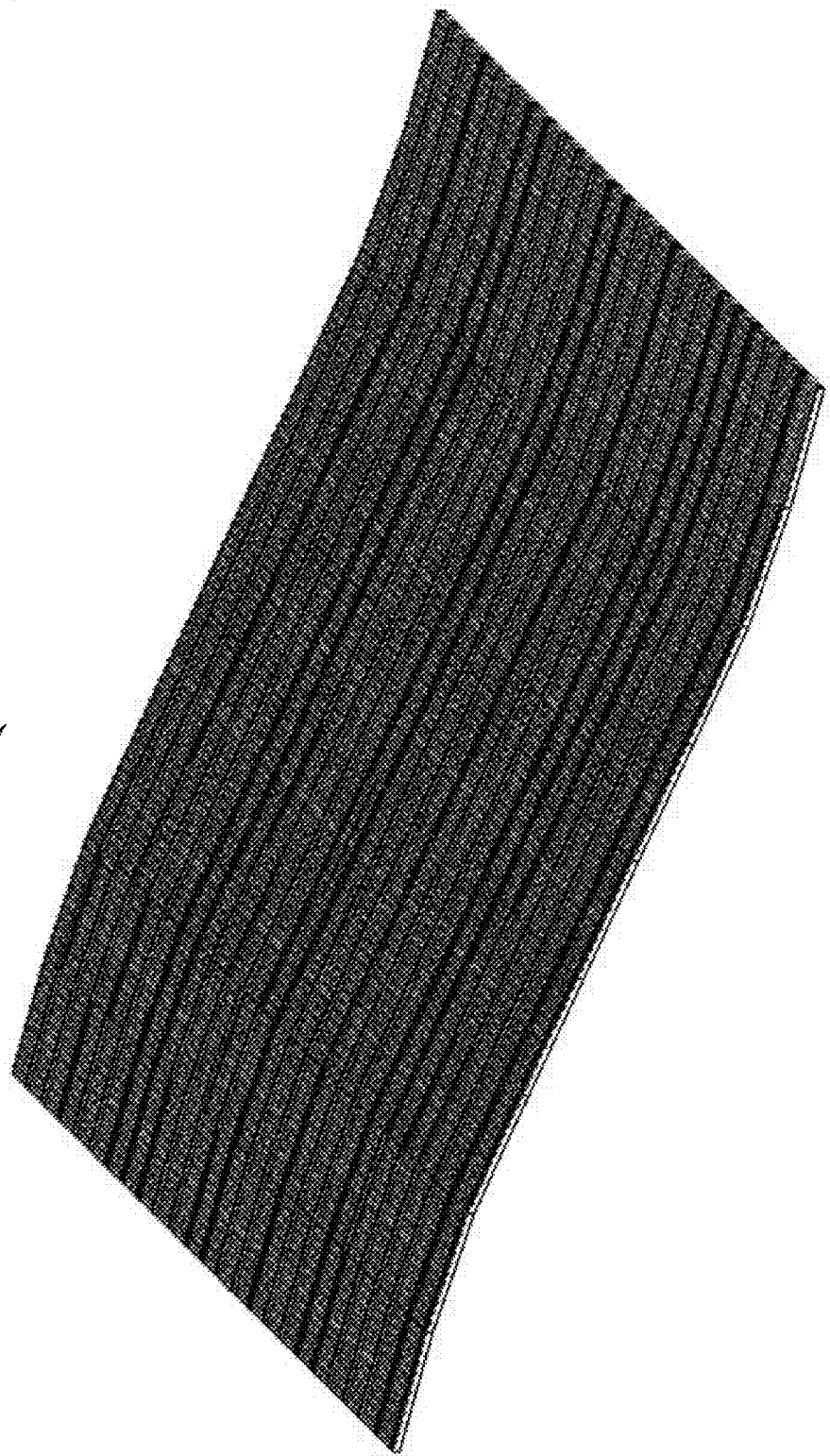
FIG. 57 illustrates a perspective view of a sheet roll of SCP panels.
Figure 58:
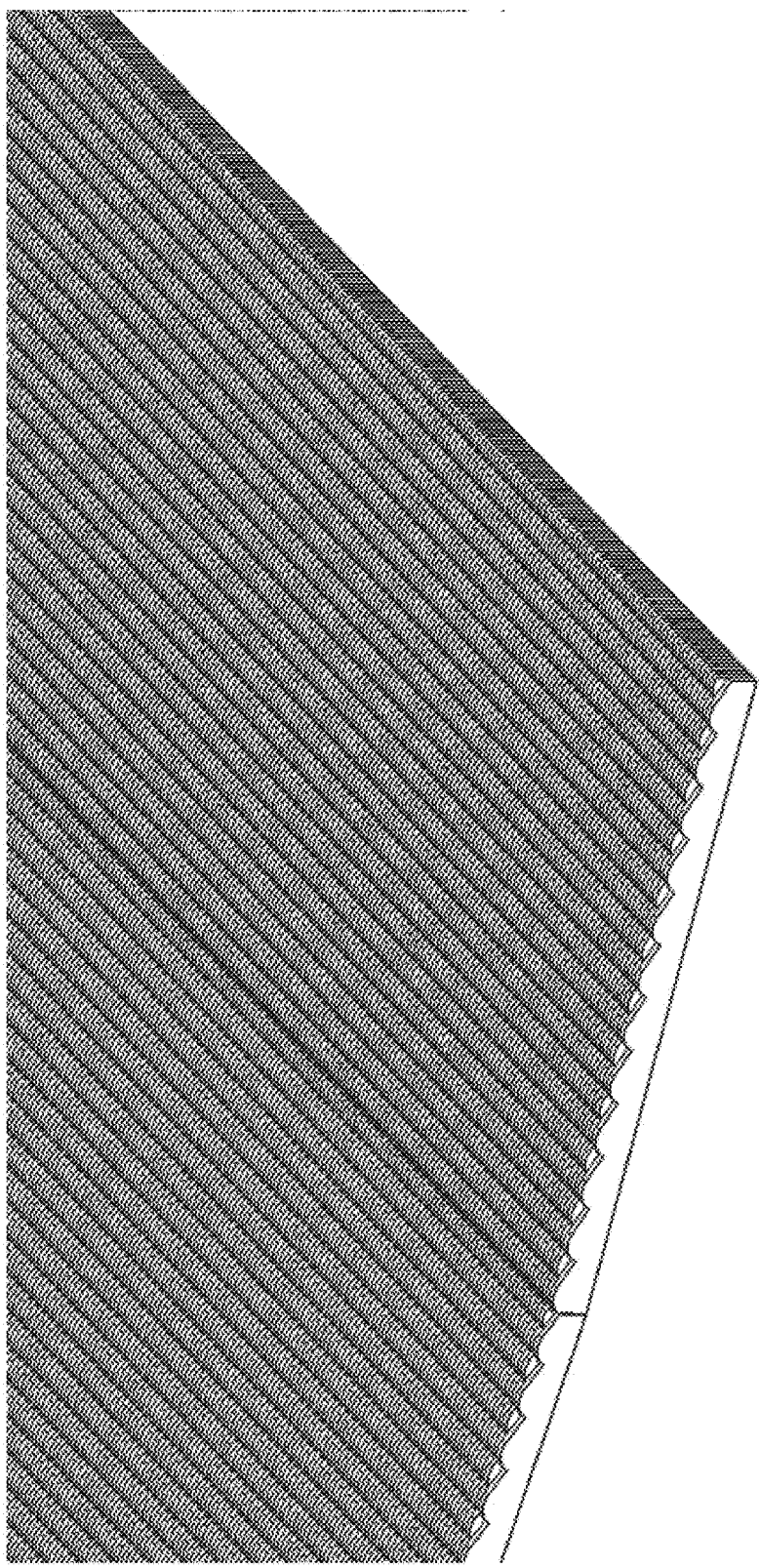
FIG. 58 illustrates a detail perspective view of a sheet roll of SCP panels.
Figure 59:
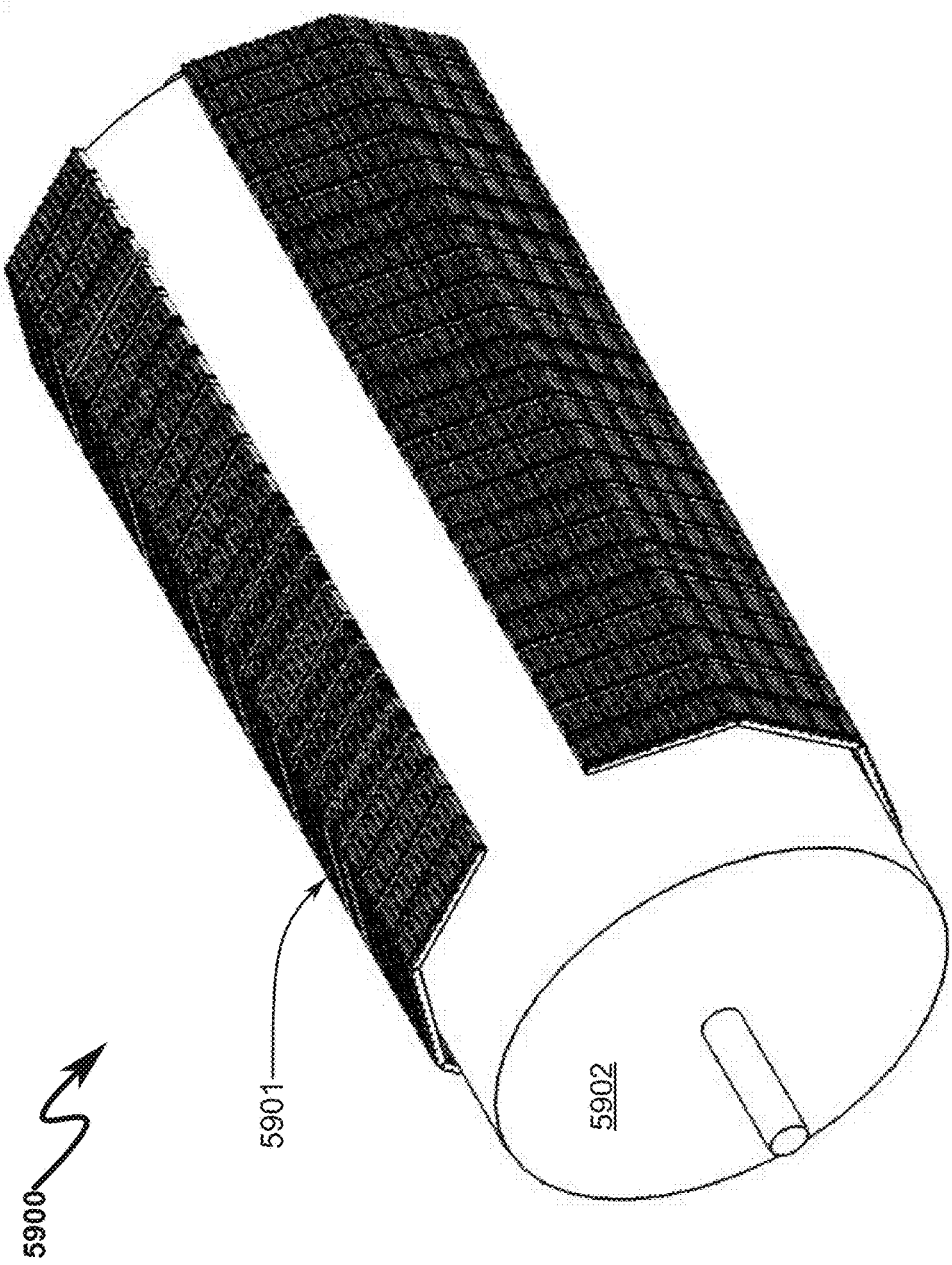
FIG. 59 illustrates a perspective view of a sheet roll of SCP panels rolled around a deployment cylinder.
Figure 60:
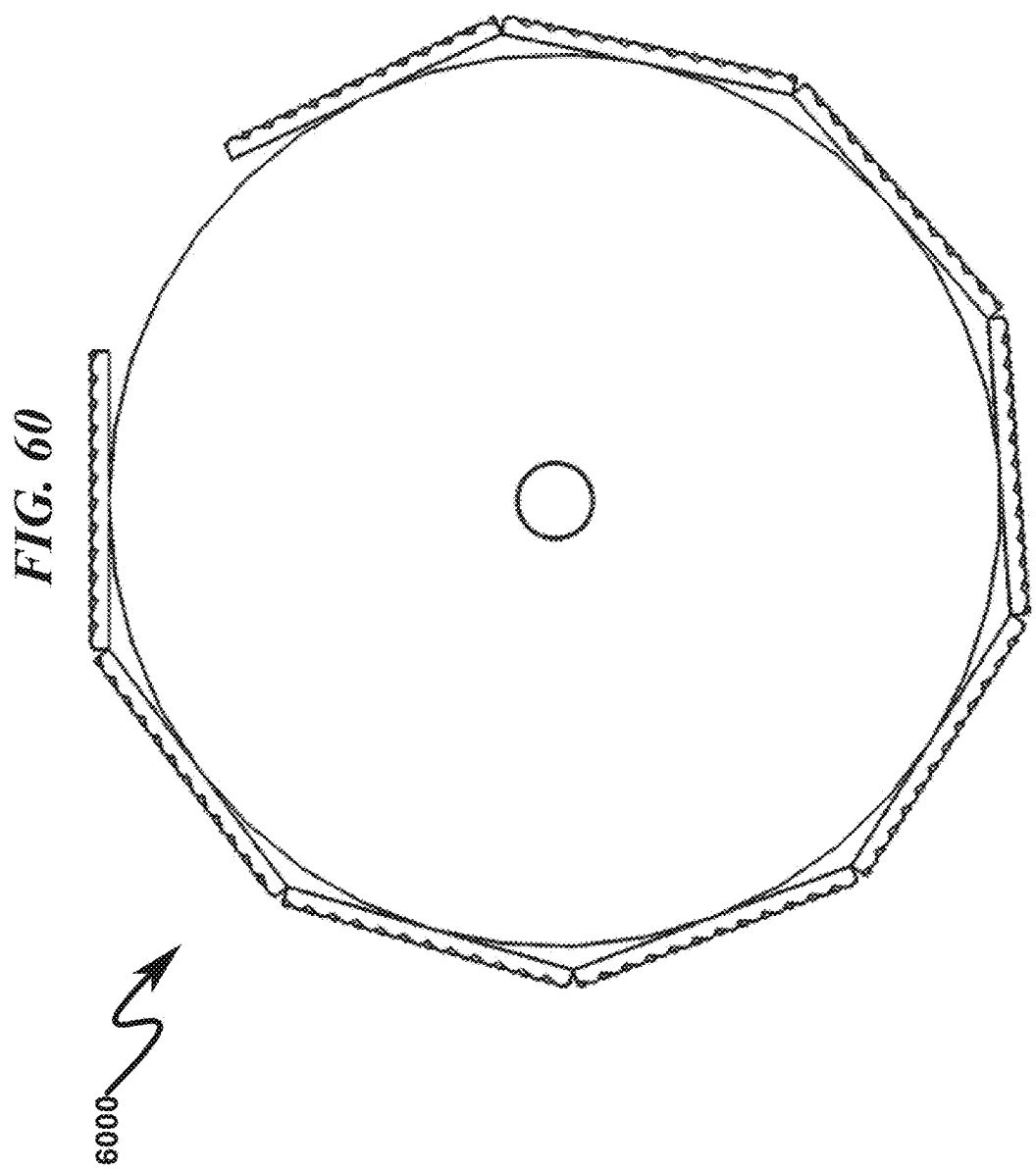
FIG. 60 illustrates an end view of a sheet roll of SCP panels rolled around a deployment cylinder.

The present invention anticipates that the SCP may be combined in rolled form as depicted in FIG. 57 (5700)-FIG. 60 (6000). It is anticipated that the SCP in rolled form (5901) using a solar deployment cylinder (SDC) (5902) may be laid on roadbeds, train tracks, parking lots, driveways, and other forms of transportation infrastructure to enable solar power generation from existing surfaces that have sun exposure.

System Wiring (6100)-(6400)

Figure 61:
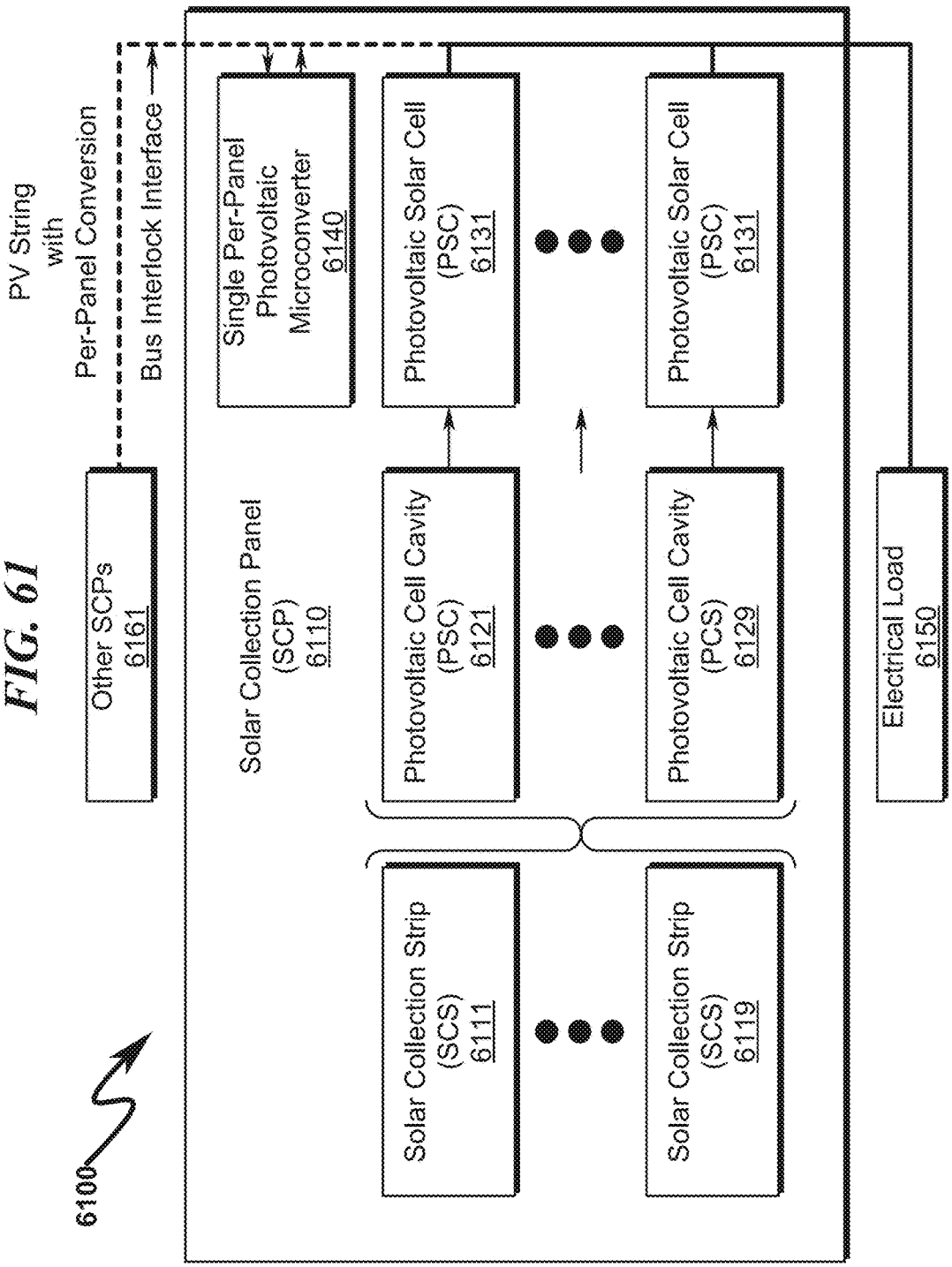
FIG. 61 illustrates an exemplary wiring block diagram for a preferred invention embodiment with per-panel voltage conversion.
Figure 64:
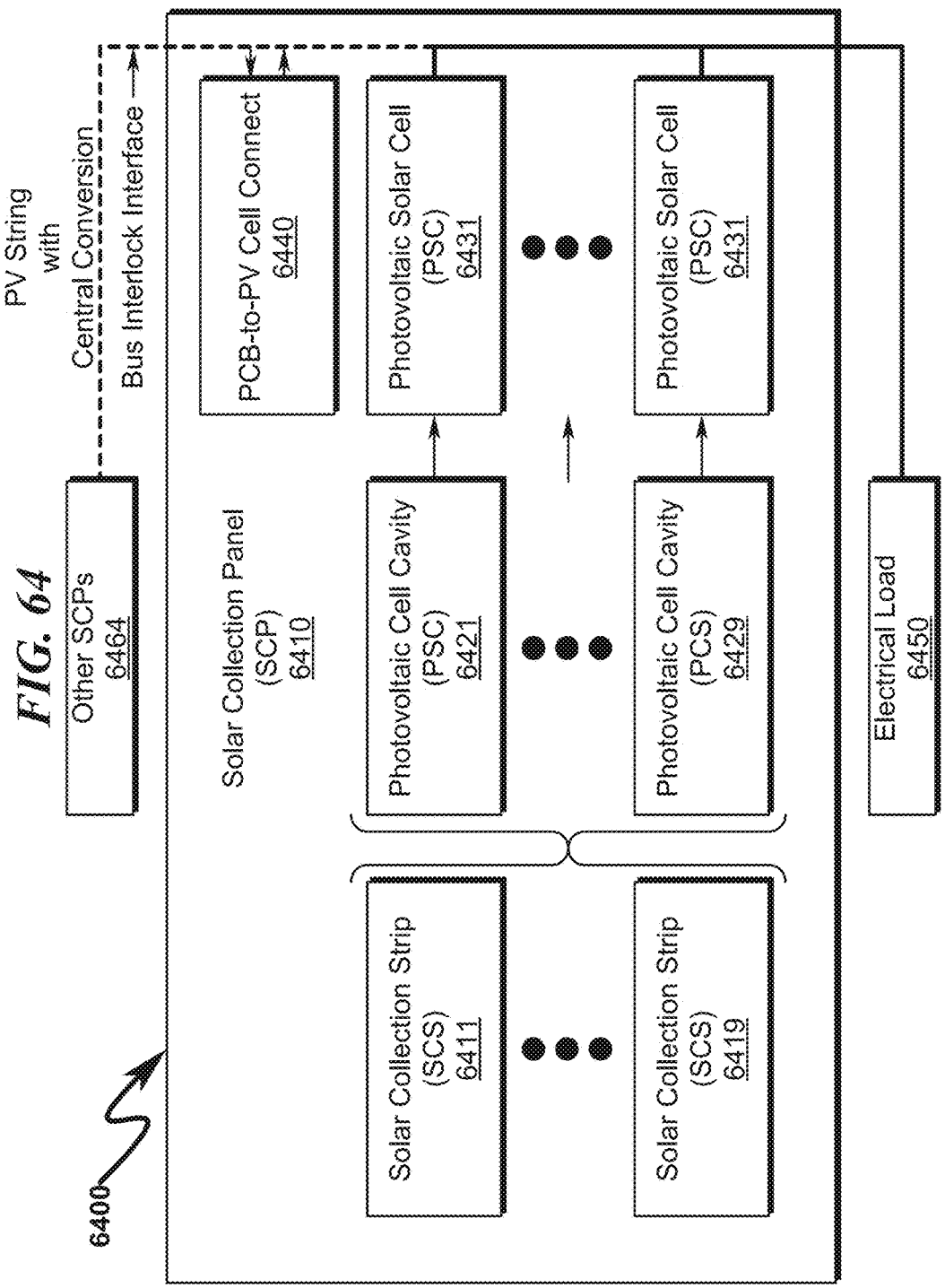
FIG. 64 illustrates an exemplary wiring block diagram for a preferred invention embodiment with external voltage conversion.

Exemplary system block diagrams illustrating wiring within the SCP are depicted in FIG. 61 (6100)-FIG. 64

Figure 62:
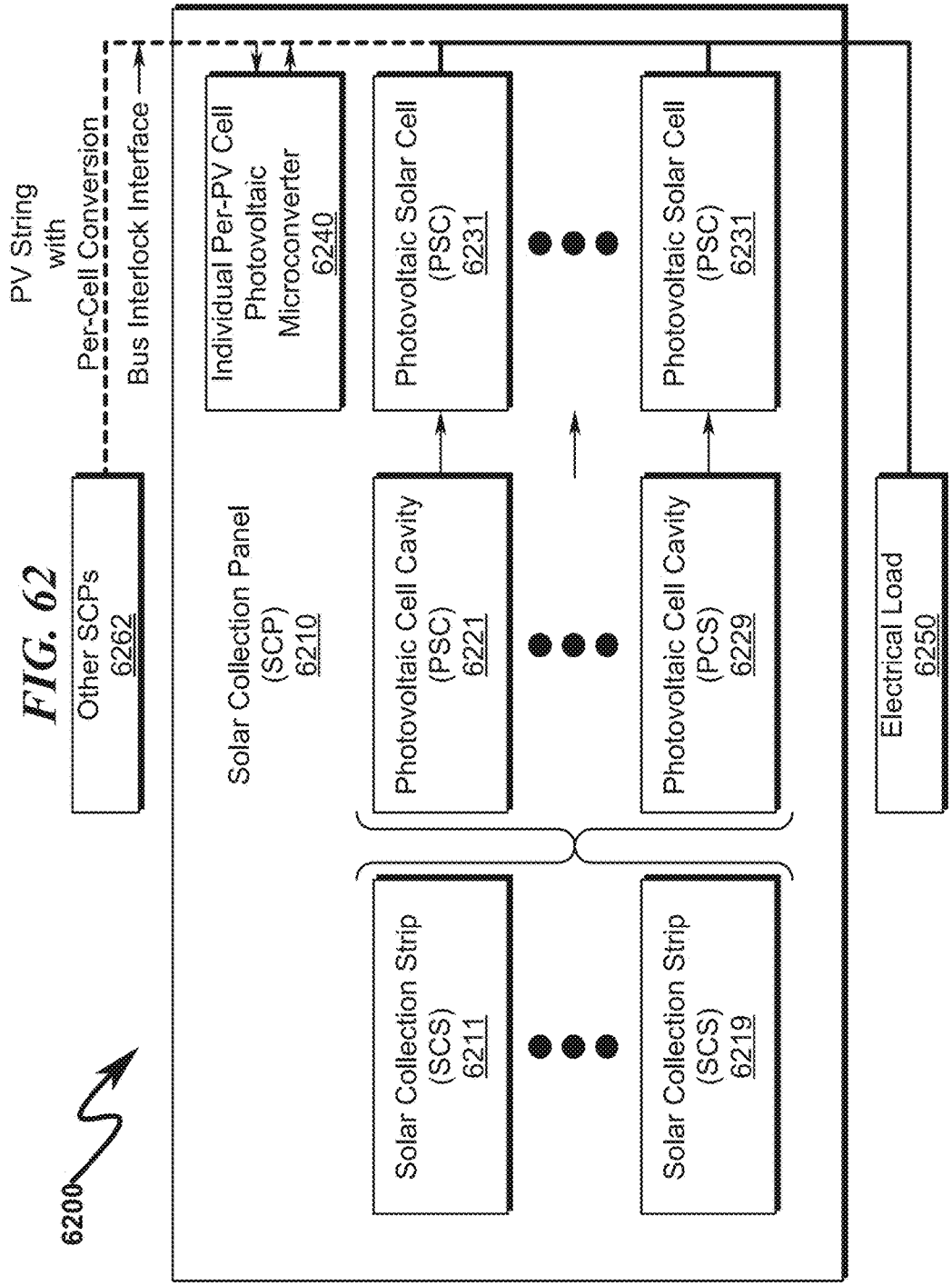
FIG. 62 illustrates an exemplary wiring block diagram for a preferred invention embodiment with per-PCC voltage conversion.
Figure 63:
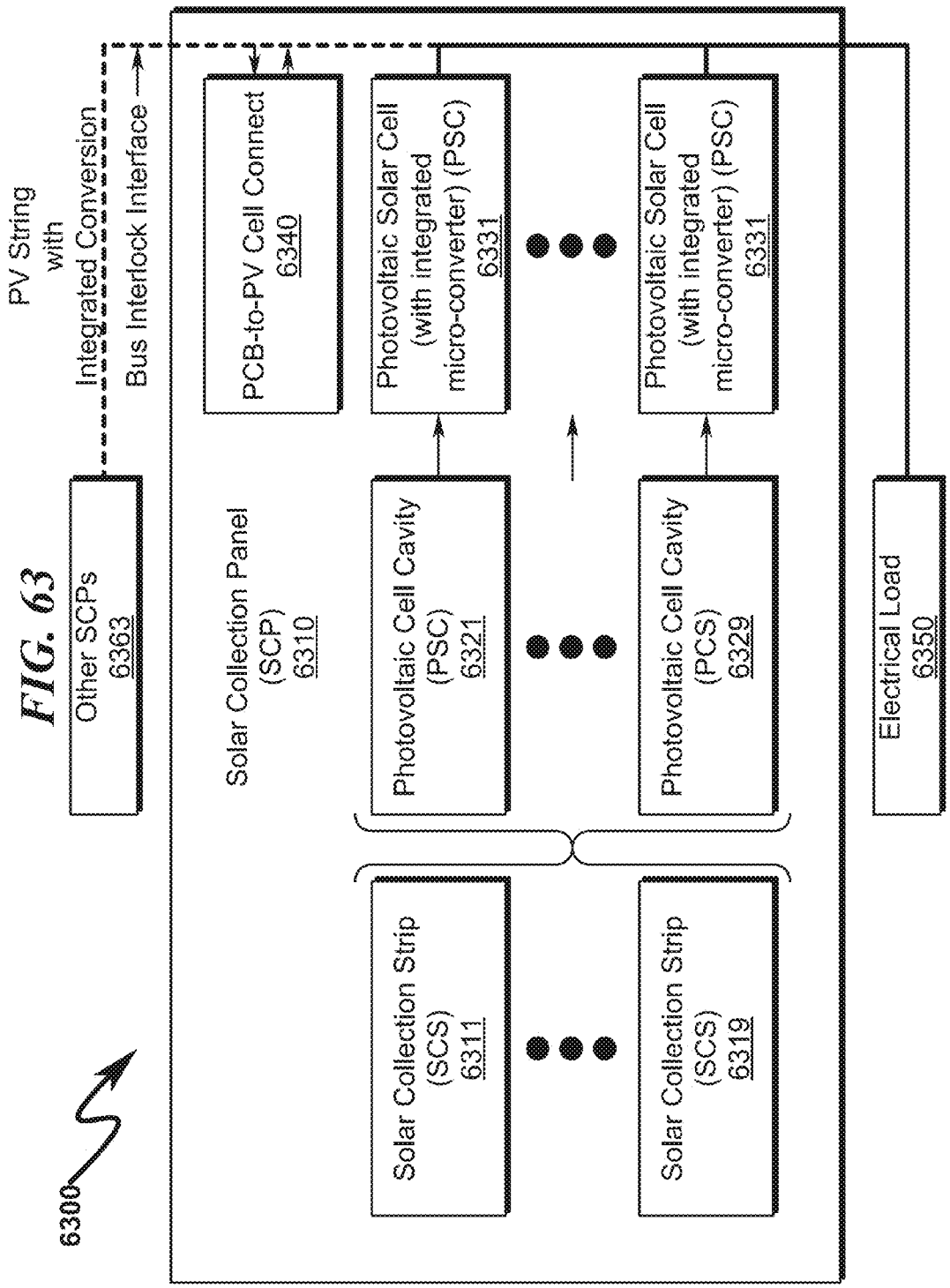
FIG. 63 illustrates an exemplary wiring block diagram for a preferred invention embodiment with per-PVC voltage conversion.

(6400). In these examples, power conversion from the photovoltaic cells may occur on a per-panel basis (FIG. 61 (6100)), a per-PCC cell basis (FIG. 62 (6200)), within each PV solar cell (FIG. 63 (6300)), or externally from the SCP (FIG. 64 (6400)).

Method Overview

The present invention method may incorporate the system components depicted herein to deploy large mats of interconnected SCP panels in existing or new transportation infrastructure for the purpose of generating electricity. This method generally involves utilizing the above-described solar roadway system in conjunction with the following steps:
(1) forming the SCP in an interconnected solar array (ISA);
(2) rolling the ISA on a solar deployment cylinder (SDC);
(3) unrolling the ISA from the SDC on a transportation surface; and
(4) electrically interconnecting the ISA to a power grid.
One skilled in the art will recognize that method steps associated with a variety of applications utilizing the system components may be augmented or rearranged without limiting the teachings of the present invention.

Preferred Embodiment System Summary

The present invention preferred exemplary system embodiment anticipates a wide variety of variations in the basic theme of implementation, but can be generalized as a solar roadway system comprising:
(a) stacked solar collection strips (SCS);
(b) photovoltaic cell (PVC);
(c) micro-converter (MCV); and
(d) power wiring cable (PWC);
wherein:
the SCS are formed in a solar/optical collection panel (SCP);
the SCP further comprises four complementary interlocking peripheral edges;
the SCS are configured with a top optical input surface (OIS) configured to collect solar energy;
the SCS as formed within the SCP are configured with a matrix of bottom photovoltaic cell cavities (PCC);
the PVC is attached to the SCP within the PCC;
the SCS comprises a top surface having parallel planes to incoming solar radiation source and tangent curved portions intersecting the parallel planes;
the parallel planes within the SCS configured at a common surface inclination angle (SIA);
the SCP comprises a plurality of horizontal holes configured to accept the power wiring cable;
the PWC is mechanically coupled to the MCV;
the MCV comprises a printed circuit board (PCB) that is electrically coupled to the PVC;
the MCV is configured to convert electrical energy produced by the PVC to a bus voltage presented on the PWC; and
the PWC comprises a complementary mating electrical plug and electrical receptacle.
This general system summary may be augmented by the various elements described herein to produce a wide variety of invention embodiments consistent with this overall design description.

This general system summary may be augmented by the various elements described herein to produce a wide variety of invention embodiments consistent with this overall design description.

Preferred Embodiment Method Summary

The present invention preferred exemplary method embodiment anticipates a wide variety of variations in the basic theme of implementation, but can be generalized as a solar roadway method wherein the method utilizes a solar roadway system comprising:
(a) stacked solar collection strips (SCS);
(b) photovoltaic cell (PVC);
(c) micro-converter (MCV); and
(d) power wiring cable (PWC);
wherein:
the SCS are formed in a solar/optical collection panel (SCP);
the SCP further comprises four complementary interlocking peripheral edges;
the SCS are configured with a top optical input surface (OIS) configured to collect solar energy;
the SCS as formed within the SCP are configured with a matrix of bottom photovoltaic cell cavities (PCC);
the PVC is attached to the SCP within the PCC;
the SCS comprises a top surface having parallel planes to incoming solar radiation source and tangent curved portions intersecting the parallel planes;
the parallel planes within the SCS configured at a common surface inclination angle (SIA);
the SCP comprises a plurality of horizontal holes configured to accept the power wiring cable;
the PWC is mechanically coupled to the MCV;
the MCV comprises a printed circuit board (PCB) that is electrically coupled to the PVC;
the MCV is configured to convert electrical energy produced by the PVC to a bus voltage presented on the PWC; and
the PWC comprises a complementary mating electrical plug and electrical receptacle.
with the method comprising the steps of:
(5) forming the SCP in an interconnected solar array (ISA);
(6) rolling the ISA on a solar deployment cylinder (SDC);
(7) unrolling the ISA from the SDC on a transportation surface; and
(8) electrically interconnecting the ISA to a power grid.
One skilled in the art will recognize that these method steps may be augmented or rearranged without limiting the teachings of the present invention.

System/Method Variations

It will be evident to those skilled in the art that there has been described herein an improved method and apparatus for connecting to, and supplying power for, a device or appliance that is protected by certain surge suppression circuits. Although the invention hereof has been described by way of preferred embodiments, it is evident that other adaptations and modifications can be employed without departing from the spirit and scope thereof.

The present invention anticipates a wide variety of variations in the basic theme of construction. The examples presented previously do not represent the entire scope of possible usages. They are meant to cite a few of the almost limitless possibilities. The basic system and method described above may be augmented with a variety of ancillary embodiments, including but not limited to:

An embodiment wherein the SIA is 23.4 degrees±1 degree.

An embodiment wherein the SIA varies across the face of the SCP.

An embodiment wherein the SCS are stacked in an anti-symmetrical alignment pattern.

An embodiment wherein the SCS are stacked in an anti-symmetrical alignment pattern and the SIA differs between adjacent SCS collection strips.

An embodiment wherein the SCP is square.

An embodiment wherein the SCP has a surface size of 24-inches±1-inch by 24-inches±1-inch.

An embodiment wherein the SCP has a surface size of 61-cm±1-cm by 61-cm±1-cm.

An embodiment wherein the SCS are stacked in an anti-symmetrical alignment pattern and the anti-symmetrical alignment pattern skews the alignment of adjacent SCS strips in the SCP by 10%-90% of the pitch of each individual SCS collection element.

An embodiment wherein the pitch of each individual SCS collection element is equally divided within ±20% between the top surface parallel plane and the tangent curved portion.

An embodiment comprising any combination of the above-specified embodiments.

One skilled in the art will recognize that other embodiments are possible based on combinations of elements taught within the above invention description.

CONCLUSION

A modular solar roadway system (MSRS) and method (MSRM) utilizing interlocked solar/optical collection panels (SCP) having stacked solar collection strips (SCS) has been disclosed. The SCS are configured with an optical input surface (OIS) configured to collect solar energy and a road support surface (RSS) configured to support automobile traffic. The SCS are stacked in an anti-symmetrical alignment pattern that allows solar energy to be efficiently collected while simultaneously supporting automobiles and other vehicles. The SCS as formed within the SCP are configured with a matrix of bottom photovoltaic cell cavities (PCC) that permit the SCP to be mated to a road surface while simultaneously integrated with solar cells in the PCC for the generation of electricity. The MSRS may be configured in a flexible SCP array in rolled sheet form (RSF) suitable for installation via the use of a vehicle equipped with axial support for the RSF.

CLAIMS INTERPRETATION

The following rules apply when interpreting the CLAIMS of the present invention:

The CLAIM PREAMBLE should be considered as limiting the scope of the claimed invention.

"WHEREIN" clauses should be considered as limiting the scope of the claimed invention.

"WHEREBY" clauses should be considered as limiting the scope of the claimed invention.

"ADAPTED TO" clauses should be considered as limiting the scope of the claimed invention.

"ADAPTED FOR" clauses should be considered as limiting the scope of the claimed invention.

The term "MEANS" specifically invokes the means-plus-function claims limitation recited in 35 U.S.C. § 112(f) and such claim shall be construed to cover the corresponding structure, material, or acts described in the specification and equivalents thereof.

The phrase "MEANS FOR" specifically invokes the means-plus-function claims limitation recited in 35 U.S.C. § 112(f) and such claim shall be construed to cover the corresponding structure, material, or acts described in the specification and equivalents thereof.

The phrase "STEP FOR" specifically invokes the step-plus-function claims limitation recited in 35 U.S.C. § 112(f) and such claim shall be construed to cover the corresponding structure, material, or acts described in the specification and equivalents thereof.

The step-plus-function claims limitation recited in 35 U.S.C. § 112(f) shall be construed to cover the corresponding structure, material, or acts described in the specification and equivalents thereof ONLY for such claims including the phrases "MEANS FOR", "MEANS", or "STEP FOR".

The phrase "AND/OR" in the context of an expression "X and/or Y" should be interpreted to define the set of "(X and Y)" in union with the set "(X or Y)" as interpreted by Ex Parte Gross (USPTO Patent Trial and Appeal Board, Appeal 2011-004811, Ser. No. 11/565,411, ("'and/or' covers embodiments having element A alone, B alone, or elements A and B taken together").

The claims presented herein are to be interpreted in light of the specification and drawings presented herein with sufficiently narrow scope such as to not preempt any abstract idea.

The claims presented herein are to be interpreted in light of the specification and drawings presented herein with sufficiently narrow scope such as to not preclude every application of any idea.

The claims presented herein are to be interpreted in light of the specification and drawings presented herein with sufficiently narrow scope such as to preclude any basic mental process that could be performed entirely in the human mind.

The claims presented herein are to be interpreted in light of the specification and drawings presented herein with sufficiently narrow scope such as to preclude any process that could be performed entirely by human manual effort.

What is claimed is:

1. A solar roadway system comprising:
(a) stacked solar collection strips (SCS);
(b) photovoltaic cell (PVC);
(c) micro-converter (MCV); and
(d) power wiring cable (PWC);
wherein:
said SCS are formed in a solar/optical collection panel (SCP);
said SCP further comprises complementary interlocking peripheral edges;
said SCS are configured with a top optical input surface (OIS) configured to collect solar energy;
said SCS as formed within said SCP are configured with a matrix of bottom photovoltaic cell cavities (PCC);
said PVC is attached to said SCP within said PCC;
said SCS comprises a top surface having parallel planes to an incoming solar radiation source and tangent curved portions intersecting said parallel planes;
said parallel planes within said SCS are configured at a common surface inclination angle (SIA);
said SCP comprises a plurality of holes configured to accept said power wiring cable;

said PWC is mechanically coupled to said MCV;

said MCV comprises a printed circuit board (PCB) that is electrically coupled to said PVC;

said MCV is configured to convert electrical energy produced by said PVC to a bus voltage presented on said PWC; and said PWC comprises a complementary mating electrical plug and electrical receptacle;

wherein a pitch of each individual SCS is equally divided within ±20% between said top surface parallel plane and said tangent curved portion.

2. The solar roadway system of claim 1 wherein said SIA is 23.4 degrees±1 degree.

3. The solar roadway system of claim 1 wherein said SIA varies across a face of said SCP.

4. The solar roadway system of claim 1 wherein said SCS are stacked in an anti-symmetrical alignment pattern.

5. The solar roadway system of claim 1 wherein said SCS are stacked in an anti-symmetrical alignment pattern and said SIA differs between adjacent SCS collection strips.

6. The solar roadway system of claim 1 wherein said SCP is square.

7. The solar roadway system of claim 1 wherein said SCP has a surface size of 24-inches±1-inch by 24-inches±1-inch.

8. The solar roadway system of claim 1 wherein said SCP has a surface size of 61-cm±1-cm by 61-cm±1-cm.

9. The solar roadway system of claim 1 wherein said SCS are stacked in an anti-symmetrical alignment pattern and said anti-symmetrical alignment pattern skews the alignment of adjacent SCS strips in said SCP by 10%-90% of the pitch of each individual SCS collection element.

10. A solar roadway method wherein said method utilizes a solar roadway system comprising:
   (a) stacked solar collection strips (SCS);
   (b) photovoltaic cell (PVC);
   (c) micro-converter (MCV); and
   (d) power wiring cable (PWC);
   wherein:
   said SCS are formed in a solar/optical collection panel (SCP);
   said SCP further comprises complementary interlocking peripheral edges;
   said SCS are configured with a top optical input surface (OIS) configured to collect solar energy;
   said SCS as formed within said SCP are configured with a matrix of bottom photovoltaic cell cavities (PCC);
   said PVC is attached to said SCP within said PCC;
   said SCS comprises a top surface having parallel planes to an incoming solar radiation source and tangent curved portions intersecting said parallel planes;
   said parallel planes within said SCS are configured at a common surface inclination angle (SIA);
   wherein a pitch of each individual SCS is equally divided within ±20% between said top surface parallel plane and said tangent curved portion;
   said SCP comprises a plurality of holes configured to accept said power wiring cable;
   said PWC is mechanically coupled to said MCV;
   said MCV comprises a printed circuit board (PCB) that is electrically coupled to said PVC;
   said MCV is configured to convert electrical energy produced by said PVC to a bus voltage presented on said PWC; and
   said PWC comprises a complementary mating electrical plug and electrical receptacle;
   with said method comprising the steps of:
   (1) forming said SCP in an interconnected solar array (ISA);
   (2) rolling said ISA on a solar deployment cylinder (SDC);
   (3) unrolling said ISA from said SDC on a transportation surface; and
   (4) electrically interconnecting said ISA to a power grid.

11. The solar roadway method of claim 10 wherein said SIA is 23.4 degrees±1 degree.

12. The solar roadway method of claim 10 wherein said SIA varies across a face of said SCP.

13. The solar roadway method of claim 10 wherein said SCS are stacked in an anti-symmetrical alignment pattern.

14. The solar roadway method of claim 10 wherein said SCS are stacked in an anti-symmetrical alignment pattern and said SIA differs between adjacent SCS collection strips.

15. The solar roadway method of claim 10 wherein said SCP is square.

16. The solar roadway method of claim 10 wherein said SCP has a surface size of 24-inches±1-inch by 24-inches±1-inch.

17. The solar roadway method of claim 10 wherein said SCP has a surface size of 61-cm±1-cm by 61-cm±1-cm.

18. The solar roadway method of claim 10 wherein said SCS are stacked in an anti-symmetrical alignment pattern and said anti-symmetrical alignment pattern skews the alignment of adjacent SCS strips in said SCP by 10%-90% of the pitch of each individual SCS collection element.

* * * * *